US010204789B2

(12) United States Patent
Ogata et al.

(10) Patent No.: US 10,204,789 B2
(45) Date of Patent: Feb. 12, 2019

(54) MANUFACTURING METHOD OF SEMICONDUCTOR DEVICE AND SEMICONDUCTOR DEVICE

(71) Applicant: Renesas Electronics Corporation, Koutou-ku, Tokyo (JP)

(72) Inventors: Tamotsu Ogata, Tokyo (JP); Tatsuyoshi Mihara, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 8 days.

(21) Appl. No.: 15/404,463

(22) Filed: Jan. 12, 2017

(65) Prior Publication Data
US 2017/0271162 A1 Sep. 21, 2017

(30) Foreign Application Priority Data
Mar. 15, 2016 (JP) ................. 2016-051102

(51) Int. Cl.
*H01L 21/28* (2006.01)
*H01L 21/3105* (2006.01)
(Continued)

(52) U.S. Cl.
CPC .. *H01L 21/28282* (2013.01); *H01L 21/31051* (2013.01); *H01L 21/31105* (2013.01);
(Continued)

(58) Field of Classification Search
CPC ......... H01L 21/28282; H01L 29/66833; H01L 29/792; H01L 29/66545; H01L 29/42344;
(Continued)

(56) References Cited

U.S. PATENT DOCUMENTS 8,951,869 B2   2/2015   Tsukamoto
9,257,446 B2   2/2016   Arigane et al.
(Continued)

FOREIGN PATENT DOCUMENTS

| JP | 2014-154790 A | 8/2014 |
| JP | 2015-103698 A | 6/2015 |
| JP | 2015-162621 A | 9/2015 |
| WO | WO 2014-115758 A1 | 7/2014 |

*Primary Examiner* — Yu Chen
*Assistant Examiner* — Pauline Vu
(74) *Attorney, Agent, or Firm* — Shapiro, Gabor and Rosenberger, PLLC

(57) ABSTRACT

Over a semiconductor substrate, a memory gate electrode for a nonvolatile memory cell is formed via a first insulating film having an internal charge storage portion. A dummy control gate electrode is formed so as to be adjacent to the memory gate electrode via a second insulating film. The memory and the dummy control gate electrodes are made of different materials. A third insulating film is formed so as to cover the memory and the dummy control gate electrodes and then polished to expose the memory and the dummy control gate electrodes. Then, etching is performed under a condition in which the memory gate electrode is less likely to be etched than the dummy control gate electrode to remove the dummy control gate electrode. Then, in a trench as a region from which the dummy control gate electrode is removed, a control gate electrode for the memory cell is formed.

17 Claims, 50 Drawing Sheets

(51) Int. Cl.
*H01L 21/311* (2006.01)
*H01L 29/423* (2006.01)
*H01L 29/66* (2006.01)
*H01L 29/792* (2006.01)
*H01L 27/1157* (2017.01)
*H01L 27/11573* (2017.01)
*H01L 29/49* (2006.01)
*H01L 29/51* (2006.01)

(52) U.S. Cl.
CPC .... *H01L 21/31144* (2013.01); *H01L 27/1157* (2013.01); *H01L 27/11573* (2013.01); *H01L 29/42344* (2013.01); *H01L 29/66545* (2013.01); *H01L 29/66553* (2013.01); *H01L 29/66833* (2013.01); *H01L 29/792* (2013.01); *H01L 29/4966* (2013.01); *H01L 29/517* (2013.01); *H01L 29/665* (2013.01)

(58) Field of Classification Search
CPC ............ H01L 27/11521; H01L 27/115; H01L 27/11568
See application file for complete search history.

(56) References Cited

U.S. PATENT DOCUMENTS

| | | | |
|---|---|---|---|
| 2006/0214211 A1* | 9/2006 | Miyazaki | H01L 27/11521 257/296 |
| 2009/0309153 A1* | 12/2009 | Yanagi | H01L 27/11568 257/324 |
| 2014/0065776 A1* | 3/2014 | Mihara | G11C 11/5671 438/239 |
| 2014/0213030 A1* | 7/2014 | Tsukuda | H01L 29/66833 438/287 |
| 2015/0129952 A1* | 5/2015 | Chuang | H01L 27/11568 257/326 |
| 2015/0145023 A1* | 5/2015 | Arigane | H01L 27/11568 257/326 |
| 2015/0249145 A1 | 9/2015 | Yoshimori et al. | |
| 2015/0279854 A1* | 10/2015 | Hall | H01L 29/66545 438/591 |
| 2017/0170188 A1* | 6/2017 | Wu | H01L 21/28282 |
| 2017/0170189 A1* | 6/2017 | Wu | H01L 27/11568 |

* cited by examiner

FIG. 45

| OPERATION METHOD WRITE/ERASE | WRITE OPERATION VOLTAGE (V) Vmg/Vs/Vcg/Vd/Vb | ERASE OPERATION VOLTAGE (V) Vmg/Vs/Vcg/Vd/Vb | READ OPERATION VOLTAGE (V) Vmg/Vs/Vcg/Vd/Vb |
|---|---|---|---|
| A | SSI (WRITE)/ BTBT (ERASE) | 10/5/1/0.5/0 | -6/6/0/open/0 | 0/0/1.5/1.5/0 |
| B | SSI (WRITE)/ FN (ERASE) | 10/5/1/0.5/0 | 12/0/0/0/0 | 0/0/1.5/1.5/0 |
| C | FN (WRITE)/ BTBT (ERASE) | -12/0/0/0/0 | -6/6/0/open/0 | 0/0/1.5/1.5/0 |
| D | FN (WRITE)/ FN (ERASE) | -12/0/0/0/0 | 12/0/0/0/0 | 0/0/1.5/1.5/0 |

MANUFACTURING METHOD OF SEMICONDUCTOR DEVICE AND SEMICONDUCTOR DEVICE

CROSS-REFERENCE TO RELATED APPLICATIONS

The disclosure of Japanese Patent Application No. 2016-051102 filed on Mar. 15, 2016 including the specification, drawings and abstract is incorporated herein by reference in its entirety.

BACKGROUND

The present invention relates to a manufacturing method of a semiconductor device and to the semiconductor device and can be used appropriately for, e.g., a manufacturing method of a semiconductor device having a nonvolatile memory and to the semiconductor device.

As an electrically writable/erasable nonvolatile semiconductor storage device, an EEPROM (Electrically Erasable and Programmable Read Only Memory) has been used widely. Such a storage device represented by a flash memory which is currently used widely has a conductive floating gate electrode or a trapping insulating film surrounded by oxide films under the gate electrode of a MISFET. A charge storage state in the floating gate electrode or trapping insulating film is used as stored information and read as the threshold of the transistor. The trapping insulating film refers to an insulating film capable of storing charges therein, and examples thereof include a silicon nitride film. By injection/release of charges into/from such a charge storage region, the threshold of the MISFET is shifted to allow the MISFET to operate as a storage element. Examples of the flash memory include a split-gate cell using a MONOS (Metal-Oxide-Nitride-Oxide-Semiconductor) film. In such a memory, a silicon nitride film is used as a charge storage region. This provides advantages over a conductive floating gate film such that, due to discrete storage of charges, data retention reliability is high, and the high data retention reliability allows the oxide films over and under the silicon nitride film to be thinned and allows a voltage for a write/erase operation to be reduced.

Each of Japanese Unexamined Patent Publication No. 2015-103698 (Patent Document 1), Japanese Unexamined Patent Publication No. 2015-162621 (Patent Document 2), and Japanese Unexamined Patent Publication No. 2014-154790 (Patent Document 3) describes a technique related to a nonvolatile semiconductor storage device. On the other hand, International Publication No. WO 2014/115758 (Patent Document 4) describes a technique related to an etchant which allows a nickel-platinum-alloy-based metal to be selectively removed without etching a silicon-based material and other metals and metal compounds.

RELATED ART DOCUMENTS

Patent Documents

[Patent Document 1] Japanese Unexamined Patent Publication No. 2015-103698
[Patent Document 2] Japanese Unexamined Patent Publication No. 2015-162621
[Patent Document 3] Japanese Unexamined Patent Publication No. 2014-154790
[Patent Document 4] International Publication No. WO 2014/115758 (Patent Document 4)

SUMMARY

It is desired to reduce the manufacturing cost of a semiconductor device having a nonvolatile memory or improve the reliability of the semiconductor device. Alternatively, it is desired to reduce the manufacturing cost of the semiconductor device and improve the reliability of the semiconductor device.

Other problems and novel features of the present invention will become apparent from a statement in the present specification and the accompanying drawings.

According to an embodiment, a method of manufacturing a semiconductor device includes the steps of: (a) providing a semiconductor substrate; and (b) forming a first gate electrode for a memory cell in a nonvolatile memory over the semiconductor substrate via a first insulating film having an internal charge storage portion. The method of manufacturing the semiconductor device also includes the steps of: (c) forming a first to-be-replaced structure for forming a second gate electrode for the memory cell over the semiconductor substrate such that the first to-be-replaced structure is adjacent to the first gate electrode via a second insulating film; and (d) forming a first interlayer insulating film so as to cover the first gate electrode and the first to-be-replaced structure therewith. The method of manufacturing the semiconductor device also includes the steps of: (e) polishing the first interlayer insulating film to expose the first gate electrode and the first to-be-replaced structure; (f) removing the first to-be-replaced structure by etching; and (g) forming the second gate electrode for the memory cell in a first trench as a region from which the first to-be-replaced structure is removed. The first gate electrode and the first to-be-replaced structure are made of different materials. In the step (f), the etching is performed under a condition in which the first gate electrode is less likely to be etched than the first to-be-replaced structure to remove the first to-be-replaced structure.

Also, according to the embodiment, a semiconductor device includes: a first gate electrode for a memory cell in a nonvolatile memory which is formed over a semiconductor substrate via a first gate insulating film having a charge storage portion; and a second gate electrode for the memory cell which is formed over the semiconductor substrate via a second gate insulating film to be adjacent to the first gate electrode. The first gate electrode is a silicon gate electrode. The second gate electrode is a metal gate electrode. The second gate insulating film contains a metal element and oxygen as constituent elements. Between the first and second gate electrodes, a first silicon oxynitride film, a first silicon nitride film, and the second gate insulating film are interposed. Between the first and second gate electrodes, the first silicon oxynitride film is adjacent to the first gate electrode and the second gate insulating film is adjacent to the second gate electrode. Between the second gate insulating film and the first silicon oxynitride film, the first silicon nitride film is interposed.

The embodiment can improve the reliability of the semiconductor device.

BRIEF DESCRIPTION OF THE DRAWINGS

FIG. 45 is a table showing an example of conditions under which voltages are applied to the individual portions of a selected memory cell during "Write", "Erase", and "Read" operations;

DETAILED DESCRIPTION

Figure 1:
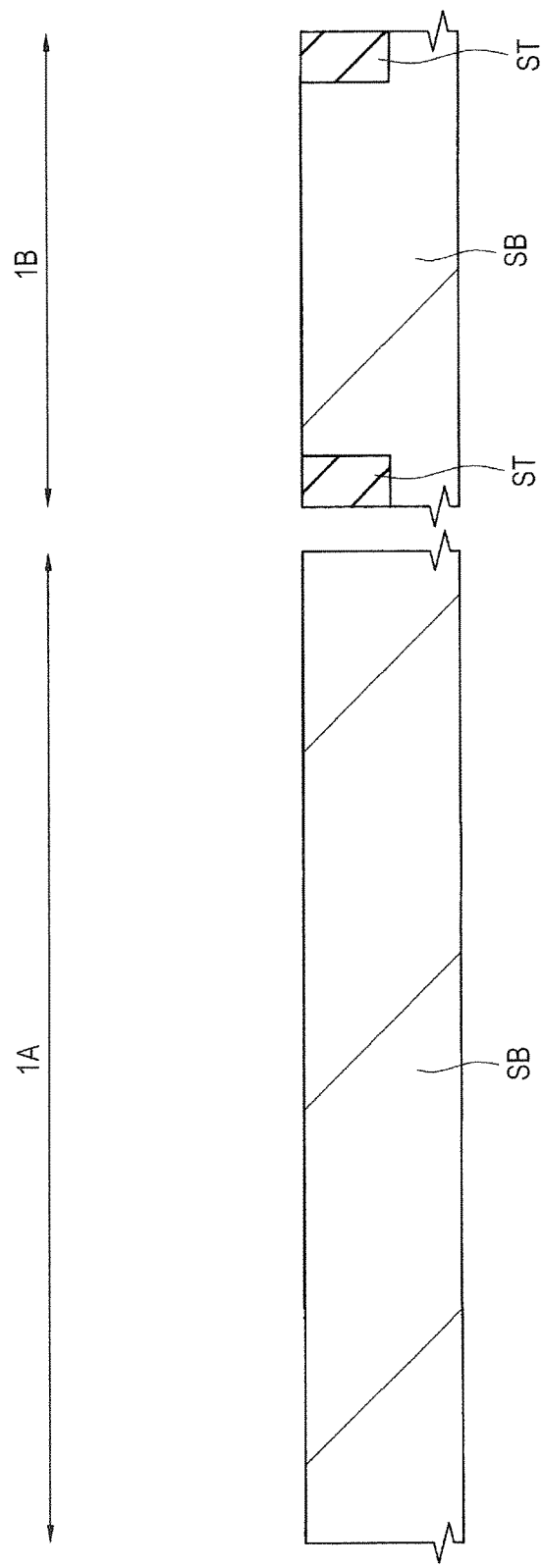
FIG. 1 is a main-portion cross-sectional view of a semiconductor device in an embodiment during the manufacturing process thereof.

In the following embodiments, if necessary for the sake of convenience, each of the embodiments will be described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others. Also, in the following embodiments, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers. Also, in each of the following embodiments, the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in each of the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

The following will describe the embodiments in detail on the basis of the drawings. Note that, throughout all the drawings for illustrating the embodiments, members having the same functions are designated by the same reference numerals, and a repeated description thereof is omitted. Also, in the following embodiments, a description of the same or like parts will not be repeated in principle unless particularly necessary.

In the drawings used in the embodiments, hatching may be omitted even in a cross section for improved clarity of illustration, while even a plan view may be hatched for improved clarity of illustration.

Embodiments

<About Manufacturing Process of Semiconductor Device>

A semiconductor device in each of the present and following embodiments includes a nonvolatile memory (nonvolatile storage element, flash memory, or nonvolatile semiconductor storage device). In each of the present and following embodiments, the nonvolatile memory will be described on the basis of a memory cell based on an n-channel MISFET (Metal Insulator Semiconductor Field Effect Transistor). Also, in each of the present and following embodiments, polarities (the polarities of voltages applied during write/erase/read operations or the polarities of carriers) are intended to describe operations to the memory cell based on the n-channel MISFET. In the case of a memory cell based on a p-channel MISFET, operations which are the same in principle can be obtained by inverting all the polarities of applied potentials, the conductivity types of the carriers, and the like.

Referring to the drawings, a method of manufacturing the semiconductor device in the present embodiment will be described.

FIGS. 1 to 42 are main-portion cross-sectional views of the semiconductor device in the present embodiment during the manufacturing process thereof. FIGS. 1 to 42 show the main-portion cross-sectional views of a memory cell region 1A and a peripheral circuit region 1B, which show the formation of memory cells in the nonvolatile memory in the memory cell region 1A and the formation of a MISFET in the peripheral circuit region 1B. Note that, in the memory cell region 1A, the plurality of (numerous) memory cells are actually formed in an array. However, FIGS. 1 to 42 show the formation of the two memory cells sharing an $n^+$-type semiconductor region H1 (drain region).

The memory cell region 1A mentioned herein is the region of the main surface of the semiconductor substrate SB where the memory cells in the nonvolatile memory are to be formed. The peripheral circuit region 1B mentioned herein is the region of the main surface of the semiconductor substrate SB where a peripheral circuit is to be formed. The memory cell region 1A and the peripheral circuit region 1B are present in the same semiconductor substrate SB. That is, the memory cell region 1A and the peripheral circuit region 1B correspond to the different two-dimensional regions of the main surface of the same semiconductor substrate SB. Note that the memory cell region 1A and the peripheral circuit region 1B need not be adjacent to each other. However, for easier understanding, the cross-sectional views in FIGS. 1 to 42 show the peripheral circuit region 1B next to the memory region 1A.

The peripheral circuit mentioned herein is a circuit other than the nonvolatile memory. Examples of the peripheral circuit include a processor such as a CPU, a control circuit, a sense amplifier, a column decoder, a row decoder, and an input/output circuit. The MISFET formed in the peripheral circuit region 1B is a MISFET for the peripheral circuit.

The present embodiment will describe the case where re-channel MISFETs (control transistors and memory transistors) are formed in the memory cell region 1A. However, it is also possible to invert the conductivity type and form p-channel MISFETs (control transistors and memory transistors) in the memory cell region 1A. Likewise, the present embodiment will describe the case where an n-channel MISFET is formed in the peripheral circuit region 1B. However, it is also possible to invert the conductivity type and form a p-channel MISFET in the peripheral circuit region 1B. Alternatively, it is also possible to form both of an n-channel MISFET and a p-channel MISFET in the peripheral circuit region 1B.

To manufacture the semiconductor device, first, as shown in FIG. 1, the semiconductor substrate (semiconductor wafer) SB made of p-type monocrystalline silicon having a specific resistance of, e.g., about 1 to 10 Ωcm is provided (prepared). Then, in the main surface of the semiconductor substrate SB, an isolation region ST defining active regions is formed.

The isolation region ST is made of an insulator such as silicon dioxide. The isolation region ST can be formed by, e.g., a STI (Shallow Trench Isolation) method, a LOCOS (Local Oxidization of Silicon) method, or the like. For example, after a trench for the isolation is formed in the main surface of the semiconductor substrate SB, an insulating film made of, e.g., silicon dioxide is embedded in the trench for the isolation to be able to form the isolation region ST.

Figure 2:
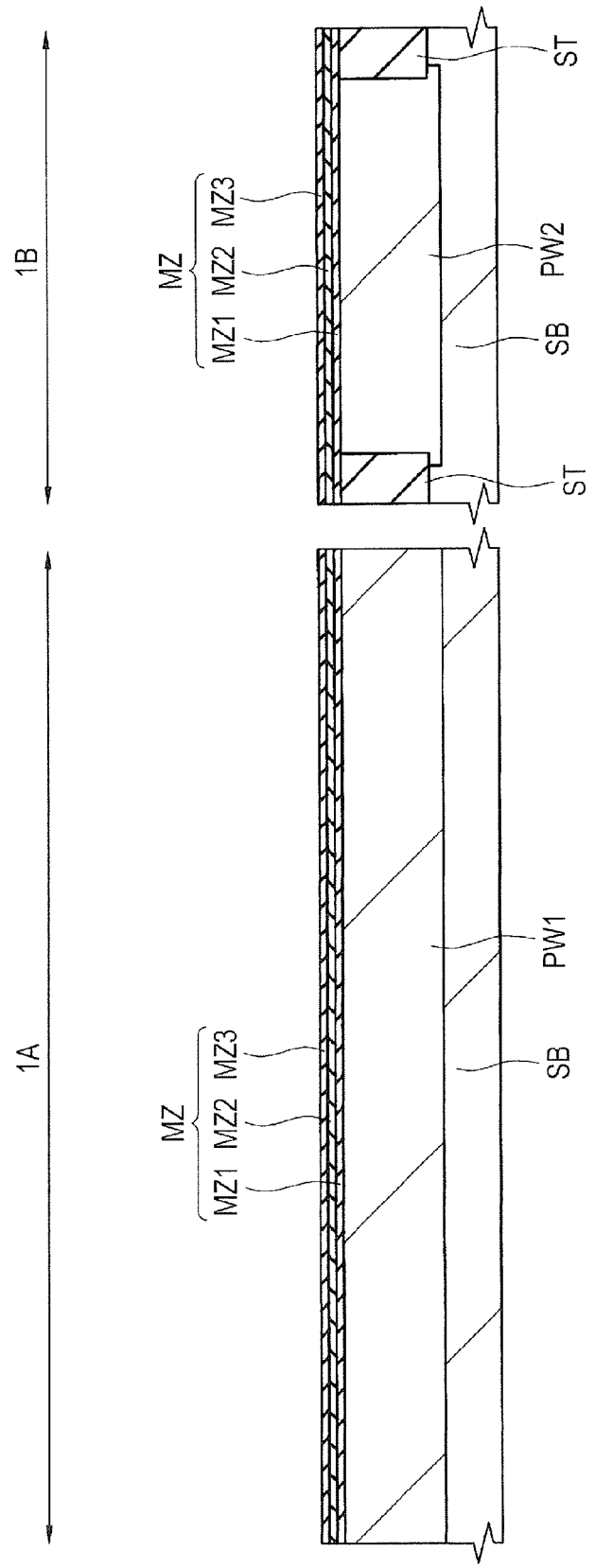
FIG. 2 is a main-portion cross-sectional view of the semiconductor device during the manufacturing process thereof, which is subsequent to FIG. 1.

Next, as shown in FIG. 2, a p-type well PW1 is formed in the memory cell region 1A of the semiconductor substrate SB, while a p-type well PW2 is formed in the peripheral circuit region 1B.

The p-type wells PW1 and PW2 can be formed by ion implantation of a p-type impurity such as, e.g., boron (B) into the semiconductor substrate SB or the like. Each of the p-type wells PW1 and PW2 is formed to a predetermined depth from the main surface of the semiconductor substrate SB. The p-type wells PW1 and PW2 may be formed either in the same ion implantation step or in different ion implantation steps.

Next, to adjust the threshold voltage of each of the memory transistors formed later in the memory cell region 1A, channel doping ion implantation is performed as necessary on the surface layer portion of the p-type well PW1 in the memory cell region 1A. Also, to adjust the threshold voltage of the MISFET formed later in the peripheral circuit region 1B, channel doping ion implantation is performed as necessary on the surface layer portion of the p-type well PW2 in the peripheral circuit region 1B.

Next, the top surface of the semiconductor substrate SB (p-type wells PW1 and PW2) is cleaned by diluted hydrofluoric acid cleaning or the like. Then, as shown in FIG. 2, an insulating film MZ is formed over the main surface (top surfaces of p-type wells PW1 and PW2) of the semiconductor substrate SB. The insulating film MZ is formed over the top surface (i.e., upper surface of the p-type well PW1) of the semiconductor substrate SB in the memory cell region 1A and over the top surface (i.e., upper surface of the p-type well PW2) of the semiconductor substrate SB in the peripheral circuit region 1B.

The insulating film MZ is an insulating film for the gate insulating film of each of the memory transistors having an internal charge storage portion (charge storage layer). The insulating film MZ is made of a multi-layer film including a silicon dioxide film MZ1, a silicon nitride film MZ2 formed over the silicon dioxide film MZ1, and a silicon dioxide film MZ3 formed over the silicon nitride film MZ2. The multi-layer film including the silicon dioxide film MZ1, the silicon nitride film MZ2, and the silicon dioxide film MZ3 can be regarded also as an ONO (oxide-nitride-oxide) film.

To form the insulating film MZ, e.g., the silicon dioxide film MZ1 is formed first by a thermal oxidization method. Then, over the silicon dioxide film MZ1, the silicon nitride film MZ2 is deposited by a CVD method. Further, over the silicon nitride film MZ2, the silicon dioxide film MZ3 is formed by a CVD method, a thermal oxidization method, or each of the CVD method and the thermal oxidization method. Thus, the insulating film MZ made of the multi-layer film including the silicon dioxide film MZ1, the silicon nitride film MZ2, and the silicon dioxide film MZ3 can be formed. The thickness of the silicon dioxide film MZ1 can be set to, e.g., about 2 to 5 nm. The thickness of the silicon nitride film MZ2 can be set to, e.g., about 5 to 15 nm. The thickness of the silicon dioxide film MZ3 can be set to, e.g., about 5 to 15 nm.

Also, in the present embodiment, as the insulating film (charge storage layer) having a trap level, the silicon nitride film MZ2 is formed. In terms of reliability or the like, a silicon nitride film is preferred, but the charge storage layer is not limited to a silicon nitride film. For example, a high-dielectric-constant film having a dielectric constant higher than that of a silicon nitride film, such as an aluminum oxide film, a hafnium oxide film, or a tantalum oxide film, can also be used as the charge storage layer or charge storage portion. Alternatively, the charge storage layer or charge storage portion can also be formed of silicon nanodots.

Instead of the silicon dioxide film MZ3, a silicon oxynitride film can also be used. Alternatively, as the insulating film MZ, e.g., an AHA film can also be used instead of the ONO film. The AHA film corresponds to a multi-layer film including an aluminum oxide film (AlO film), a hafnium silicate film (HfSiO film) located thereover, and an aluminum oxide film (AlO film) located thereover.

The insulating film MA functions as the gate insulating films of memory gate electrodes MG formed later and has a charge retaining (charge storing) function. Accordingly, the insulating film MZ has a multi-layer structure including at least three layers so as to be able to function as the gate insulating film of each of the memory transistors which has the charge retaining function. The inner layer (which is the silicon nitride film MZ2 herein) functioning as the charge storage portion has a potential barrier height lower than that of each of the outer layers (which are the silicon dioxide films MZ1 and MZ3 herein) functioning as charge block layers.

The respective band gaps of the top insulating film (which is the silicon dioxide film MZ3 herein) and the bottom insulating film (which is the silicon dioxide film MZ1 herein) of the insulating film MZ need to be larger than the band gap of the charge storage layer (which is the silicon nitride film MZ2 herein) between the top insulating film and the bottom insulating film. By satisfying the need, the top insulating film (silicon dioxide film MZ3) and the bottom insulating film (silicon dioxide film MZ1) between which the charge storage layer (silicon nitride film MZ2) is interposed are allowed to function as the charge block layers (or charge confinement layers) for confining charges to the charge storage layer (silicon nitride film MZ2).

Figure 3:
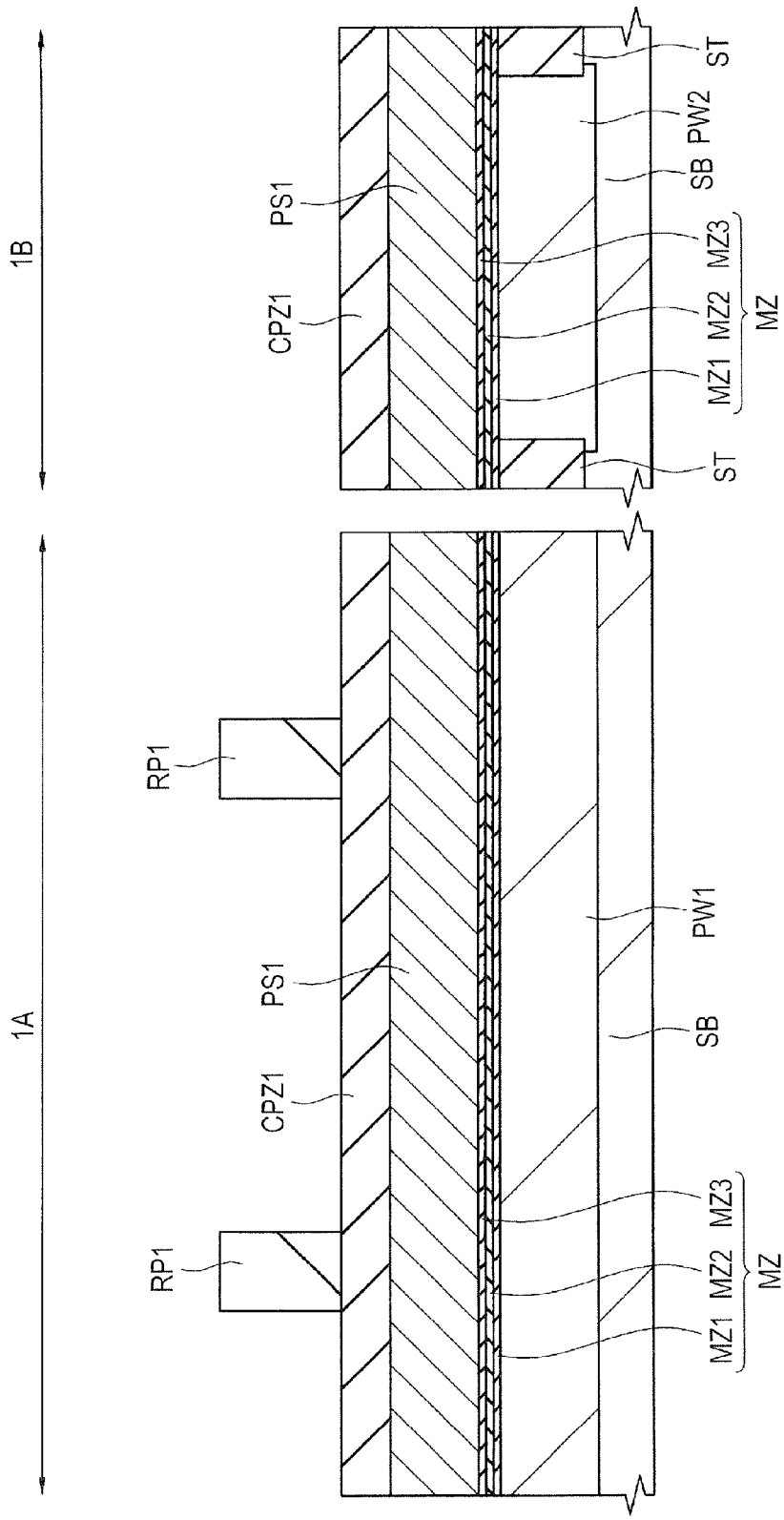
FIG. 3 is a main-portion cross-sectional view of the semiconductor device during the manufacturing process thereof, which is subsequent to FIG. 2.

Next, as shown in FIG. 3, over the main surface of the semiconductor substrate SB, i.e., over the insulating film MZ in the memory cell region 1A and the peripheral circuit region 1B, a silicon film PS1 is formed (deposited) as a conductive film for forming the memory gate electrodes MG.

The silicon film PS1 is a conductive film for the gate electrodes of the memory transistors, i.e., a conductive film for forming the memory gate electrodes MG described later. The memory gate electrodes MG described later are formed of the silicon film PS1.

The silicon film PS1 is made of a polycrystalline silicon film (polysilicon film) and can be formed using a CVD (Chemical Vapor Deposition) method or the like. The silicon film PS1 can be formed to a thickness of, e.g., about 40 to 100 nm. It is also possible to form an amorphous silicon film as the silicon film PS1 during the film deposition and then change the silicon film PS1 made of the amorphous silicon film to the silicon film PS1 made of the polycrystalline silicon film by subsequent heat treatment. The silicon film PS1 may also be a non-doped (undoped) silicon film or an n-type or p-type silicon film (doped polysilicon film) which is obtained by introducing an impurity (n-type or p-type impurity) into a non-doped silicon film during or after the film deposition.

Next, as shown in FIG. 3, over the main surface of the semiconductor substrate SB, i.e., over the silicon film PS1 in the memory cell region 1A and the peripheral circuit region 1B, an insulating film CPZ1 is formed. The insulating film CPZ1 is preferably made of a silicon nitride film and can be formed using a CVD method or the like.

Next, a multi-layer film including the silicon film PS1 and the insulating film CPZ1 over the silicon film PS1 is patterned using a photolithographic technique and an etching technique to form multi-layer bodies LM1 each including the memory gate electrode MG and a cap insulating film CP1 over the memory gate electrode MG.

Figure 4:
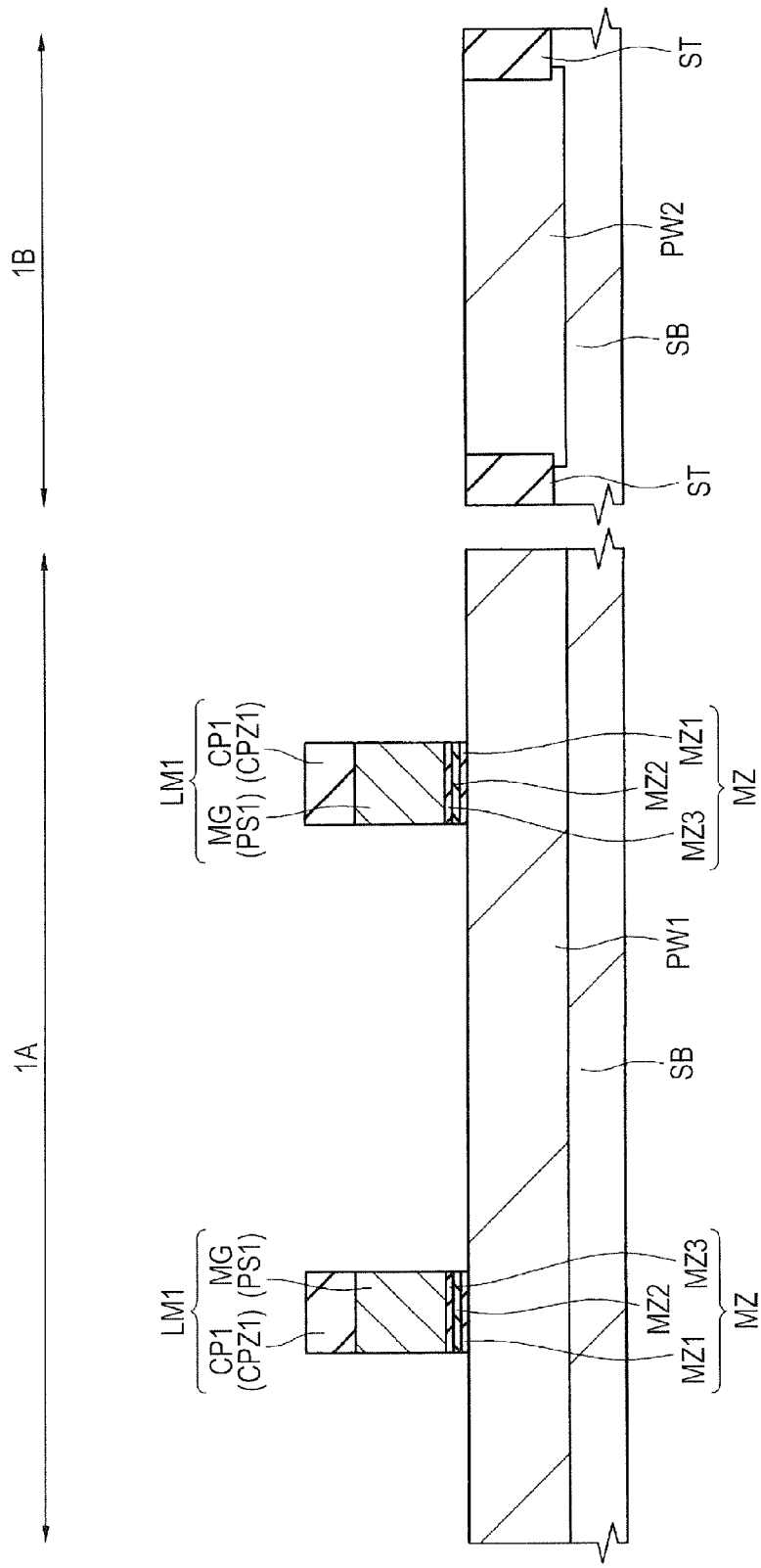
FIG. 4 is a main-portion cross-sectional view of the semiconductor device during the manufacturing process thereof, which is subsequent to FIG. 3.

Specifically, the patterning step can be performed, e.g., as follows. That is, as shown in FIG. 3, over the insulating film CPZ1, a photoresist pattern RP1 is formed using a photolithographic method. The photoresist pattern RP1 is formed in the areas of the memory cell region 1A where the memory gate electrodes MG are to be formed. Then, using the photoresist pattern RP1 as an etching mask, the insulating film CPZ1 and the silicon film PS1 in the memory cell region 1A are successively etched (dry-etched) to be patterned. After the multi-layer film including the silicon film PS1 and the insulating film CPZ1 is patterned, the photoresist pattern RP1 is removed. FIG. 4 shows a process stage after the removal of the photoresist pattern RP1.

Thus, as shown in FIG. 4, in the memory cell region 1A, the multi-layer bodies LM1 each including the memory gate electrode MG made of the patterned silicon film PS1 and the cap insulating film CP1 made of the patterned insulating film CPZ1 are formed.

In the memory cell region 1A, the insulating films MZ remaining under the multi-layer bodies LM1 serve as the gate insulating films of the memory transistors. As a result, the memory gate electrodes MG made of the patterned silicon film PS1 are formed over the semiconductor substrate SB (p-type well PW1) via the insulating films MZ as the gate insulating films, and the cap insulating films CP1 having substantially the same two-dimensional shapes as those of the memory gate electrodes MG are formed over the memory gate electrodes MG.

When the insulating film CPZ1 and the silicon film PS1 are etched using the photoresist pattern RP1 as the etching mask, the photoresist pattern RP1 is not formed in the peripheral circuit region 1B. Accordingly, the insulating film CPZ1 and the silicon film PS1 in the peripheral circuit region 1B is etched to be removed.

Also, the insulating film MZ in the memory cell region 1A except for the portion thereof covered with the memory gate electrodes MG and the insulating film MZ in the peripheral circuit region 1B may be removed by dry etching performed in the step of patterning the multi-layer film including the silicon film PS1 and the insulating film CPZ1 or by wet etching performed after the dry etching.

Figure 5:
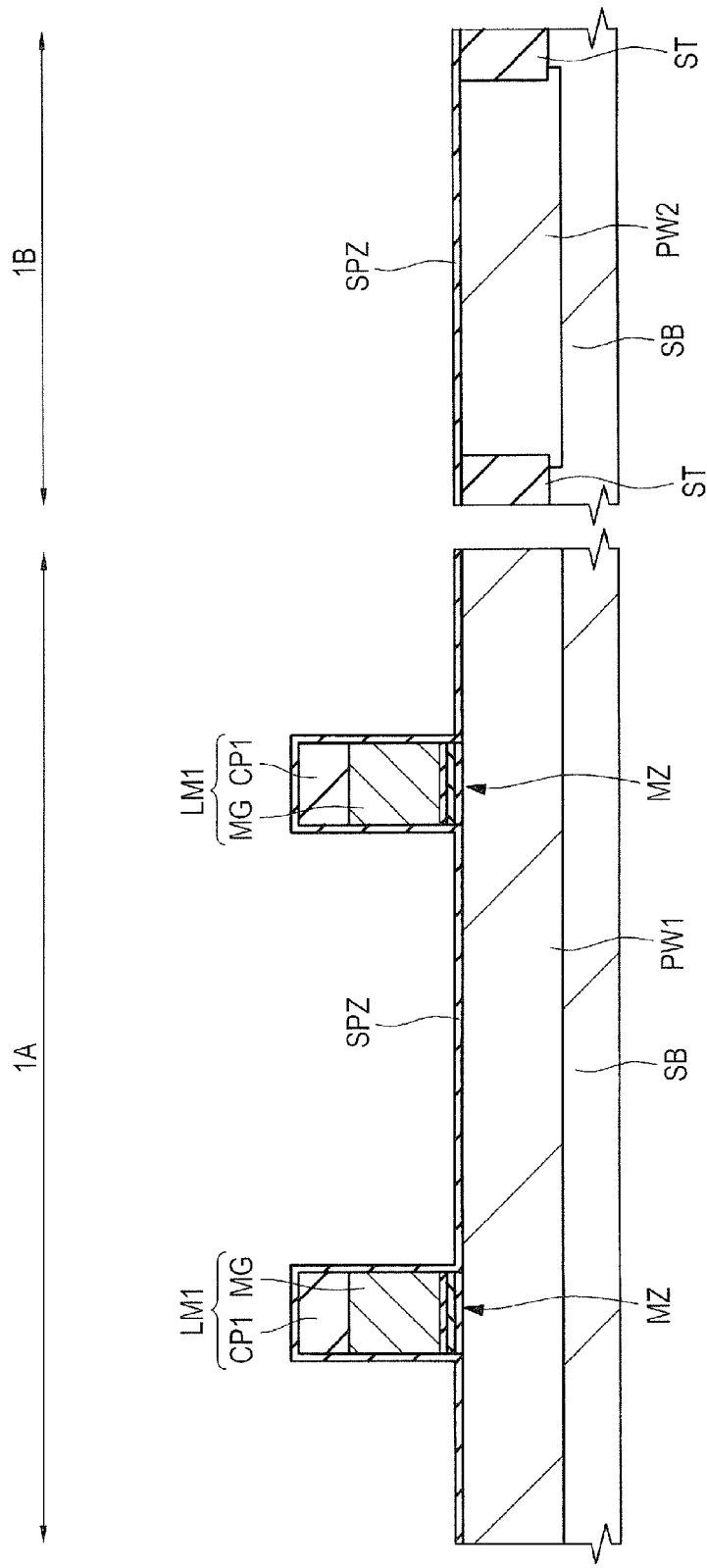
FIG. 5 is a main-portion cross-sectional view of the semiconductor device during the manufacturing process thereof, which is subsequent to FIG. 4.

Next, as shown in FIG. 5, over the main surface of the semiconductor substrate SB, an insulating film SPZ is formed so as to cover the multi-layer bodies LM1. The insulating film SPZ is preferably made of a silicon oxynitride film and can be formed using a CVD method or the like. The insulating film SPZ can be formed to a thickness of, e.g., about 5 to 15 nm. After the deposition of the insulating film SPZ, heat treatment such as lamp anneal can also be performed at, e.g., 1000° C. for about 60 seconds.

Figure 6:
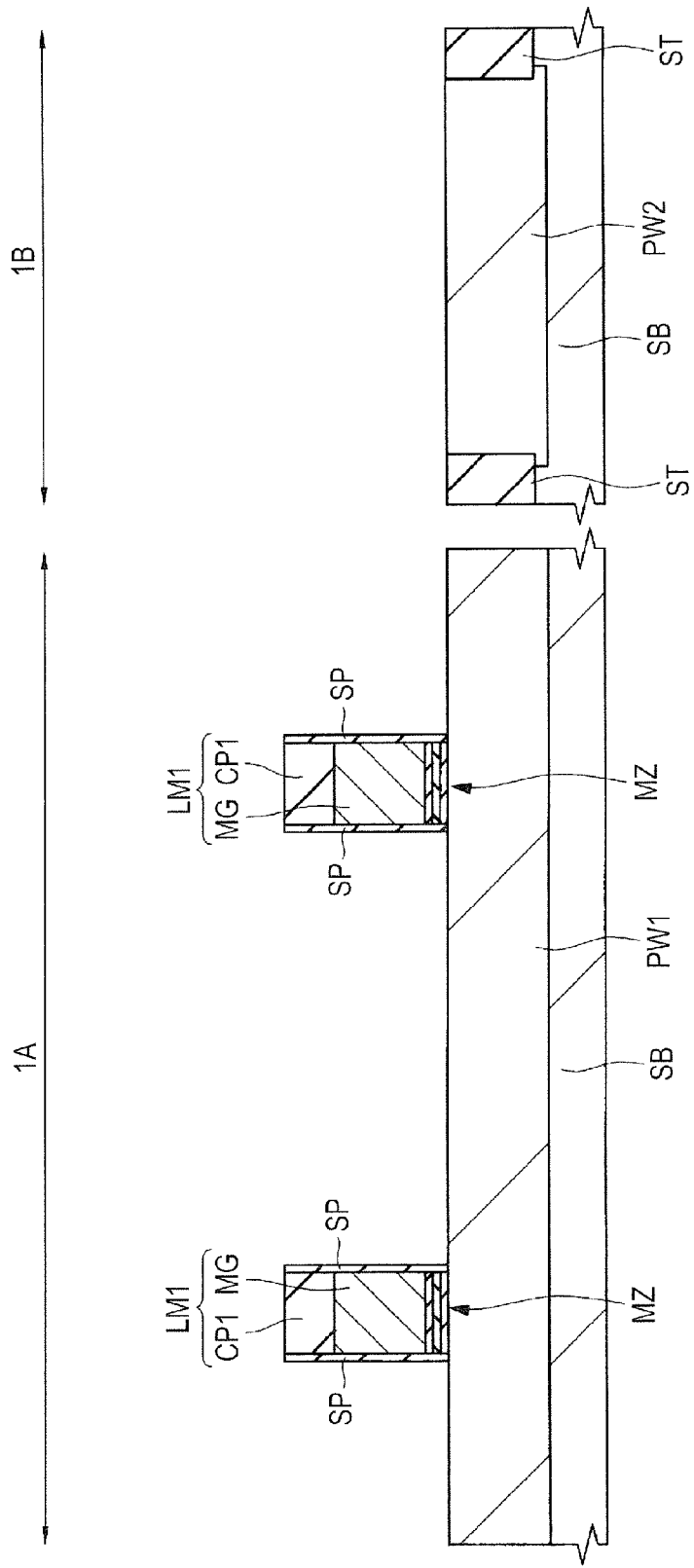
FIG. 6 is a main-portion cross-sectional view of the semiconductor device during the manufacturing process thereof, which is subsequent to FIG. 5.

Next, using an anisotropic etching technique, the insulating film SPZ is etched back (etched, dry-etched, or anisotropically etched). In the step of etching back the insulating film SPZ, by anisotropically etching the insulating film SPZ by the thickness of the deposited insulating film SPZ, the insulating film SPZ is selectively left over the both side surfaces of each of the multi-layer bodies LM1 and removed from the other region. As a result, as shown in FIG. 6, in the memory cell region 1A, the insulating film SPZ remaining in sidewall spacer shapes over the both side surfaces (side walls) of the multi-layer bodies LM1 form side-wall insulating films (side-wall spacers) SP. The side-wall insulating films SP are formed over the side surfaces (side walls) of the memory gate electrodes MG so as to come in contact with the side surfaces (side walls) of the memory gate electrodes MG. The insulating film SPZ, i.e., each of the side-wall insulating films SP is preferably made of a silicon oxynitride film.

Figure 7:
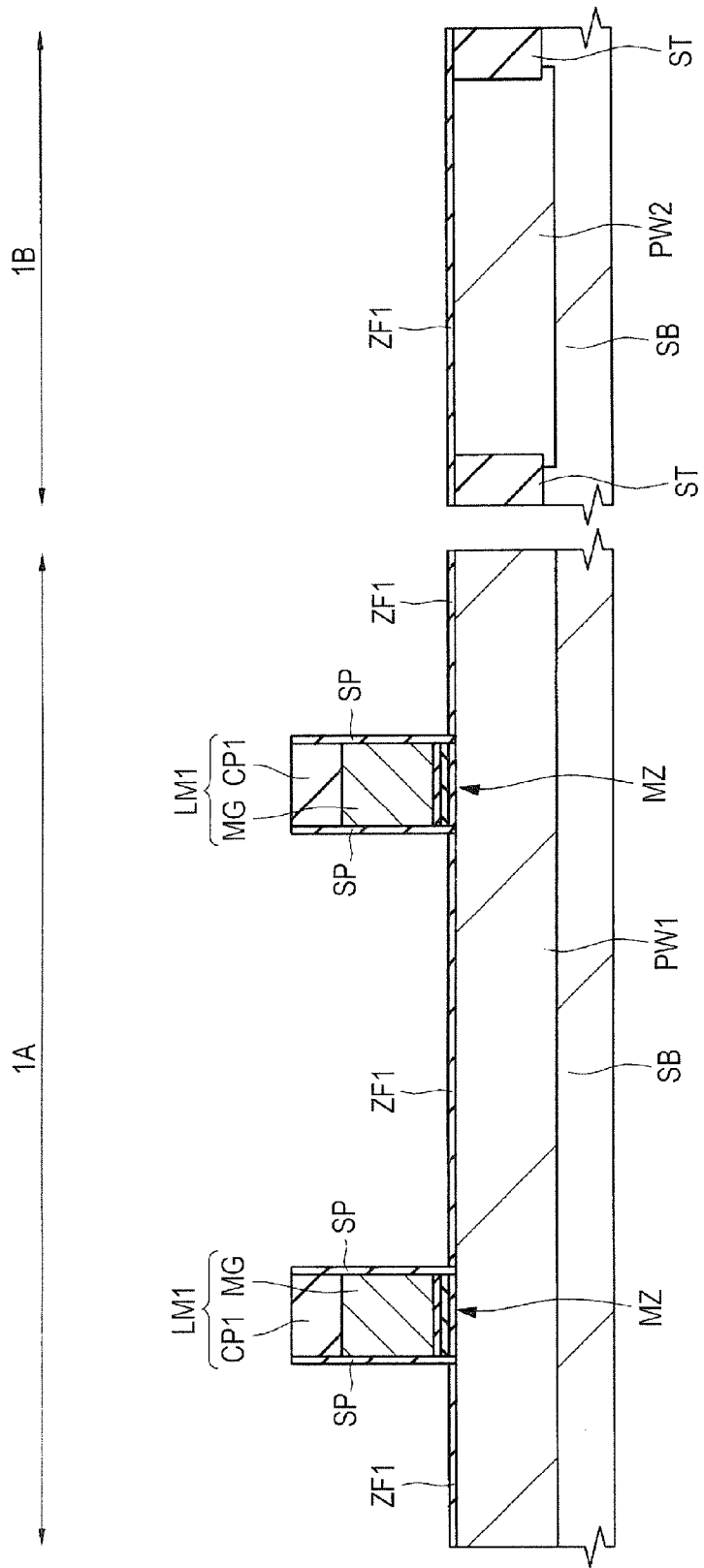
FIG. 7 is a main-portion cross-sectional view of the semiconductor device during the manufacturing process thereof, which is subsequent to FIG. 6.

Next, as shown in FIG. 7, over the main surface of the semiconductor substrate SB, an insulating film ZF1 is formed. The insulating film ZF1 is preferably made of a silicon dioxide film and can be formed by a thermal oxidization method. The insulating film SPZ can be formed to a thickness of, e.g., about 2 to 4 nm.

By forming the insulating film ZF1 by a thermal oxidation method, the insulating film ZF1 made of a silicon dioxide film is selectively formed over each of the exposed portions (exposed surfaces) of the semiconductor substrate SB. As a result, the insulating film ZF1 is formed over each of the top surfaces of the portions of the semiconductor substrate SB (p-type well PW1) in the memory cell region 1A which are uncovered with the multi-layer bodies LM1 and over the top surface of the semiconductor substrate SB (p-type well PW2) in the peripheral circuit region 1B. Note that, in FIG. 7, the insulating film ZF1 is formed also over the isolation region ST but, actually, the insulating film ZF1 is not formed over the isolation region ST. The insulating film ZF1 has the function of preventing the semiconductor substrate SB from being damaged in various subsequent process steps.

Figure 8:
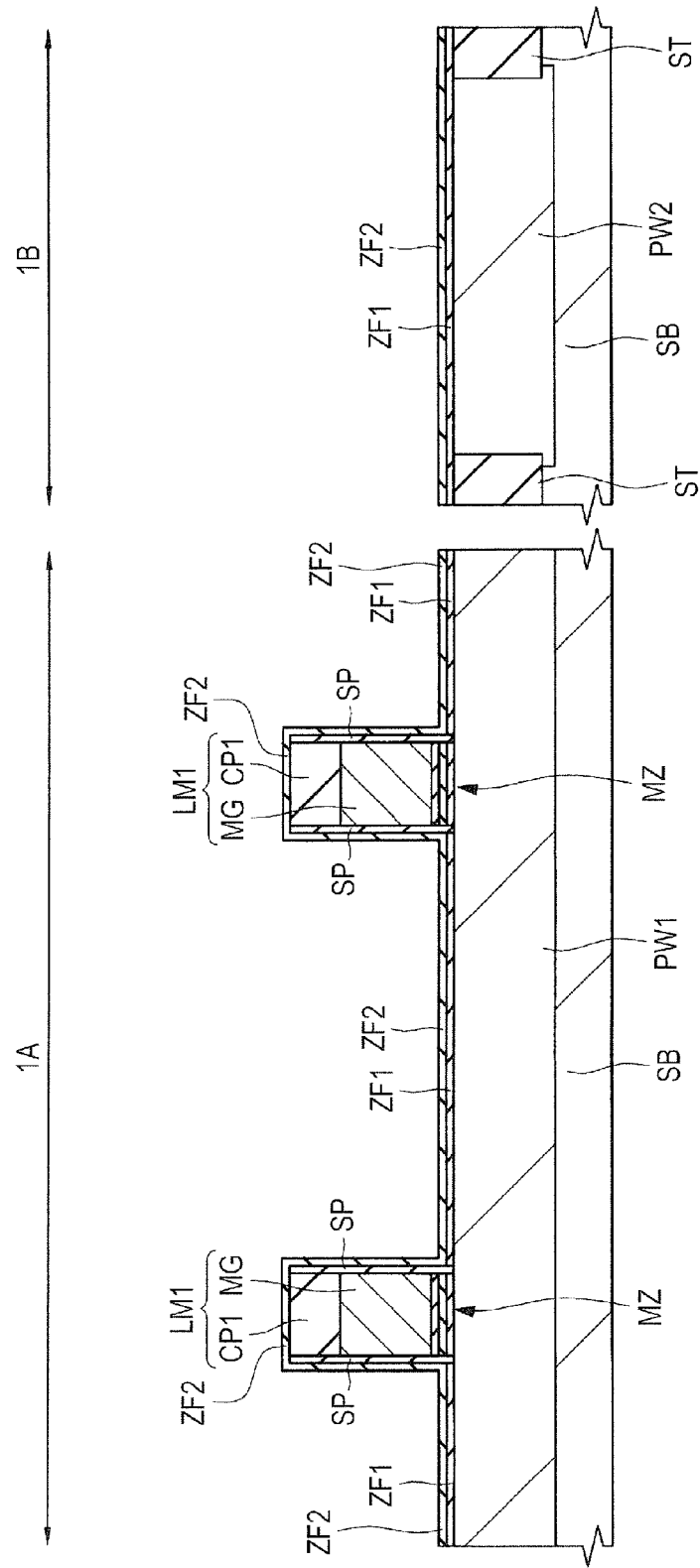
FIG. 8 is a main-portion cross-sectional view of the semiconductor device during the manufacturing process thereof, which is subsequent to FIG. 7.

Next, as shown in FIG. 8, over the main surface of the semiconductor substrate SB, an insulating film ZF2 is formed so as to cover the multi-layer bodies LM1, the side-wall insulating films SP, and the insulating film ZF1. The insulating film ZF2 is made of a material different from that of the insulating film ZF1. Preferably, the insulating film ZF2 is made of a silicon nitride film and can be formed using a CVD method or the like. The insulating film ZF2 can be formed to a thickness of, e.g., about 5 to 15 nm.

The insulating film ZF2 is formed over the upper surfaces (upper surfaces of the cap insulating films CP1) of the multi-layer bodies LM1, over the side-wall insulating films SP over the side surfaces of the multi-layer bodies LM1, over the insulating film ZF1 over the semiconductor substrate SB (p-type well PW1) in the memory cell region 1A, over the insulating film ZF1 over the semiconductor substrate (p-type well PW2) in the peripheral circuit region 1B, and over the isolation region ST. When the insulating film ZF2 is formed, over each of the side surfaces of the multi-layer bodies LM1, a multi-layer film including the side-wall insulating film SP and the insulating film ZF2 is formed.

The insulating film ZF2 is formed also over the isolation region ST. Consequently, when a material film ZF3 described later is etched back, the insulating film ZF2 present over the isolation region ST can reliably prevent the isolation region ST from being etched. In the etching step shown in FIG. 31 described later also, the insulating film ZF2 present over the isolation region ST can reliably prevent the isolation region ST from being etched.

Figure 9:
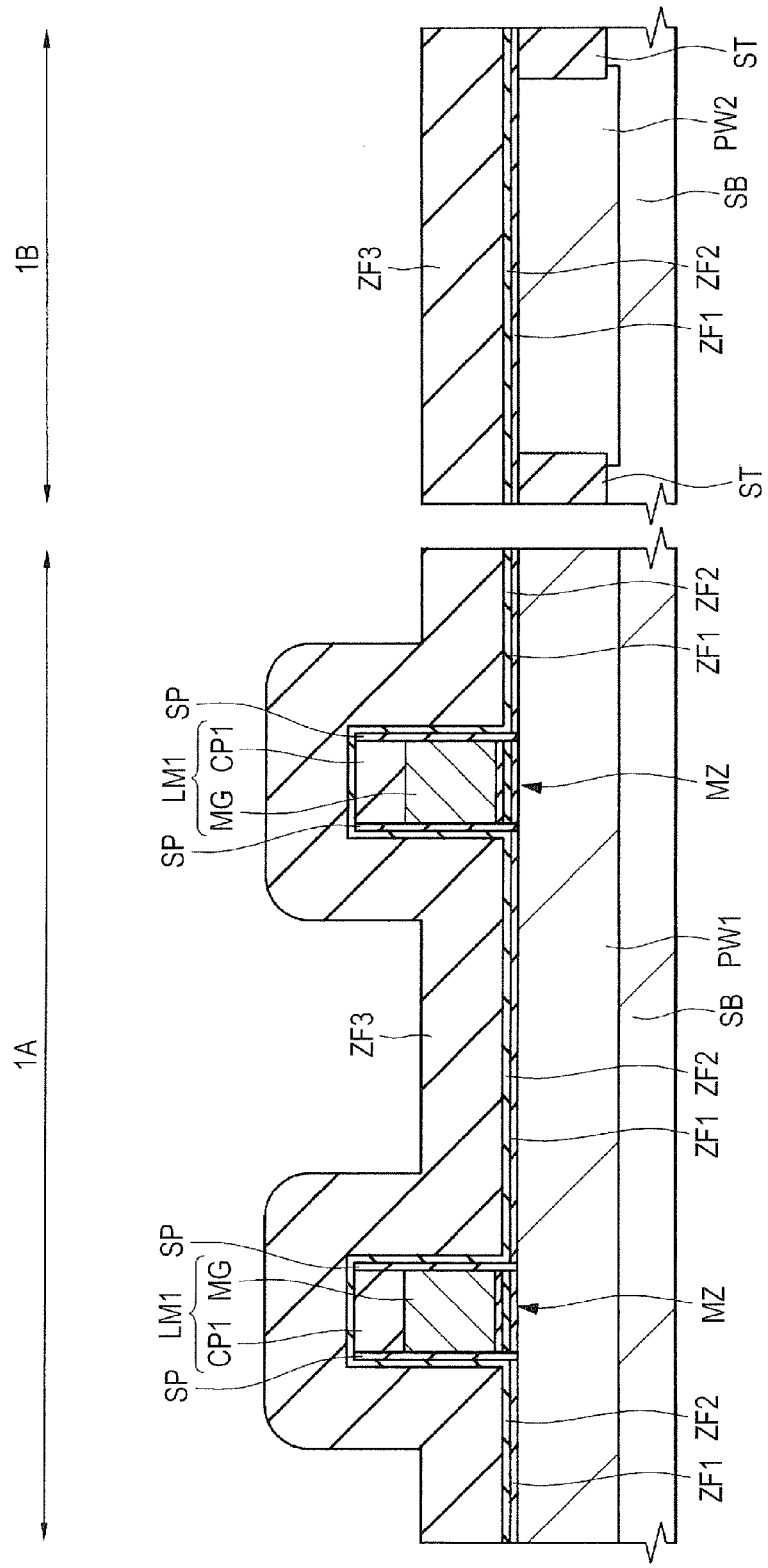
FIG. 9 is a main-portion cross-sectional view of the semiconductor device during the manufacturing process thereof, which is subsequent to FIG. 8.

Next, as shown in FIG. 9, over the main surface of the semiconductor substrate SB, i.e., over the insulating film ZF2, the material film ZF3 is formed (deposited) as a film for forming dummy control gate electrodes DCG so as to cover the multi-layer bodies LM1 in the memory cell region 1A.

The material film ZF3 is a film for forming the dummy control gate electrodes DCG described later. The material film ZF3 is made of a material different from that of the memory gate electrodes GF and accordingly made of a material different from that of the foregoing silicon film PS1. The material film ZF3 may also be an insulating film and is preferably made of a silicon dioxide film. For example, a TEOS oxide film can be used appropriately as the material film ZF3. The TEOS oxide film mentioned herein corresponds to a silicon dioxide film deposited using TEOS (tetraethoxysilane) as a raw material gas and can be formed using a CVD method. The material film ZF3 can be formed to a thickness of, e.g., about 40 to 80 nm.

Next, using an anisotropic etching technique, the material film ZF3 is etched back.

Figure 10:
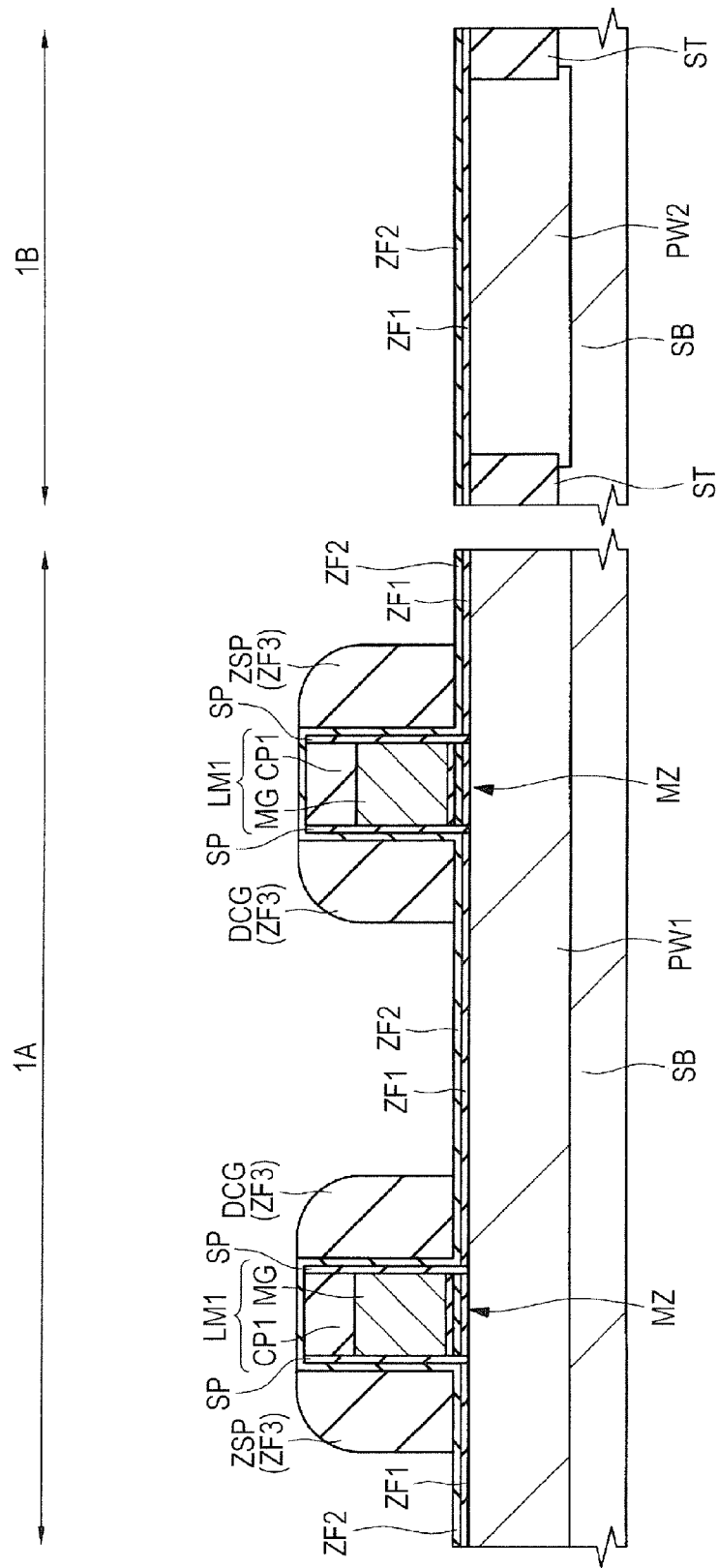
FIG. 10 is a main-portion cross-sectional view of the semiconductor device during the manufacturing process thereof, which is subsequent to FIG. 9.

In the step of etching back the material film ZF3, by anisotropically etching (etching back) the material film ZF3 by the thickness of the deposited material film ZF3, the material film ZF3 is left in sidewall spacer shapes over the both side surfaces (side walls) of the multi-layer bodies LM1 via the multi-layer films each including the side-wall insulating film SP and the insulating film ZF2 and removed from the other region. As a result, as shown in FIG. 10, in the memory cell region 1A, the material film ZF3 left in the sidewall spacer shape over one of the both side surfaces of each of the multi-layer bodies LM1 via the multi-layer film including the side-wall insulating film SP and the insulating film ZF2 forms the dummy control gate electrode DCG. Also, in the memory cell region 1A, the material film ZF3 left in the sidewall spacer shape over the other of the both side surfaces of each of the multi-layer bodies LM1 via the multi-layer film including the side-wall insulating film SP and the insulating film ZF2 forms a material film spacer ZSP. The dummy control gate electrode DCG is formed over the insulating film ZF2 so as to be adjacent to the memory gate electrode MG via the side-wall insulating film SP and the insulating film ZF2. Note that, by performing the step of etching back the material film ZF3, the regions of the insulating film ZF2 which are uncovered with the dummy control gate electrode DCG and the material film spacer ZSP are exposed. The dummy control gate electrode DCG and the material film spacer ZSP are formed into sidewall spacer shapes over the side surfaces (side walls) of each of the multi-layer bodies LM1 which are opposite to each other. That is, the dummy control gate electrode DCG is formed in the sidewall spacer shape on one of both sides of each of the multi-layer bodies LM1, while the material film spacer ZSP is formed in the sidewall spacer shape over the other side of each of the multi-layer bodies LM1.

The dummy control gate electrode DCG is a dummy gate electrode (pseudo gate electrode) to be subsequently replaced with a control gate electrode CG described later. Accordingly, the dummy control gate electrode DCG can also be regarded as a replacement gate electrode or a to-be-replaced gate electrode. That is, the dummy control gate electrode DCG is a to-be-replaced structure for forming the control gate electrode CG for the memory cell. Since the dummy control gate electrode DCG is not a gate electrode to be used in the manufactured semiconductor device, the dummy control gate electrode DCG may be formed of either a conductive film or an insulating film. Therefore, the foregoing material film ZF3 for forming the dummy control gate electrode DCG may be either a conductive film or an insulating film. Note that the dummy control gate electrode DCG may be formed of a conductive film, but is preferably formed of an insulating film. More preferably, the dummy control gate electrode DCG is formed of a silicon dioxide film.

The material film spacer ZSP can also be regarded as a sidewall spacer made of the material film ZF3. The dummy control gate electrode DCG and the material film spacer ZSP are formed over the side surfaces of each of the multi-layer bodies LM1 which are opposite to each other and have substantially symmetrical structures relative to the multi-layer body LM1 interposed therebetween.

Between the dummy control gate electrode DCG and the semiconductor substrate SB (p-type well PW1), a multi-layer film including the insulating films ZF1 and ZF2 is interposed. The insulating film ZF1 is located closer to the semiconductor substrate SB, while the insulating film ZF2 is located closer to the dummy control gate electrode DCG. Between the dummy control gate electrode DCG and each of the multi-layer bodies LM1, the multi-layer film including the side-wall insulating film SP and the insulating film ZF2 is interposed. The side-wall insulating film SP is located closer to the multi-layer body LM1, while the insulating film ZF2 is located closer to the dummy control gate electrode DCG.

Between the material film spacer ZSP and the semiconductor substrate SB (p-type well PW1), the multi-layer film including the insulating films ZF1 and ZF2 is interposed. The insulating film ZF1 is located closer to the semiconductor substrate SB, while the insulating film ZF2 is located closer to the dummy control gate electrode DCG. Between the material film spacer ZSP and each of the multi-layer bodies LM1, the multi-layer film including the side-wall insulating film SP and the insulating film ZF2 is interposed. The side-wall insulating film SP is located closer to the multi-layer body LM1, while the insulating film ZF2 is located closer to the dummy control gate electrode DCG.

Figure 11:
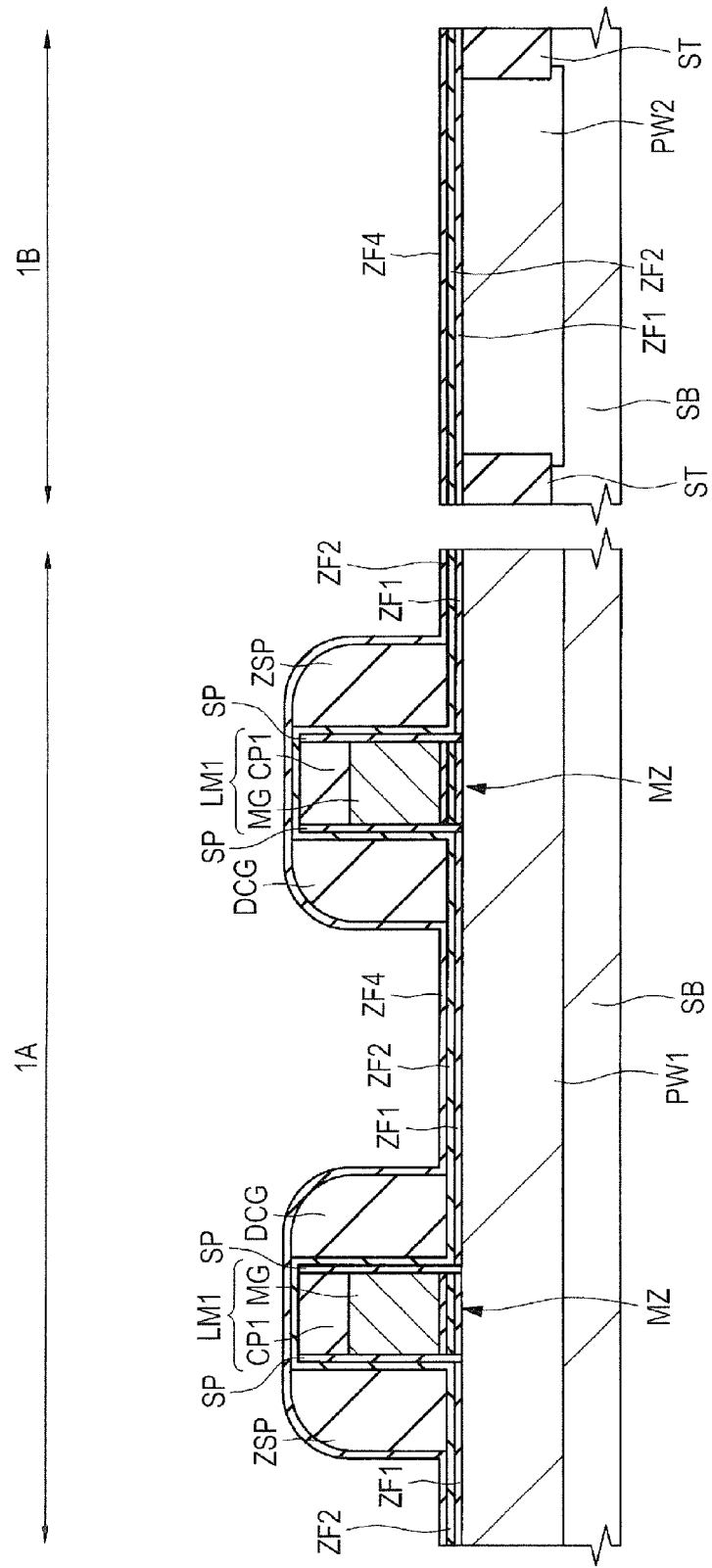
FIG. 11 is a main-portion cross-sectional view of the semiconductor device during the manufacturing process thereof, which is subsequent to FIG. 10.

Next, as shown in FIG. 11, over the main surface of the semiconductor substrate SB, i.e., over the insulating film ZF2, an insulating film ZF4 is formed so as to cover the multi-layer bodies LM1, the dummy control gate electrodes DCG, and the material film spacers ZSP.

The insulating film ZF4 is preferably made of a silicon dioxide film and can be formed using a CVD method or the like. The insulating film ZF4 can be formed to a thickness of, e.g., about 5 to 15 nm. As the insulating film ZF4, a HTO (High Temperature Oxide) film can be used appropriately.

Figure 12:
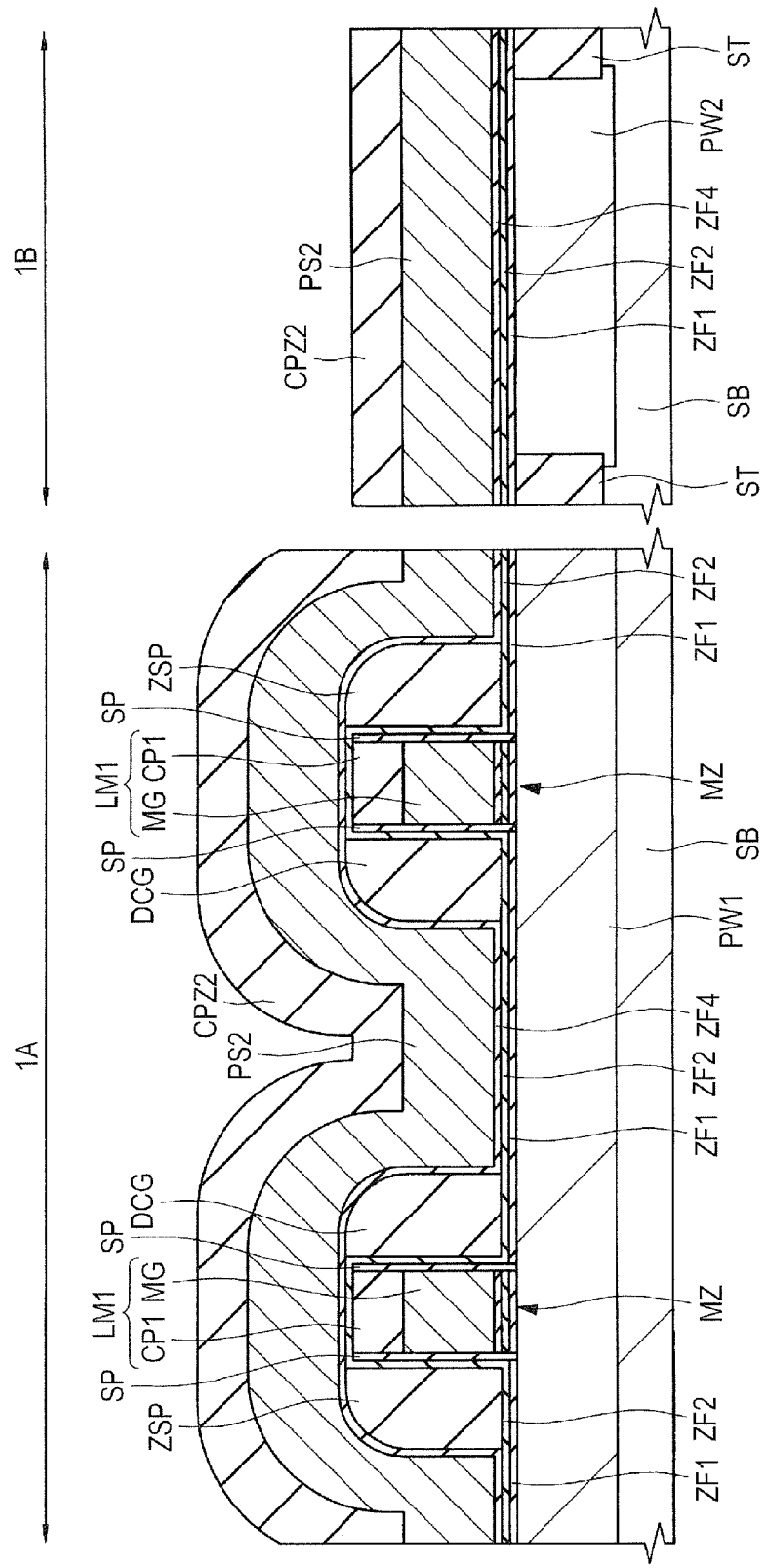
FIG. 12 is a main-portion cross-sectional view of the semiconductor device during the manufacturing process thereof, which is subsequent to FIG. 11.

Next, as shown in FIG. 12, over the main surface of the semiconductor substrate SB, i.e., over the insulating film ZF4, a silicon film PS2 is formed (deposited) as a film for forming dummy gate electrodes DGE.

The silicon film PS2 is made of a polysilicon film and can be formed using a CVD method or the like. The silicon film PS2 can be formed to a thickness of, e.g., about 40 to 100 nm. It is also possible to form an amorphous silicon film as the silicon film PS2 during the film deposition and then change the silicon film PS2 made of the amorphous silicon film to the silicon film PS2 made of the polysilicon film by subsequent heat treatment.

Next, as shown in FIG. 12, over the main surface of the semiconductor substrate SB, i.e., over the silicon film PS2, an insulating film CPZ2 is formed. The insulating film CPZ2 is preferably made of a silicon nitride film and can be formed using a CVD method or the like. The insulating film CPZ2 can be formed to a thickness of, e.g., about 20 to 100 nm.

Figure 13:
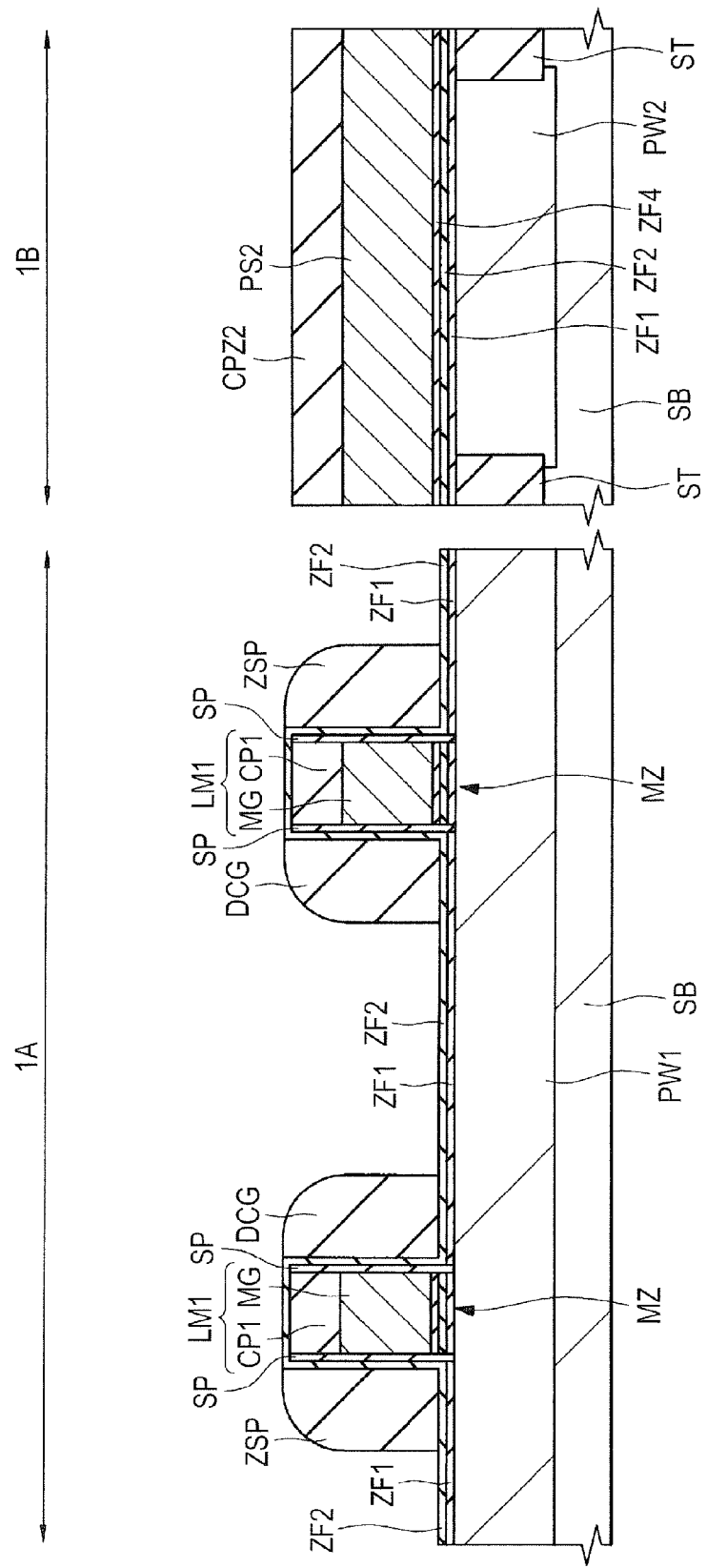
FIG. 13 is a main-portion cross-sectional view of the semiconductor device during the manufacturing process thereof, which is subsequent to FIG. 12.

Next, as shown in FIG. 13, a photoresist pattern (not shown) which exposes the memory cell region 1A and covers the peripheral circuit region 1B is formed over the insulating film CPZ2 using a photolithographic technique. Then, using the photoresist pattern as an etching mask, the insulating film CPZ2 and the silicon film PS2 in the memory cell region 1A are successively etched to be removed. As the etching, isotropic dry etching can be used. It is also possible to cause the insulating film ZF4 to function as an etching stopper film. Thereafter, the foregoing photoresist pattern is removed and then the insulating film ZF4 in the memory cell region 1A is etched to be removed. FIG. 13 shows this process stage.

When the insulating film ZF4 in the memory cell region 1A is etched, wet etching or isotropic dry etching can be used. As the wet etching, e.g., wet etching using a diluted hydrofluoric acid can be used. When the insulating film ZF4 in the memory cell region 1A is etched, it is preferable to minimize the etching of the dummy control gate electrodes DCG by adjusting an etching period or the like.

Since the etching is performed in the state where the peripheral circuit region 1B is covered with the foregoing photoresist pattern, in the peripheral circuit region 1B, as shown in FIG. 13, the insulating film CPZ2, the silicon film PS2, and the insulating films ZF4, ZF2, and ZF1 are not etched and remain. Consequently, in the peripheral circuit region 1B, over the semiconductor substrate SB (p-type well PW2), the insulating films ZF1, ZF2, and ZF4, the silicon film PS2, and the insulating film CPZ are formed (stacked) in ascending order.

Next, in the peripheral circuit region 1B, a multi-layer film including the silicon film PS2 and the insulating film CPZ2 over the silicon film PS2 is patterned using a photolithographic technique and an etching technique to form a multi-layer body LM2 including the dummy gate electrode DGE and a cap insulating film CP2 over the dummy gate electrode DGE.

Figure 14:
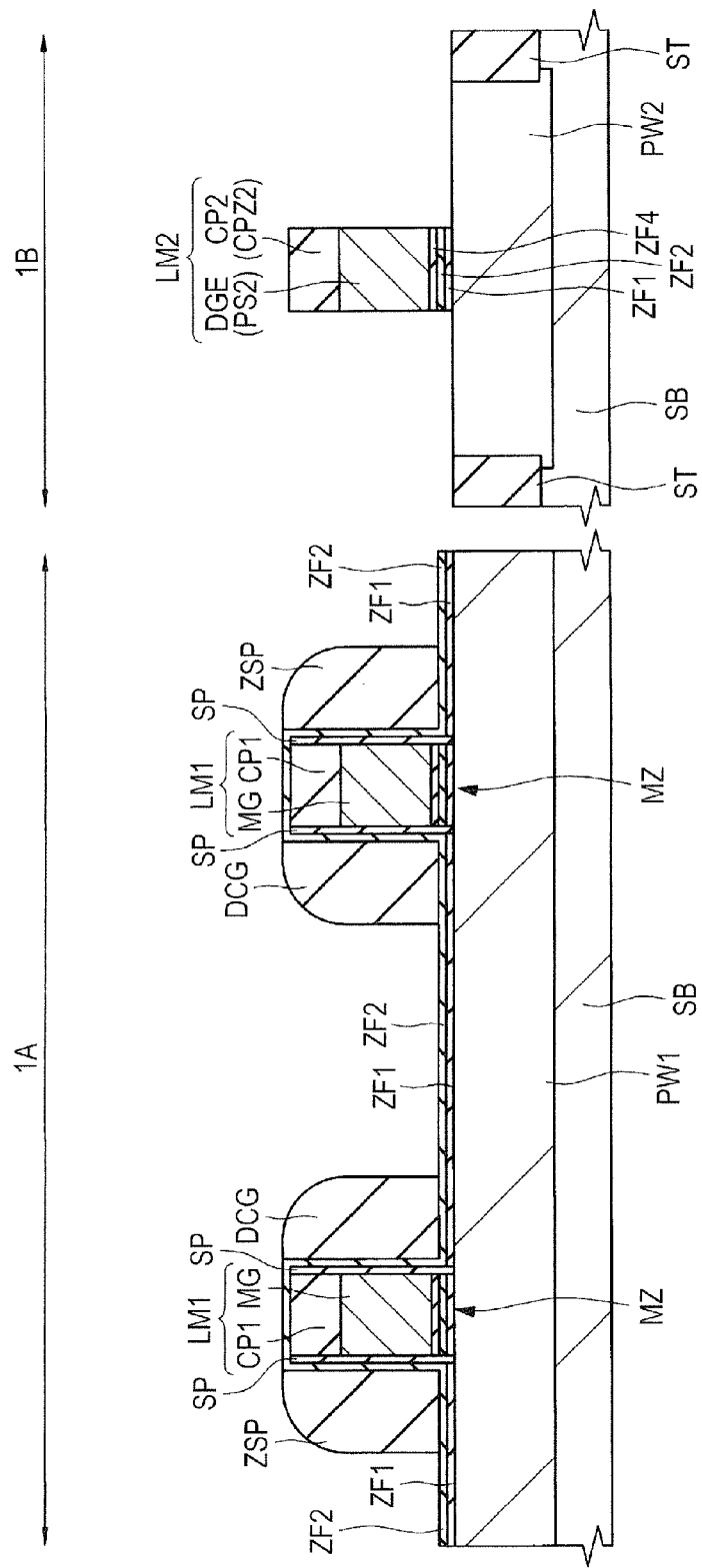
FIG. 14 is a main-portion cross-sectional view of the semiconductor device during the manufacturing process thereof, which is subsequent to FIG. 13.

Specifically, the patterning step can be performed, e.g., as follows. That is, over the insulating film CPZ2, a photoresist pattern (not shown) is formed using a photolithographic method. The photoresist pattern is formed in the entire memory cell region 1A and in the area of the peripheral circuit region 1B where the dummy gate electrode DGE is to be formed. Then, using the photoresist pattern as an etching mask, the insulating film CPZ2 and the silicon film PS2 in the peripheral circuit region 1B are successively etched (dry etched) to be patterned. After the multi-layer film including the silicon film PS2 and the insulating film CPZ2 is patterned, the photoresist pattern is removed. FIG. 14 shows this process stage.

Thus, as shown in FIG. 14, in the peripheral circuit region 1B, the multi-layer body LM2 including the dummy gate electrode DGE made of the patterned silicon film PS2 and the patterned insulating film CPZ2 is formed.

The dummy gate electrode DGE is a dummy gate electrode (pseudo gate electrode) to be subsequently replaced with a gate electrode GE described later. The dummy gate electrode DGE is not the gate electrode to be used in the manufactured semiconductor device. Accordingly, the dummy gate electrode DGE can also be regarded as a replacement gate electrode of a to-be-replaced gate electrode. That is, the dummy gate electrode DGE is a to-be-replaced structure for forming the gate electrode GE of the MISFET for the peripheral circuit.

In the peripheral circuit region 1B, the insulating films ZF4, ZF2, and ZF1 except for the portions thereof covered with the dummy gate electrode DGE may be removed by dry etching performed in the step of patterning the multi-layer film including the silicon film PS2 and the insulating film CPZ2 or by wet etching performed after the dry etching.

This provides the state where the dummy gate electrode DGE made of the patterned silicon film PS2 is formed over the semiconductor substrate SB (p-type well PW2) via a multi-layer film including the insulating films ZF1, ZF2, and ZF4, and the cap insulating film CP2 having substantially the same two-dimensional shape as that of the dummy gate electrode DGE is formed over the dummy gate electrode DGE. Between the dummy gate electrode DGE and the semiconductor substrate SB (p-type well PW2), the multi-layer film including the insulating films ZF1, ZF2, and ZF4 which are stacked in ascending order is interposed.

Since the etching is performed in the state where the memory cell region 1A is covered with the foregoing photoresist pattern, in the memory cell region 1A, as shown in FIG. 14, the multi-layer bodies LM1, the dummy control gate electrodes DCG, the material film spacers ZSP, the insulating films ZF2 and ZF1, the side-wall insulating films SP, and the insulating films MZ are not etched and remain.

Figure 15:
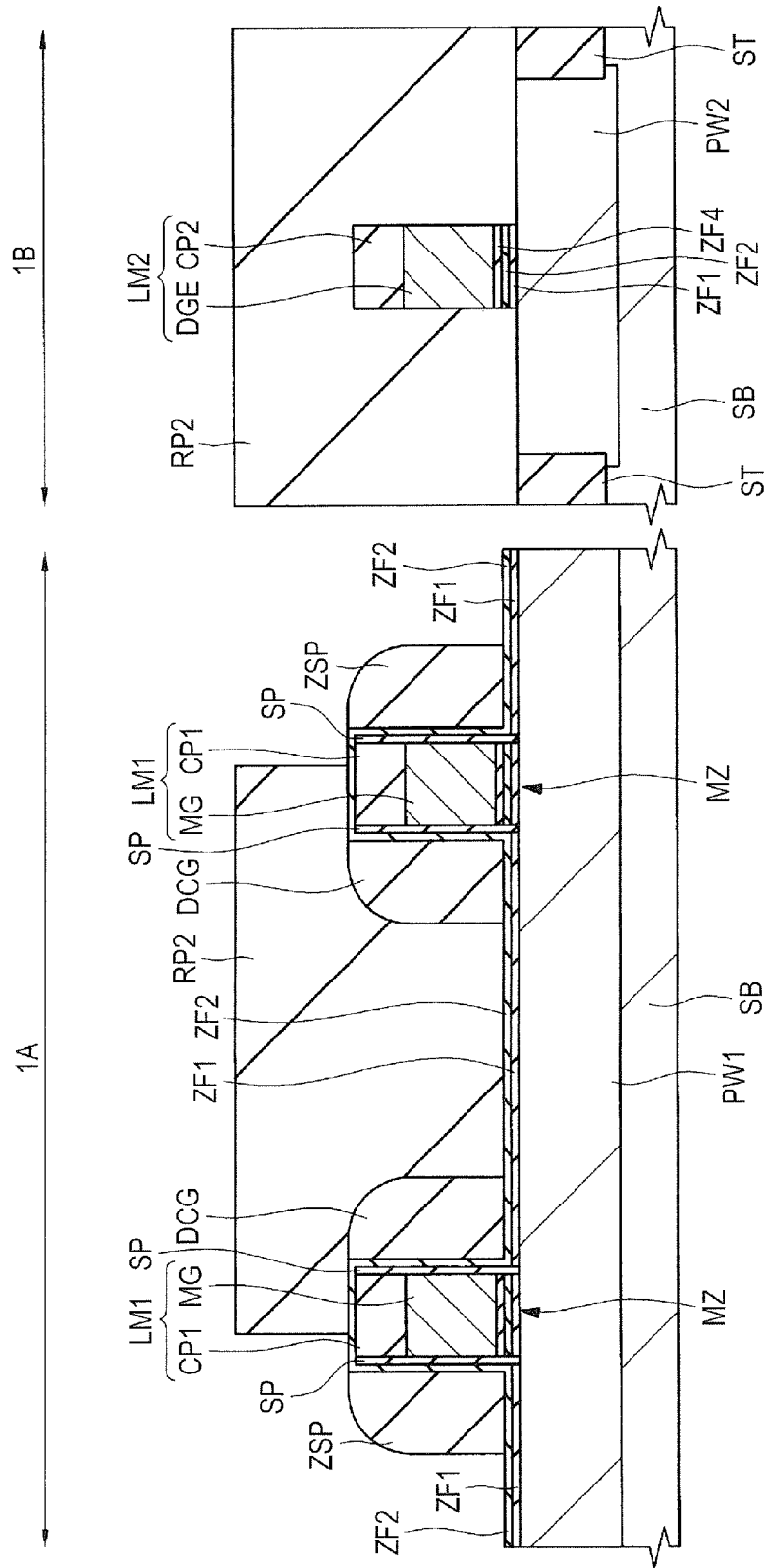
FIG. 15 is a main-portion cross-sectional view of the semiconductor device during the manufacturing process thereof, which is subsequent to FIG. 14.
Figure 16:
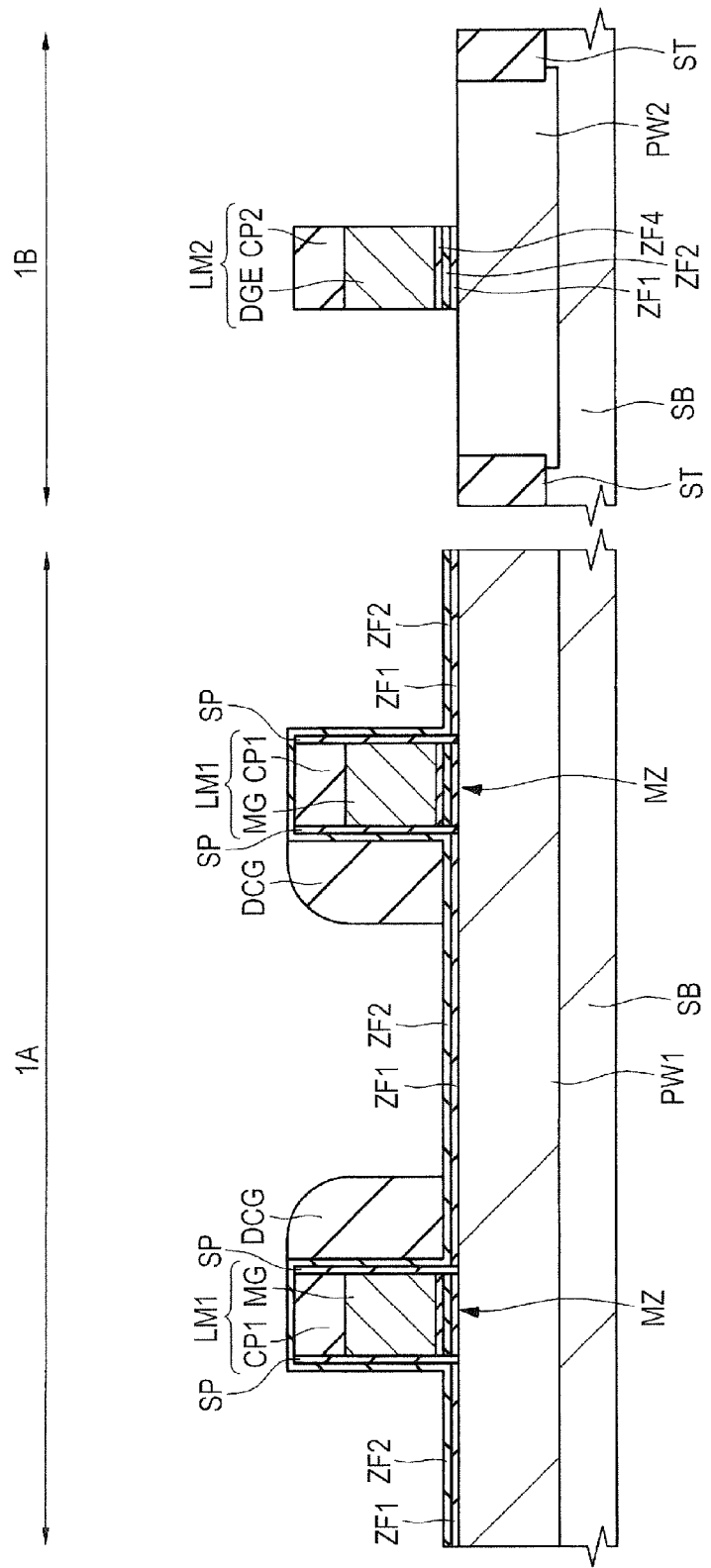
FIG. 16 is a main-portion cross-sectional view of the semiconductor device during the manufacturing process thereof, which is subsequent to FIG. 15.

Next, as shown in FIG. 15, using a photolithographic technique, a photoresist pattern RP2 which covers the dummy control gate electrodes DCG and exposes the material film spacers ZSP is formed over the semiconductor substrate SB. The entire peripheral circuit region 1B is also covered with the photoresist pattern RP2. Then, by etching using the photoresist pattern RP2 as an etching mask, the material film spacers ZSP are removed. At this time, in the memory cell region 1A, it is possible to cause the insulating film ZF2 to function as an etching stopper film. Subsequently, the photoresist pattern RP2 is removed. FIG. 16 shows this process stage. The material film spacers ZSP are removed, while the dummy control gate electrodes DCG covered with the photoresist pattern RP2 are not etched and remain. For the etching of the material film spacers ZSP, dry etching or wet etching can be used. For example, wet etching using, e.g., a diluted hydrofluoric acid can be used.

Figure 17:
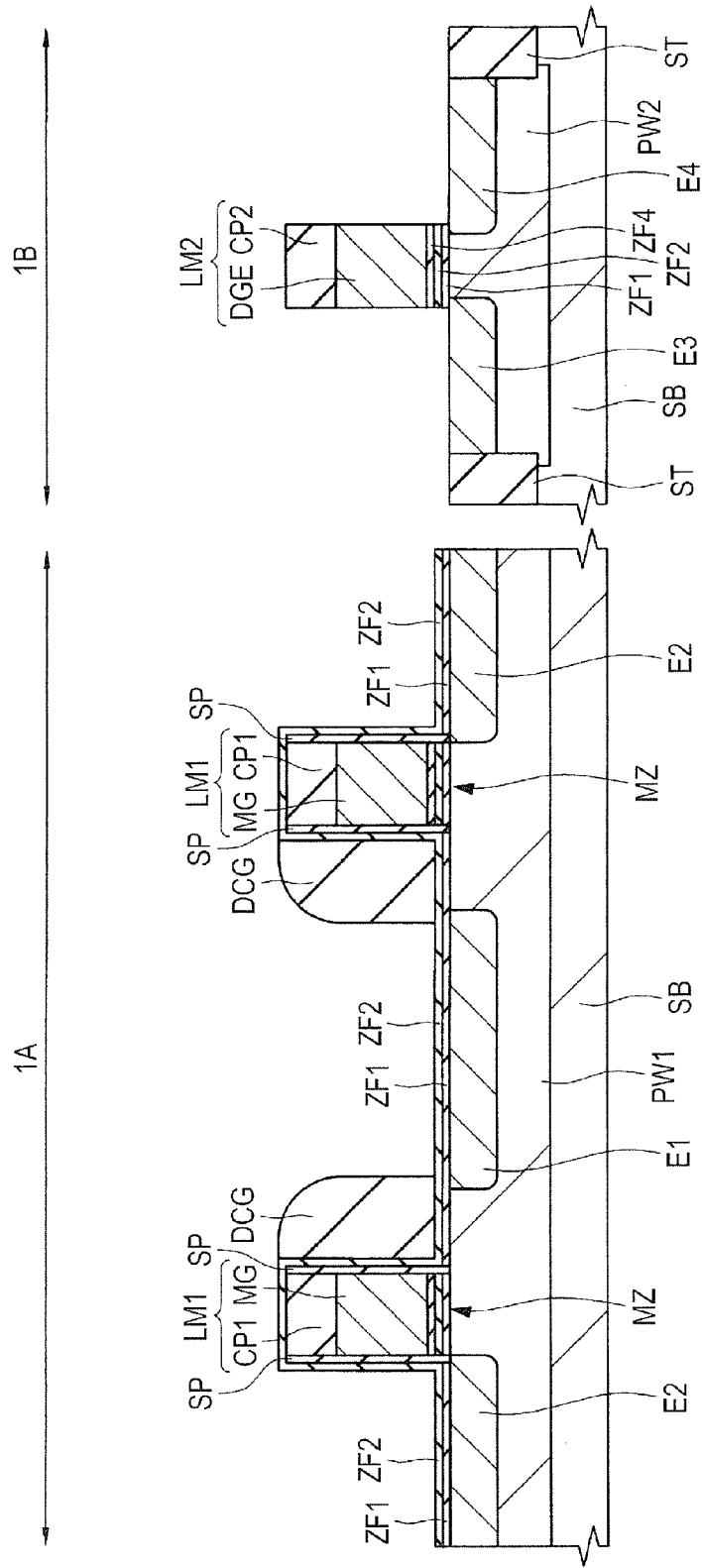
FIG. 17 is a main-portion cross-sectional view of the semiconductor device during the manufacturing process thereof, which is subsequent to FIG. 16.

Next, as shown in FIG. 17, n⁻-type semiconductor regions (extension regions or LDD regions) E1, E2, E3, and E4 are formed using an ion implantation method.

Specifically, by ion-implanting an n-type impurity such as, e.g., arsenic (As) or phosphorus (P) into the semiconductor substrate SB (p-type wells PW1 and PW2) using the multi-layer bodies LM1, the dummy control gate electrodes DCG, and the multi-layer body LM2 as a mask (ion implantation inhibiting mask), the n⁻-type semiconductor regions E1, E2, E3, and E4 can be formed.

At this time, in the memory cell region 1A, the dummy control gate electrodes DCG function as the mask to allow the n⁻-type semiconductor region E1 to be formed by self-alignment with the side surfaces of the dummy control gate electrodes DCG and the multi-layer bodies LM1 function as the mask to allow the n⁻-type semiconductor regions E2 to be formed by self-alignment with the side surfaces of the multi-layer bodies LM1. In the peripheral circuit region 1B, the multi-layer body LM2 functions as the mask to allow the n⁻-type semiconductor region E3 to be formed by self-alignment with one of the side surfaces of the multi-layer body LM2 and allow the n⁻-type semiconductor region E4 to be formed by self-alignment with the other side surface of the multi-layer body LM2.

The n⁻-type semiconductor regions E1, E2, E3, and E4 can be formed in the same ion implantation step, but can also be formed in different ion implantation steps. Conditions for ion implantation can also be varied in the ion implantation for forming the n⁻-type semiconductor region E1, in the ion implantation for forming the n⁻-type semiconductor regions E2, and in the ion implantation for forming the n⁻-type semiconductor regions E3 and E4. Before or after the n⁻-type semiconductor regions E1, E2, E3, and E4 are formed, ion implantation for forming halo regions or ion implantation for forming pocket regions can also be formed. Alternatively, before n⁻-type semiconductor regions E3 and E4 are formed, side-wall insulating films each made of a silicon nitride film can also be formed over the both side surfaces of the dummy gate electrode DGE.

Next, over the respective side surfaces of the multi-layer bodies LM1, the dummy control gate electrodes DCG, and the dummy gate electrode DGE, sidewall spacers (sidewalls or side-wall insulating films) SW1, SW2, and SW3 each made of an insulating film (insulator) are formed. The sidewall spacers SW1, SW2, and SW3 can also be regarded as side-wall insulating films. The sidewall spacers SW1, SW2, and SW3 are made of a material different from that of the dummy control gate electrodes DCG and are preferably made of silicon nitride (a silicon nitride film).

The sidewall spacers SW1 are formed over those of the respective side surfaces (side walls) of the dummy control gate electrodes DCG which are opposite to the side surfaces thereof adjacent to the multi-layer bodies LM1 via the side-wall insulating films SP and the insulating films ZF2. The sidewall spacers SW2 are formed over those of the respective side surfaces of the multi-layer bodies LM1 which are opposite to the side surfaces thereof adjacent to the dummy control gate electrodes DCG via the side-wall insulating films SP and the insulating films ZF2. On the other hand, the sidewall spacers SW3 are formed over the both side surfaces of the multi-layer body LM2. That is, the sidewall spacers SW2 are formed on the side of the memory gate electrodes MG (multi-layer bodies LM1) which is opposite to the side thereof where the memory gate electrodes MG are adjacent to the dummy control gate electrodes DCG and the sidewall spacers SW1 are formed on the side of the dummy control gate electrodes DCG which is opposite to the side thereof where the dummy control gate electrodes DCG are adjacent to the memory gate electrodes MG (multi-layer bodies LM1). On the other hand, the sidewall spacers SW3 are formed on both sides of the dummy gate electrode DGE (multi-layer body LM2).

Note that, between the sidewall spacers SW2 and the multi-layer bodies LM1, the multi-layer films including the side-wall insulating films SP and the insulating films ZF2 are interposed. The side-wall insulating films SP are located closer to the multi-layer bodies LM1, while the insulating films ZF2 are located closer to the sidewall spacers SW2. Also, between the sidewall spacers SW2 and the semiconductor substrate SB (p-type well PW1), the multi-layer films including the insulating films ZF1 and ZF2 are interposed. The insulating films ZF1 are located closer to the semiconductor substrate SB, while the insulating films ZF2 are located closer to the sidewall spacers SW2. The sidewall spacers SW1 are adjacent to and in contact with the dummy control gate electrodes DCG. Between the sidewall spacers SW1 and the semiconductor substrate SB (p-type well PW1), the multi-layer films including the insulating films ZF1 and ZF2 are interposed. The insulating films ZF1 are located closer to the semiconductor substrate SB, while the insulating films ZF2 are located closer to the sidewall spacers SW1.

The steps of forming the sidewall spacers SW1, SW2, and SW3 can be performed, e.g., as follows. That is, first, over the main surface of the semiconductor substrate SB, an insulating film (preferably, a silicon nitride film) for forming the sidewall spacers is deposited using a CVD method or the like so as to cover the multi-layer bodies LM1 and LM2 and the dummy control gate electrodes DCG and then etched back (anisotropically etched). By the etch-back process, the insulating film (insulating film for forming the sidewall spacers) is selectively left over the respective side surfaces of the multi-layer bodies LM1, the dummy control gate electrodes DCG, and the dummy gate electrode DGE to form the sidewall spacers SW1, SW2, and SW3 and removed from the other region. In the etch-back process, the respective exposed portions of the insulating films ZF2 and ZF1 which are uncovered with the dummy control gate electrodes DCG and the sidewall spacers SW1, SW2, and SW3 may also be removed.

Figure 18:
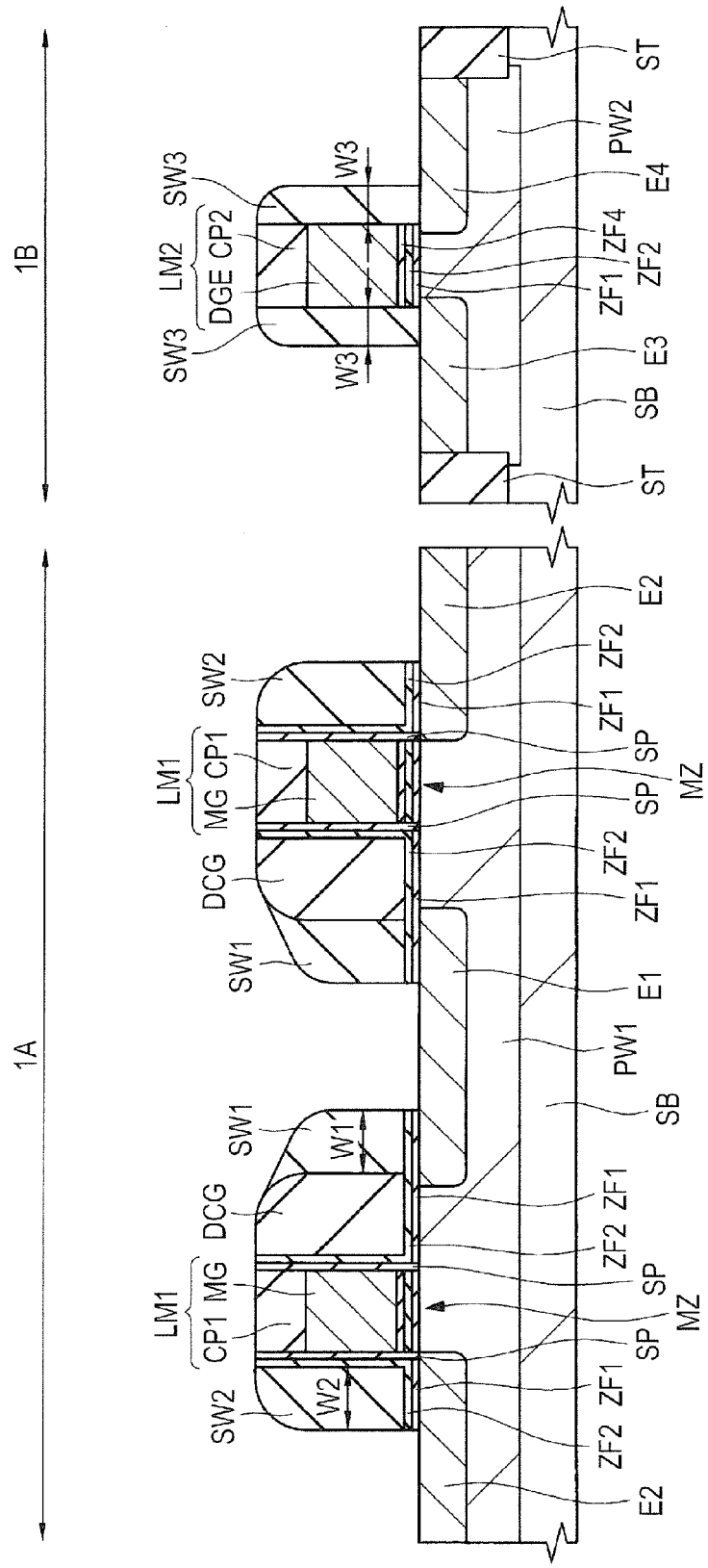
FIG. 18 is a main-portion cross-sectional view of the semiconductor device during the manufacturing process thereof, which is subsequent to FIG. 17.

Note that FIG. 18 shows the case where, when the sidewall spacers SW1, SW2, and SW3 are formed, the respective exposed portions of the insulating films ZF2 and ZF1 which are uncovered with the dummy control gate electrodes DCG and the sidewall spacers SW1, SW2, and SW3 are removed. In another form, there may also be a case where, when the sidewall spacers SW1, SW2, and SW3 are formed, the respective exposed portions of the insulating films ZF2 and ZF1 or the exposed portions of the insulating film ZF1 which are uncovered with the dummy control gate electrodes DCG and the sidewall spacers SW1, SW2, and SW3 are not removed and remain. However, in such a case also, it is necessary to remove the respective exposed portions of the insulating films ZF2 and ZF1 which are uncovered with the dummy control gate electrodes DCG and the sidewall spacers SW1, SW2, and SW3 and expose the respective upper surfaces of n⁺-type semiconductor regions H1, H2, H3, and H4 described later by the time immediately before metal silicide layers SL described later are formed (i.e., immediately before a metal film for forming the metal silicide layers SL is formed). This allows the metal silicide layers SL described later to be reliably formed in the respective exposed surfaces of the n⁺-type semiconductor regions H1, H2, H3, and H4 described later.

Each of the widths (thicknesses) W1 and W2 of the sidewall spacers SW1 and SW2 in the memory cell region 1A can be equal to the width (thickness) W3 of the sidewall spacer SW3 in the peripheral circuit region 1B, but may also be different from the width W3. Note that the respective widths W1 and W2 of the sidewall spacers SW1 and SW2 correspond to the respective widths (sizes) of the sidewall spacers SW1 and SW2 in the gate length direction of each of the memory gate electrodes MG. The width W3 of the sidewall spacer SW3 corresponds to the width (size) of the sidewall spacer SW3 in the gate length direction of the gate electrode GE formed later.

For example, the width W1 of the sidewall spacer SW1 and the width W2 of the sidewall spacer SW2 in the memory cell region 1A can be set larger than the width W3 of the sidewall spacer SW3 in the peripheral circuit region 1B. The following will describe an example of the steps of forming the sidewall spacers SW1, SW2, and SW3 in that case with reference to FIGS. 19 to 21.

Figure 19:
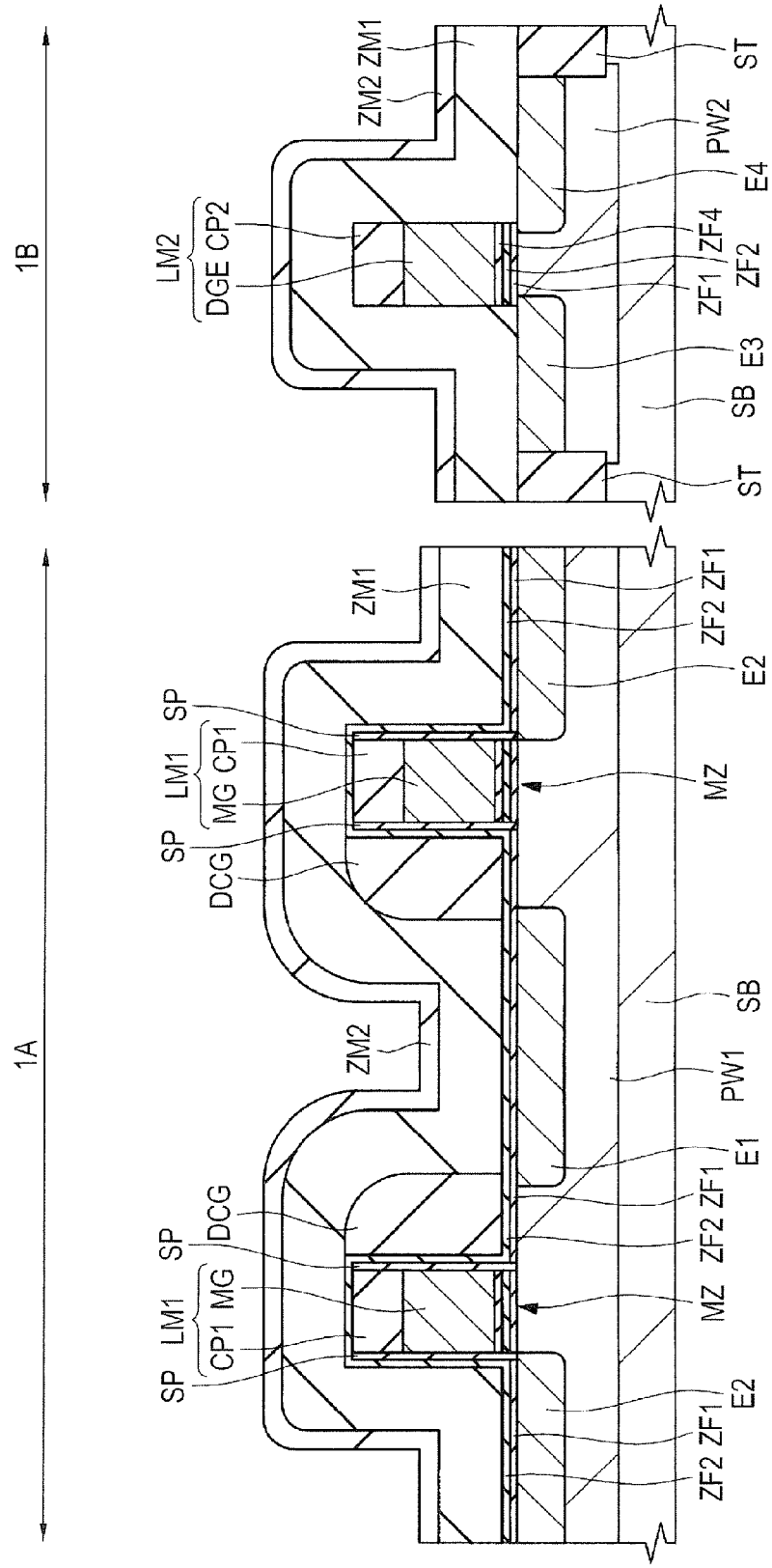
FIG. 19 is a main-portion cross-sectional view of the semiconductor device during the manufacturing process thereof, which is subsequent to FIG. 17.
Figure 20:
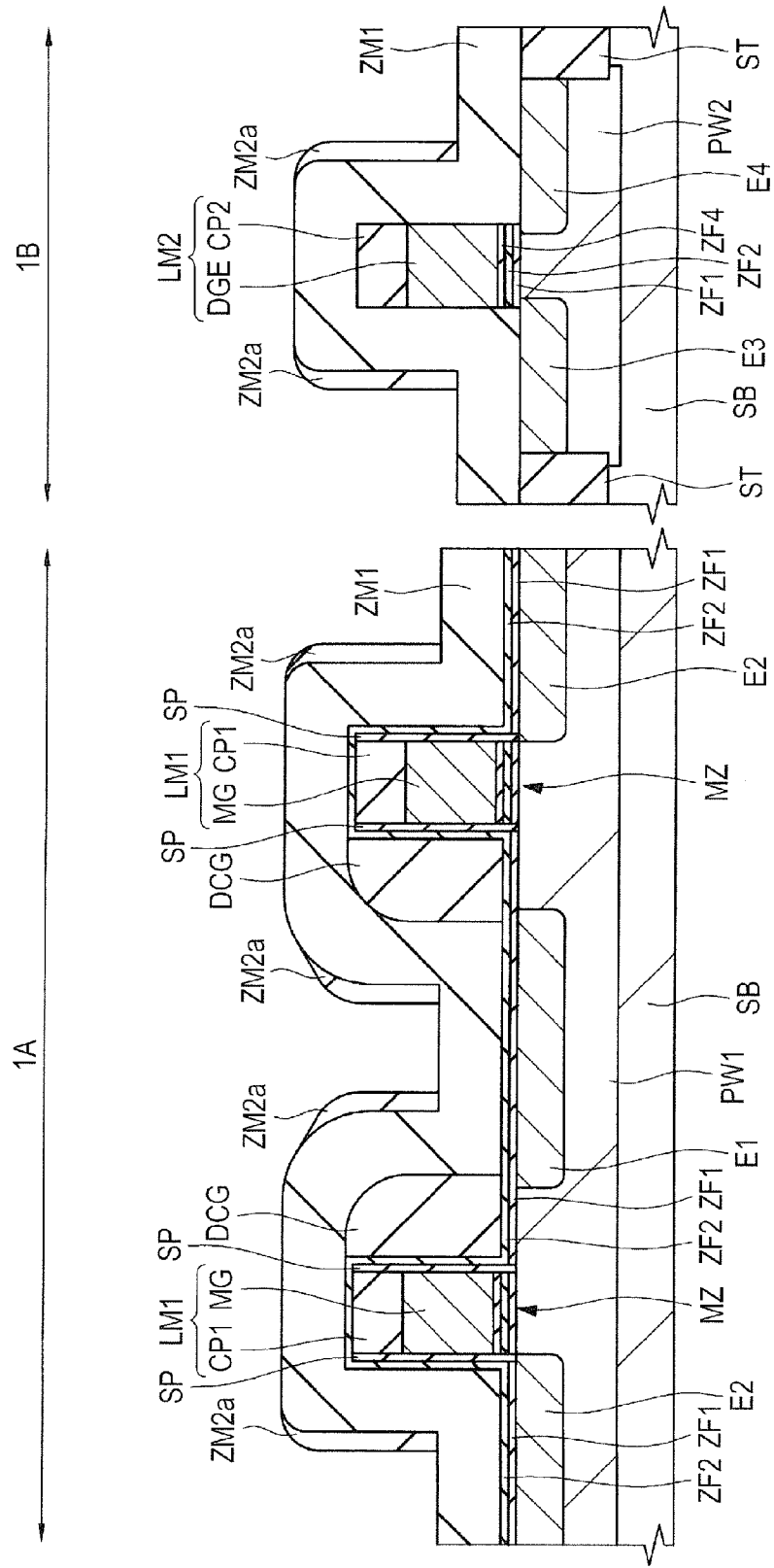
FIG. 20 is a main-portion cross-sectional view of the semiconductor device during the manufacturing process thereof, which is subsequent to FIG. 19.

That is, as shown in FIG. 19, over the main surface of the semiconductor substrate SB, an insulating film ZM1 is formed using a CVD method or the like so as to cover the multi-layer bodies LM1, the dummy control gate electrodes DCG, and the multi-layer body LM2. Then, over the insulating film ZM1, an insulating film ZM2 is formed using a CVD method or the like. The insulating films ZM1 and ZM2 are made of different materials. The insulating film ZM1 is preferably made of a silicon nitride film. The insulating film ZM2 is preferably made of a silicon dioxide film. Then, the insulating film ZM2 is etched back using an anisotropic etching technique to form side-wall insulating films ZM2a over the side surfaces of the insulating film ZM1, as shown in FIG. 20. The side-wall insulating films ZM2a are made of the insulating film ZM2 remaining in sidewall spacer shapes over the side surfaces of the insulating film ZM1. At this time, the insulating film ZM2 is etched back under conditions in which the insulating film ZM1 is less likely to be etched than the insulating film ZM2. Accordingly, even after the end of the etch-back process, the insulating film ZM1 remains in a laminar shape. The side surfaces of the insulating film ZM1 over which the side-wall insulating films ZM2a are formed are the side surfaces among the surfaces of the insulating film ZM1 which correspond to the respective side surfaces of the multi-layer bodies LM1, the dummy control gate electrodes DCG, and the multi-layer body LM2.

Figure 21:
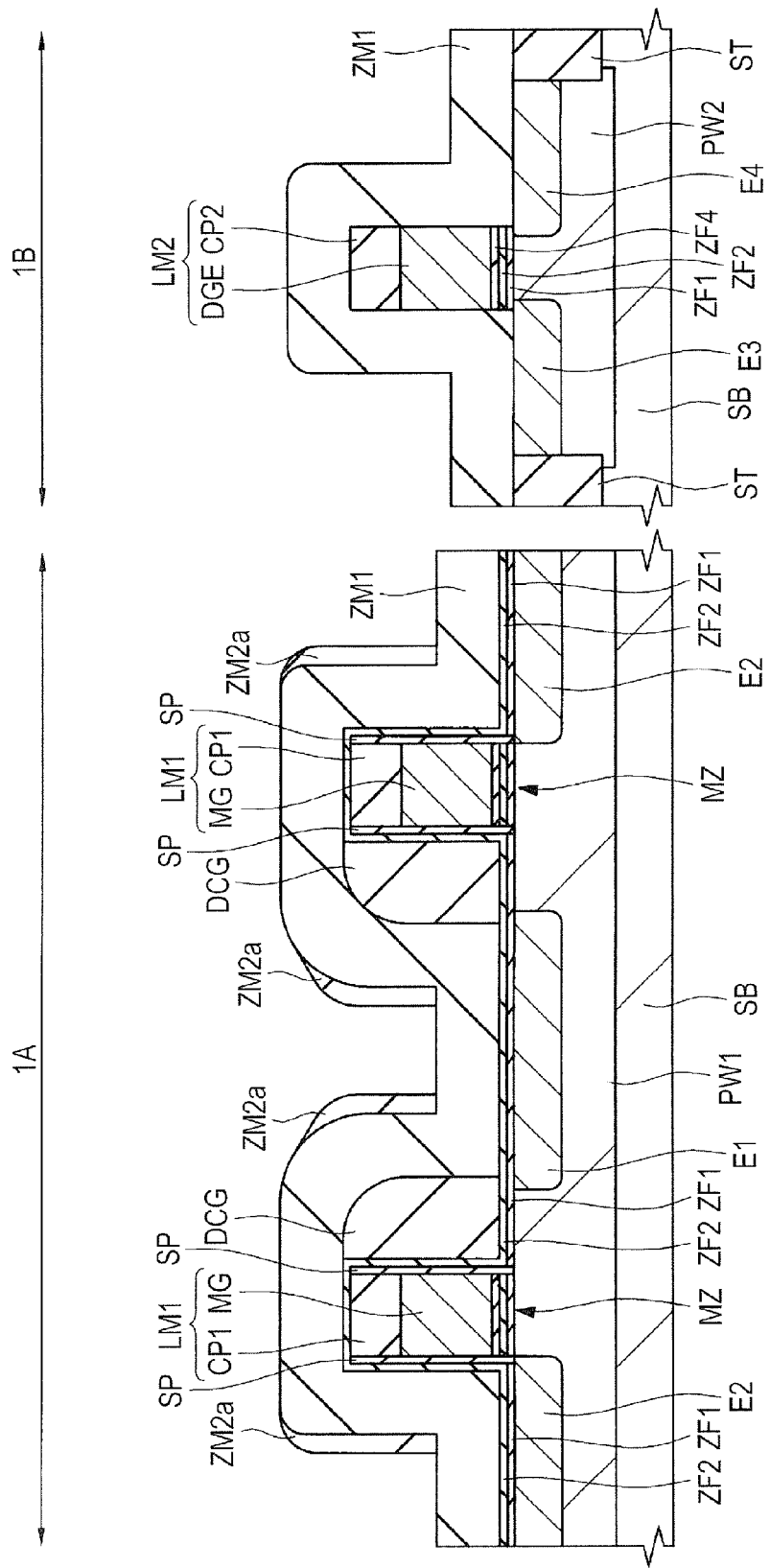
FIG. 21 is a main-portion cross-sectional view of the semiconductor device during the manufacturing process thereof, which is subsequent to FIG. 20.

Subsequently, a photoresist pattern (not shown) which covers the memory cell region 1A and exposes the peripheral circuit region 1B is formed. Then, the side-wall insulating films ZM2a in the peripheral circuit region 1B are etched to be removed. At this time, the memory cell region 1A is covered with the photoresist pattern so that the side-wall insulating films ZM2 in the memory cell region 1A are not etched and remain. Subsequently, the photoresist pattern is removed. FIG. 21 shows this process stage.

Then, the insulating film ZM1 and the sidewall-insulating films ZM2a are etched back. As the etch-back process, anisotropic etching is performed, but etching conditions are adjusted so as to cause not only the anisotropic etching, but also side etching (isotropic etching). The etch-back process is also performed under conditions in which both of the side-wall insulating films ZM2a and the insulating film ZM1 are etched. When the etch-back process is performed, as shown in FIG. 18 described above, the insulating film ZM1 remaining over the respective side surfaces of the multi-layer bodies LM1, the dummy control gate electrodes DCG, and the dummy gate electrode DGE form the sidewall spacers SW1, SW2, and SW3.

In the etch-back process performed after the structure shown in FIG. 21 is obtained, not only anisotropic etching, but also side etching may be performed. In the peripheral circuit region 1B, the insulating film MZ1 over the side surfaces of the multi-layer body LM2 may also be side-etched and the width W3 of the sidewall spacer SW3 may rather be smaller than the thickness of the insulating film ZM1 when the insulating film ZM1 is deposited. On the other hand, in the memory cell region 1A, the insulating film ZM1 is protected from being side-etched until the side-wall insulating films ZM2a are removed. Accordingly, the respective widths W1 and W2 of the sidewall spacers SW1 and SW2 have values close to the thickness of the insulating film ZM1 when the insulating film ZM1 is deposited. This allows the width W1 of the sidewall spacer SW1 and the width W2 of the sidewall spacer SW2 in the memory cell region 1A to be larger than the width W3 of the sidewall spacer SW3 in the peripheral circuit region 1B (i.e., W1>W3 and W2>W3 are satisfied).

Note that, when the insulating film ZM1 is etched back using an anisotropic etching technique without forming the insulating film ZM2, the width W1 of the sidewall spacer SW1, the width W2 of the sidewall spacer SW2, and the width W3 of the sidewall spacer SW3 can be set substantially equal (i.e., W1=W2=W3 is satisfied).

There may also be a case where a high-breakdown-voltage MISFET having the sidewall spacers SW3 each having a large width (W3) and a low-breakdown-voltage MISFET having the sidewall spacers SW3 each having a smaller width (W3) are placed in mixed relation in the peripheral circuit region 1B. In such a case, the respective widths (W1 and W2) of the sidewall spacers SW1 and SW2 in the memory cell region 1A can also be set equal to the width (W3) of the sidewall spacer SW3 used for the high-breakdown-voltage MISFET in the peripheral circuit region 1B.

In this manner, the sidewall spacers SW1, SW2, and SW3 can be formed.

Figure 22:
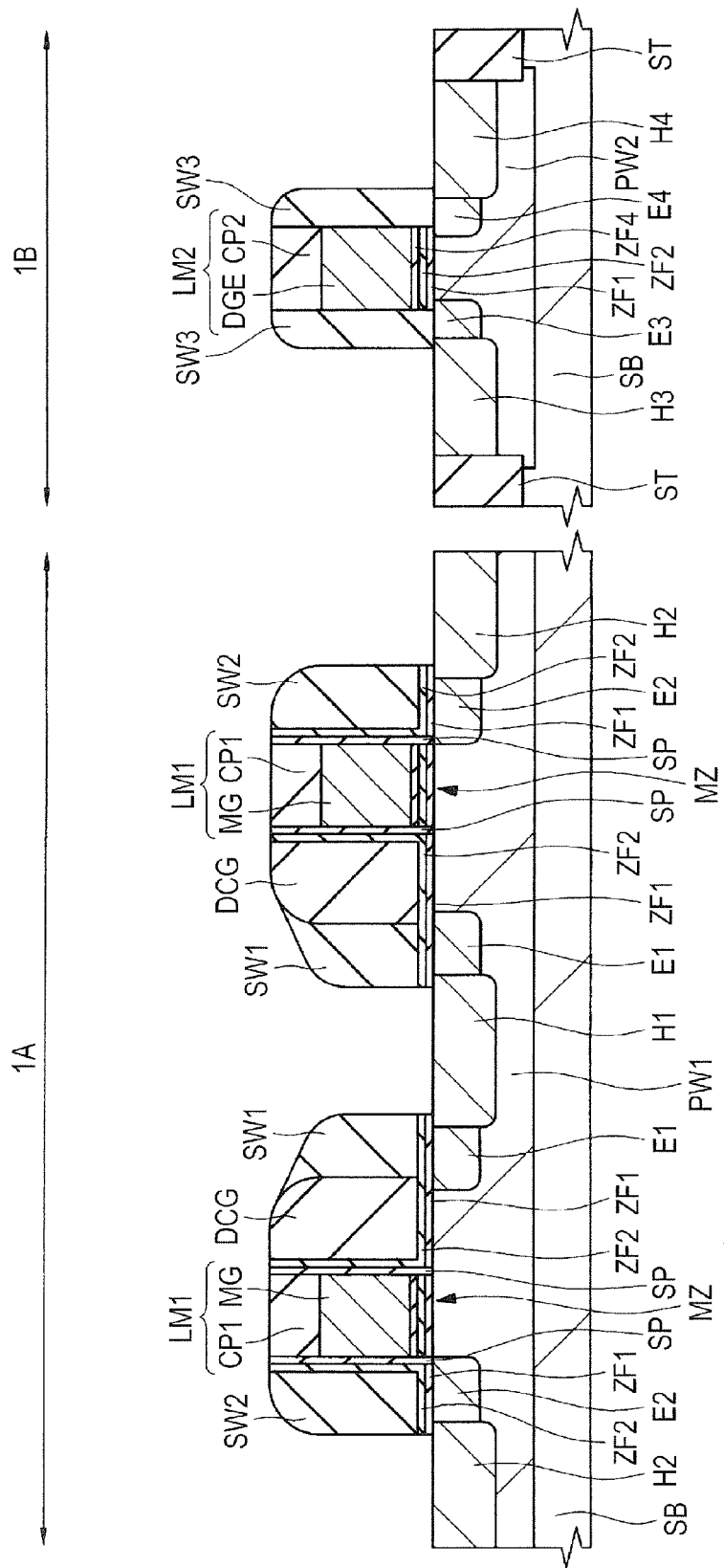
FIG. 22 is a main-portion cross-sectional view of the semiconductor device during the manufacturing process thereof, which is subsequent to FIG. 18.

Next, as shown in FIG. 22, the $n^+$-type semiconductor regions (source/drain regions) H1, H2, H3, and H4 are formed using an ion implantation method.

Specifically, an n-type impurity such as, e.g., arsenic (As) or phosphorus (P) is ion-implanted into the semiconductor substrate SB (p-type wells PW1 and PW2) using the dummy control gate electrodes DCG, the multi-layer bodies LM1 and LM2, and the sidewall spacers SW1, SW2, and SW3 over the respective side surfaces thereof as a mask (ion implantation inhibiting mask). Thus, the $n^+$-type semiconductor regions H1, H2, H3, and H4 can be formed. At this time, in the memory cell region 1A, the dummy control gate electrodes DCG and the sidewall spacers SW1 over the side surfaces thereof function as a mask to allow the $n^+$-type semiconductor region H1 to be formed by self-alignment with the sidewall spacers SW1 over the side surfaces of the dummy control gate electrodes DCG. Also, in the memory cell region 1A, the multi-layer bodies LM1 and the sidewall spacers SW2 over the side surfaces thereof function as a mask to allow the $n^+$-type semiconductor regions H2 to be formed by self-alignment with the sidewall spacers SW2 over the side surfaces of the multi-layer bodies LM1. On the other hand, in the peripheral circuit region 1B, the multi-layer body LM2 and the sidewall spacers SW3 function as a mask to allow the $n^+$-type semiconductor region H3 to be formed by self-alignment with the sidewall spacer SW3 over the drain-side side surface of the multi-layer body LM2 and also allow the $n^+$-type semiconductor region H4 to be formed by self-alignment with the sidewall spacer SW3 over the source-side side surface of the multi-layer body LM2. In this manner, LDD (Lightly doped Drain) structures are formed. The $n^+$-type semiconductor regions H1, H2, H3, and H4 can be formed in the same ion implantation step, but can also be formed in different ion implantation steps.

Thus, the $n^-$-type semiconductor region E1 and the $n^+$-type semiconductor region H1 form an n-type semiconductor region (corresponding to a semiconductor region MD described later) functioning as the drain region of the control transistor. The $n^-$-type semiconductor regions E2 and the $n^+$-type semiconductor regions H2 form n-type semiconductor regions (corresponding to semiconductor regions MS described later) functioning as the source regions of the memory transistors. The $n^+$-type semiconductor region H1 has an impurity concentration higher than that of the $n^-$-type semiconductor region E1 and a junction depth deeper than that thereof. The $n^+$-type semiconductor regions H2 have impurity concentrations higher than those of the $n^-$-type semiconductor regions E2 and junction depths deeper than those thereof. The $n^-$-type semiconductor region E3 and the $n^+$-type semiconductor region H3 form an n-type semiconductor region functioning as the drain region of the MISFET for the peripheral circuit. The $n^-$-type semiconductor region E4 and the $n^+$-type semiconductor region H4 form an n-type semiconductor region functioning as the source region of the MISFET for the peripheral circuit. The n$^+$-type semiconductor region H3 has an impurity concentration higher than that of the n$^-$-type semiconductor region E3 and a junction depth deeper than that thereof. The n$^+$-type semiconductor region H4 has an impurity concentration higher than that of the n$^-$-type semiconductor region E4 and a junction depth deeper than that thereof.

Next, activation anneal as heat treatment for activating the impurities introduced into the n$^-$-type semiconductor regions E1, E2, E3, and E4, the n$^+$-type semiconductor regions H1, H2, H3, and H4, and the like is performed.

Thus, in the memory cell region 1A, the memory gate electrodes MG and the source/drain regions of the memory cells in the nonvolatile memory are formed while, in the peripheral circuit region 1B, the source/drain regions of the MISFET are formed. However, in the memory cell region 1A, the control gate electrodes CG to be finally used are not formed yet. Also, in the peripheral circuit region 1B, the gate electrode GE to be finally used is not formed yet.

Figure 23:
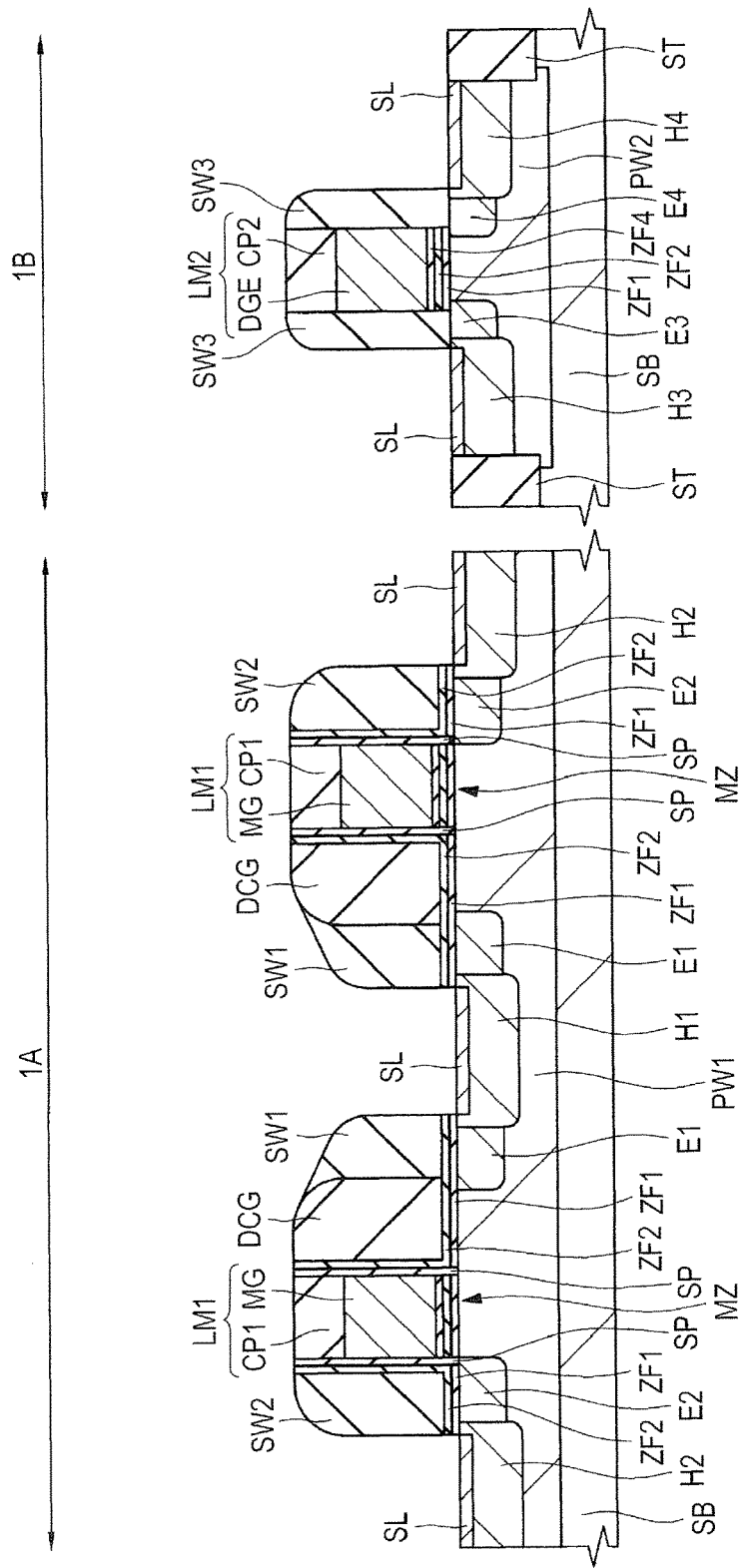
FIG. 23 is a main-portion cross-sectional view of the semiconductor device during the manufacturing process thereof, which is subsequent to FIG. 22.

Next, as shown in FIG. 23, over the respective upper surfaces of the n$^+$-type semiconductor regions H1, H2, H3, and H4, the metal silicide layers SL are formed using a salicide (Self Aligned Silicide) technique.

Specifically, the metal silicide layers SL can be formed as follows. That is, over the main surface of the semiconductor substrate SB, a metal film for forming the metal silicide layers SL is formed so as to cover the multi-layer bodies LM1 and LM2, the dummy control gate electrodes DCG, and the sidewall spacers SW1, SW2, and SW3. The metal film is made of, e.g., a cobalt (Co) film, a nickel (Ni) film, a nickel-platinum alloy film, or the like. Then, heat treatment is performed on the semiconductor substrate SB to cause the respective upper portions of the n$^+$-type semiconductor regions H1, H2, H3, and H4 to react with the foregoing metal film. Thus, as shown in FIG. 23, in the respective upper portions (surface layer portions) of the n$^+$-type semiconductor regions H1, H2, H3, and H4 and the memory gate electrodes MG, the metal silicide layers SL are formed. Subsequently, the unreacted metal film is removed. FIG. 23 shows a cross-sectional view of this process stage. After the unreacted metal film is removed, heat treatment can also be further performed. When the foregoing metal film for forming the metal silicide layers SL is a cobalt film, the metal silicide layers SL are made of a cobalt silicide layer. When the foregoing metal film is a nickel film, the metal silicide layers SL are made of a nickel silicide layer. When the foregoing metal film is a nickel-platinum alloy film, the metal silicide layers SL are made of a platinum-added nickel silicide layer.

Note that the upper surfaces of the memory gate electrodes MG are covered with the cap insulating films CP1 and the side surfaces of the memory gate electrodes MG are covered with the side-wall insulating films SP and the like. Accordingly, the memory gate electrodes MG do not come in contact with the metal film for forming the metal silicide layers SL so that the metal silicide layers SL are not formed in the top surfaces of the metal gate electrodes MG. Also, the upper surface of the dummy gate electrode DGE is covered with the cap insulating film CP1 and the side surfaces of the dummy gate electrode DGE are covered with the sidewall spacers SW3. Accordingly, the dummy gate electrode DGE does not come in contact with the metal film for forming the metal silicide layers SL so that the metal silicide layer SL is not formed in the top surface of the dummy gate electrode DGE. When the dummy control gate electrodes DCG are formed of an insulating film (preferably, a silicon dioxide film), the metal silicide layers SL are not formed in the top surfaces of the dummy control gate electrodes DCG.

By thus performing a so-called salicide process, it is possible to form the metal silicide layers SL in the respective upper portions of the n$^+$-type semiconductor regions H1, H2, H3, and H4 by self-alignment and reduce the resistances of the source/drain regions.

Figure 24:
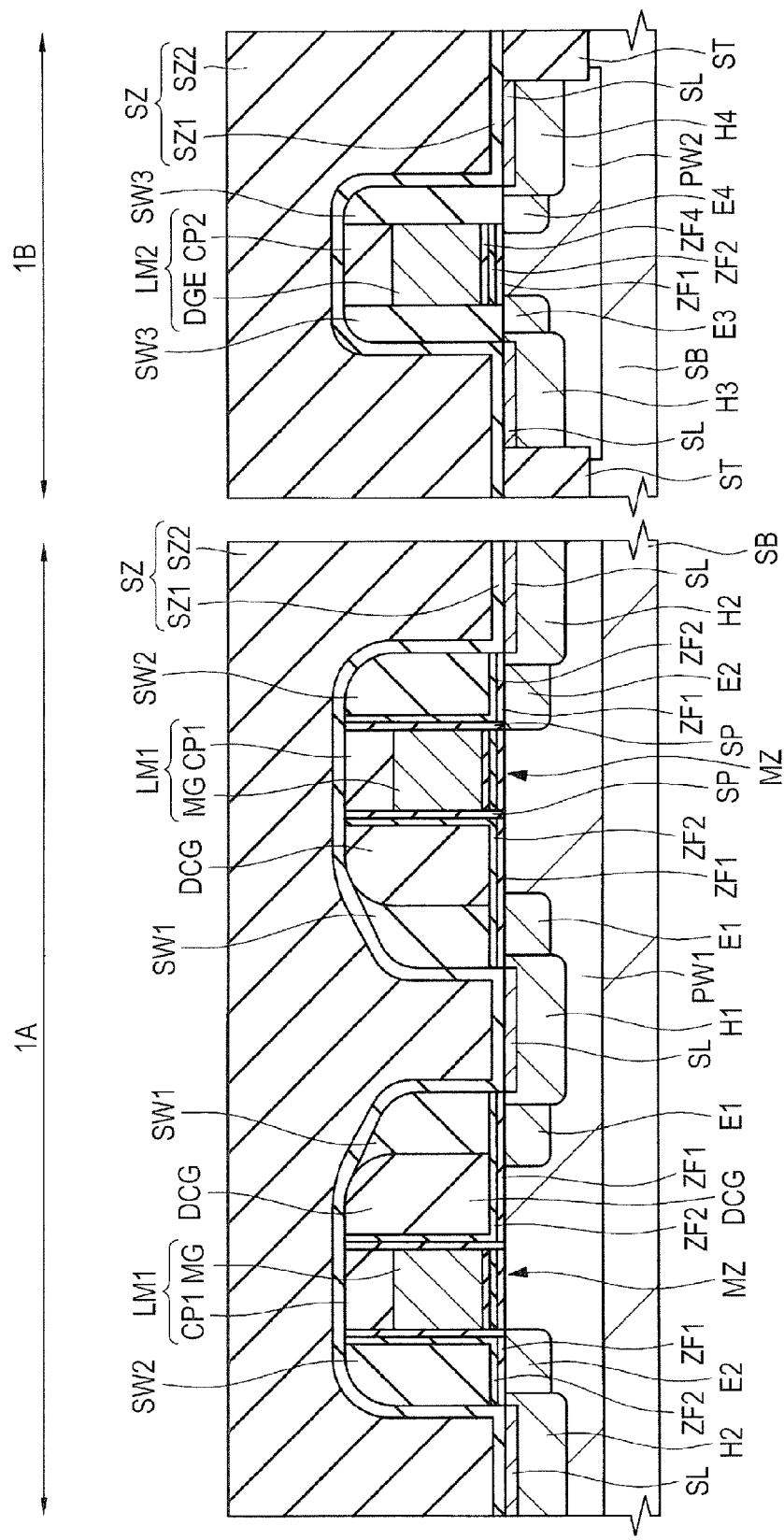
FIG. 24 is a main-portion cross-sectional view of the semiconductor device during the manufacturing process thereof, which is subsequent to FIG. 23.

Next, as shown in FIG. 24, over the main surface of the semiconductor substrate SB, an insulating film SZ is formed (deposited) as an interlayer insulating film so as to cover the multi-layer bodies LM1 (memory gate electrodes MG), the dummy control gate electrodes DCG, the multi-layer body LM2 (dummy gate electrode DGE), and the sidewall spacers SW1, SW2, and SW3.

As the insulating film SZ, a single-layer insulating film or a multi-layer insulating film can be used. The multi-layer insulating film mentioned herein corresponds to an insulating film including a plurality of stacked insulating films. As the insulating film SZ, a multi-layer film including an insulating film SZ1 and an insulating film SZ2 formed over the insulating film SZ1 and made of a material different from that of the insulating film SZ1 can be used appropriately. FIG. 24 shows this case. That is, in the case shown in FIG. 24, over the main surface of the semiconductor substrate SB, the insulating film SZ1 is formed so as to cover the multi-layer bodies LM1 and LM2, the dummy control gate electrodes DCG, and the sidewall spacers SW1, SW2, and SW3. Then, over the insulating film SZ1, the insulating film SZ2 is formed.

The insulating films SZ1 and SZ2 are made of different materials. The insulating film SZ1 is preferably made of a silicon nitride film. The insulating film SZ2 is preferably made of a silicon dioxide film. The insulating film SZ1 can function as an etching stopper in the step of etching the insulating film SZ1 when contact holes CT described later are formed.

The insulating film SZ2 is preferably made of a silicon dioxide film. As the insulating film SZ2, e.g., an O$_3$-TEOS oxide film or a plasma TEOS oxide film can be used appropriately. The O$_3$-TEOS oxide film mentioned herein corresponds to a silicon dioxide film deposited by a thermal CVD method using an O$_3$ (ozone) gas and a TEOS gas as raw material gases. The plasma TEOS oxide film mentioned herein corresponds to a silicon dioxide film deposited by a plasma CVD method using a TEOS gas as a raw material gas.

The thickness of the insulating film SZ2 is larger than the thickness of the insulating film SZ1. The insulating film SZ1 can be formed to a thickness of, e.g., about 10 to 40 nm. The insulating film SZ2 can be formed to a thickness of, e.g., about 50 to 150 nm. Each of the insulating films SZ1 and SZ2 can be formed by a CVD method.

Next, the upper surface of the insulating film SZ, i.e., the upper surface of the insulating film SZ2 is polished using a CMP (Chemical Mechanical Polishing) method or the like. This polishing step will be hereinafter referred to as the "polishing step shown in FIG. 25". By the polishing step shown in FIG. 25, as shown in FIG. 25, the respective upper surfaces of the memory gate electrodes MG, the dummy control gate electrodes DCG, and the dummy gate electrode DGE are exposed.

Figure 25:
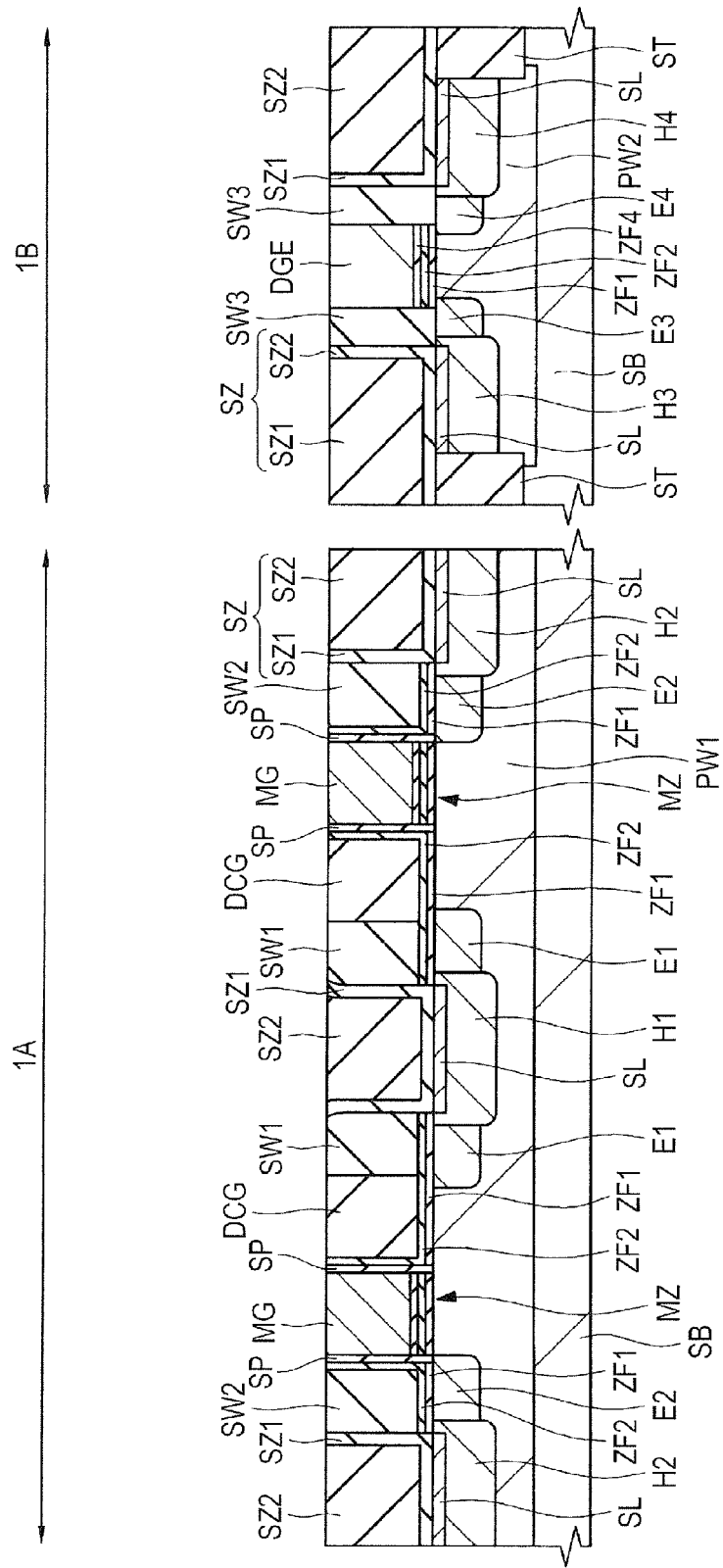
FIG. 25 is a main-portion cross-sectional view of the semiconductor device during the manufacturing process thereof, which is subsequent to FIG. 24.

In the polishing step shown in FIG. 25, the insulating film SZ (i.e., insulating films SZ2 and SZ1) is polished until the respective upper surfaces of the memory gate electrodes MG, the dummy control gate electrodes DCG, and the dummy gate electrode DGE are exposed. Accordingly, in the polishing step shown in FIG. 25, the cap insulating films CP1 and CP2 are also polished to be removed, while the respective upper portions of the sidewall spacers SW1, SW2, and SW3 may also be polished.

Note that, in the polishing step shown in FIG. 25, a polishing process is performed until the respective upper surfaces of the memory gate electrodes MG, the dummy control gate electrodes DCG, and the dummy gate electrode DGE are exposed. However, there may also be a case where respective portions (upper portions) of the memory gate electrodes MG, the dummy control gate electrodes DCG, and the dummy gate electrode DGE are polished by the polishing step shown in FIG. 25 to be removed. In such a case also, the respective other portions (other than the upper portions) of the memory gate electrodes MG, the dummy control gate electrodes DCG, and the dummy gate electrode DGE remain. In either case, when the polishing step shown in FIG. 25 is performed, the respective top surfaces (upper surfaces) of the memory gate electrodes MG, the dummy control gate electrodes DCG, and the dummy gate electrode DGE are exposed from the insulating film SZ. The respective top surfaces (upper surfaces) of the sidewall spacers SW1, SW2, and SW3 are also exposed.

In the polishing step shown in FIG. 25, the metal silicide layers (SL) need not be polished so that the polishing step is more easily performed. That is, in the case where any one or more of the memory gate electrodes MG, the dummy gate electrode DGE, and the dummy control gate electrodes DCG have the metal silicide layers SL formed in the upper surfaces thereof unlike in the present embodiment, the metal silicide layers SL also need to be polished in the polishing step shown in FIG. 25. This may cause the problem of scratch. By contrast, in the present embodiment, the cap insulating films CP1 and CP2 prevent the metal silicide layers SL from being formed in the respective upper portions of the memory gate electrodes MG and the dummy gate electrode DGE. In addition, the dummy control gate electrodes DCG are formed of an insulator to prevent the metal silicide layers SL from being formed in the upper portions of the dummy control gate electrodes DCG. This eliminates the need to polish the metal silicide layers SL in the polishing step shown in FIG. 25 and can thus eliminate the possibility of scratch resulting from the polishing of the metal silicide layers SL.

Figure 26:
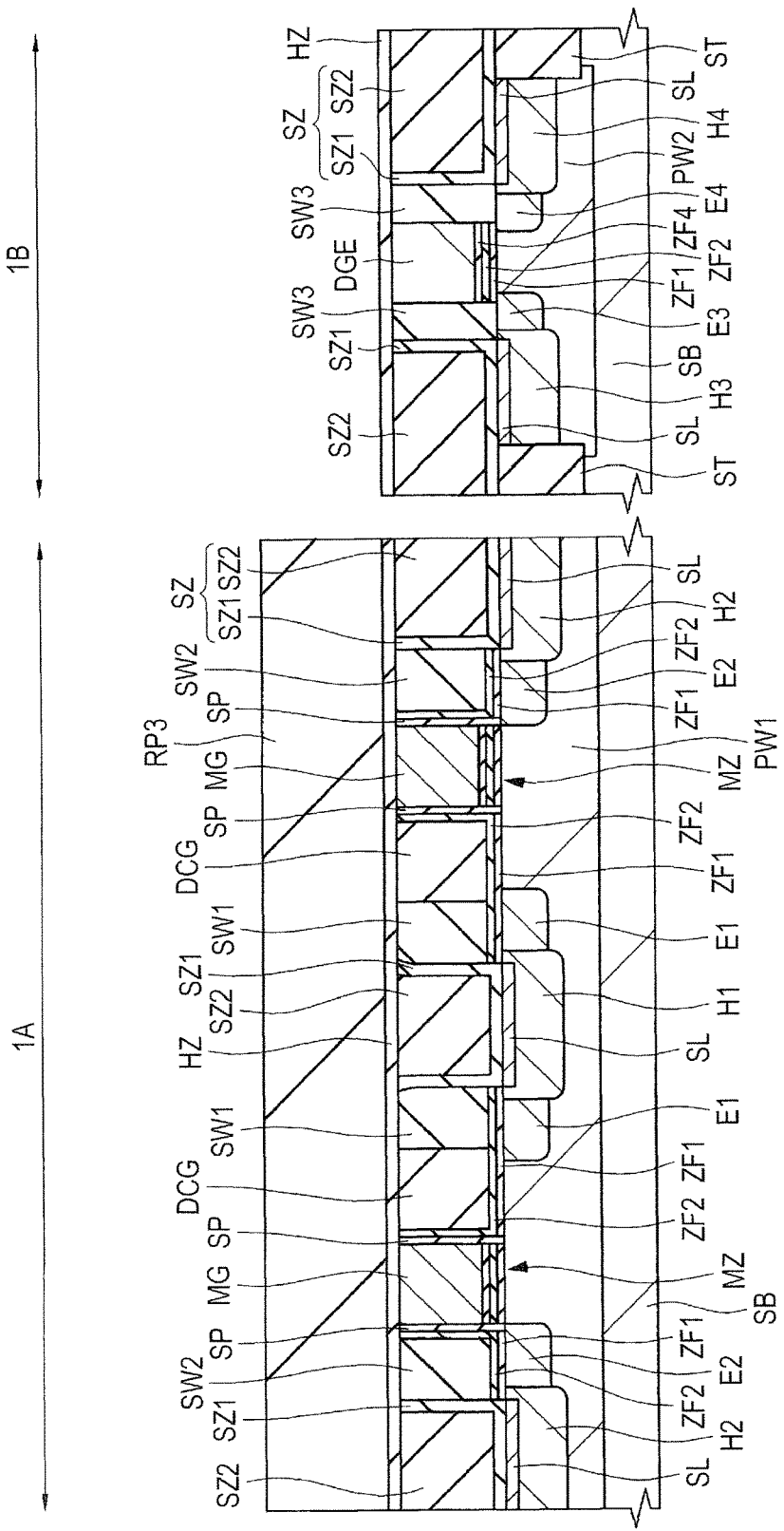
FIG. 26 is a main-portion cross-sectional view of the semiconductor device during the manufacturing process thereof, which is subsequent to FIG. 25.

Next, as shown in FIG. 26, over the main surface of the semiconductor substrate SB, i.e., over the insulating films SZ in the memory cell region 1A and the peripheral circuit region 1B, a protective insulating film HZ is formed so as to cover the memory gate electrodes MGE, the dummy control gate electrodes DCG, the dummy gate electrode DGE, and the sidewall spacers SW1, SW2, and SW3.

The insulating film HZ is preferably made of a silicon dioxide film and can be formed using a CVD method or the like. For example, a plasma TEOS oxide film can be used appropriately as the insulating film HZ. The insulating film HZ can be formed to a thickness of, e.g., about 5 to 10 nm.

Next, as shown in FIG. 26, over the insulating film HZ, a photoresist pattern RP3 is formed using a photolithographic method. The photoresist pattern RP3 exposes the peripheral circuit region 1B and covers the memory cell region 1A.

Figure 27:
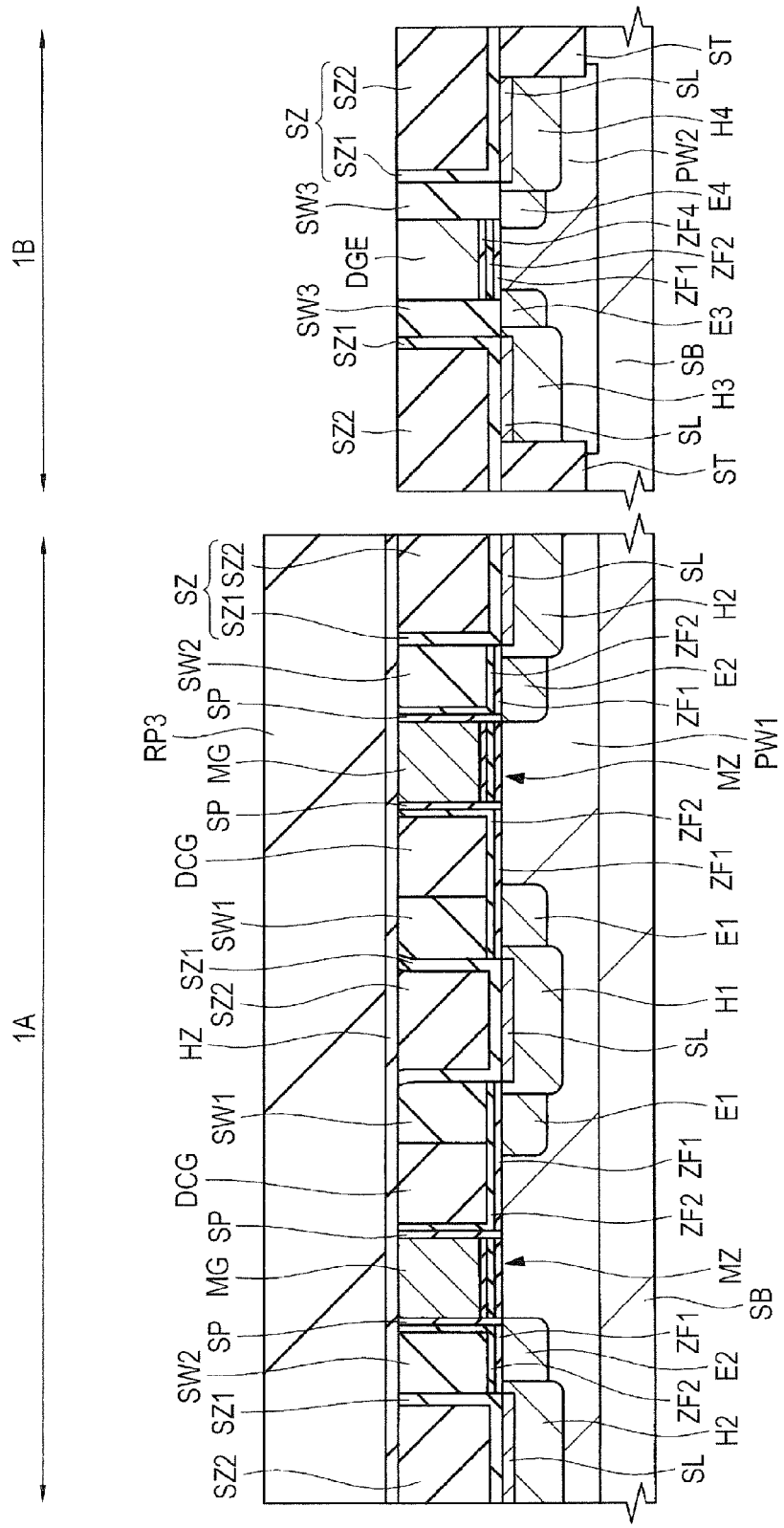
FIG. 27 is a main-portion cross-sectional view of the semiconductor device during the manufacturing process thereof, which is subsequent to FIG. 26.

Next, as shown in FIG. 27, the insulating film HZ is etched using the photoresist pattern RP3 as an etching mask to be removed from the peripheral circuit region 1B. At this time, the insulating film HZ in the memory cell region 1A which is covered with the photoresist pattern RP3 is not etched and remains. This provides the state where, over the insulating film SZ, the insulating film HZ covering the memory cell region 1A and exposing the peripheral circuit region 1B is formed. Consequently, at this process stage, in the memory cell region 1A, the memory gate electrodes MG and the dummy control gate electrodes DCG are covered with the insulating film HZ and are not exposed. On the other hand, in the peripheral circuit region 1B, the upper surface of the dummy gate electrode DGE is uncovered with the insulating film HZ and exposed.

Figure 28:
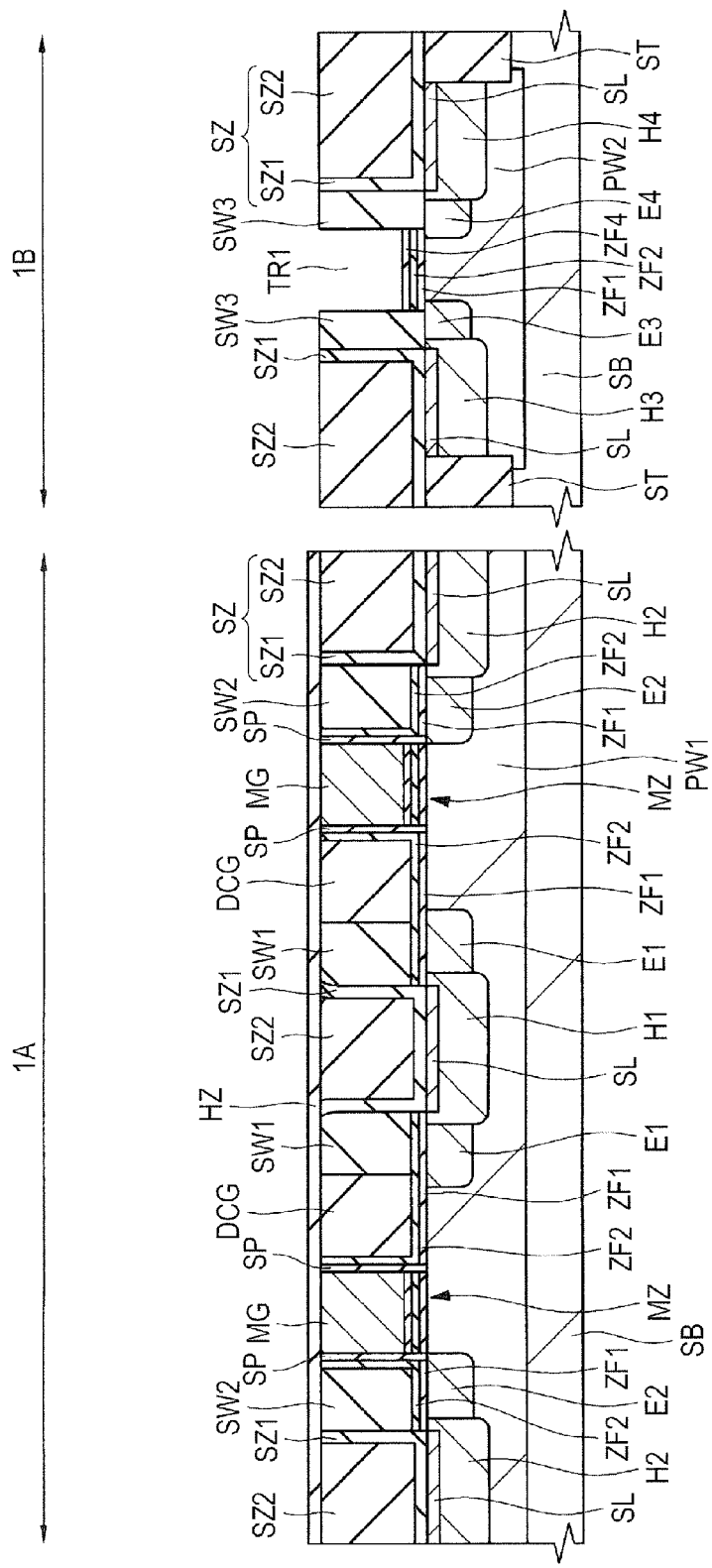
FIG. 28 is a main-portion cross-sectional view of the semiconductor device during the manufacturing process thereof, which is subsequent to FIG. 27.

Next, the photoresist pattern RP3 is removed and then, as shown in FIG. 28, the dummy gate electrode DGE is etched to be removed. This step will be hereinafter referred to as the "etching step shown in FIG. 28".

In the etching step shown in FIG. 28, the etching is preferably performed under conditions in which the insulating films HZ and SZ (SZ1 and SZ2), the sidewall spacers SW3, and the insulating films ZF1, ZF2, and ZF4 are less likely to be etched than the dummy gate electrode DGE. This allows the dummy gate electrode DGE to be selectively etched in the etching step shown in FIG. 28. When the dummy gate electrode DGE is formed of silicon (the foregoing silicon film PS2), in the etching step shown in FIG. 28, a high etching selectivity is more easily ensured to the dummy gate electrode DGE. Therefore, the dummy gate electrode DGE is preferably formed of silicon. The etching step shown in FIG. 28 is performed in the state where the upper surface of the dummy gate electrode DGE is exposed, while the memory gate electrodes MG and the dummy control gate electrodes DCG are not exposed. As a result, the dummy gate electrode DGE is selectively etched to be removed, while the memory gate electrodes MG and the dummy control gate electrodes DCG are not etched and remain.

As a result of the removal of the dummy gate electrode DGE in the etching step shown in FIG. 28, a trench (depressed portion or recessed portion) TR1 is formed. The trench TR1 corresponds to the region from which the dummy gate electrode DGE is removed and in which the dummy gate electrode DGE has been present until the dummy gate electrode DGE is removed. The bottom surface of the trench TR1 is formed of the upper surface of the insulating film ZF4, while the side surfaces of the trench TR1 are formed of the sidewall spacers SW3.

Figure 29:
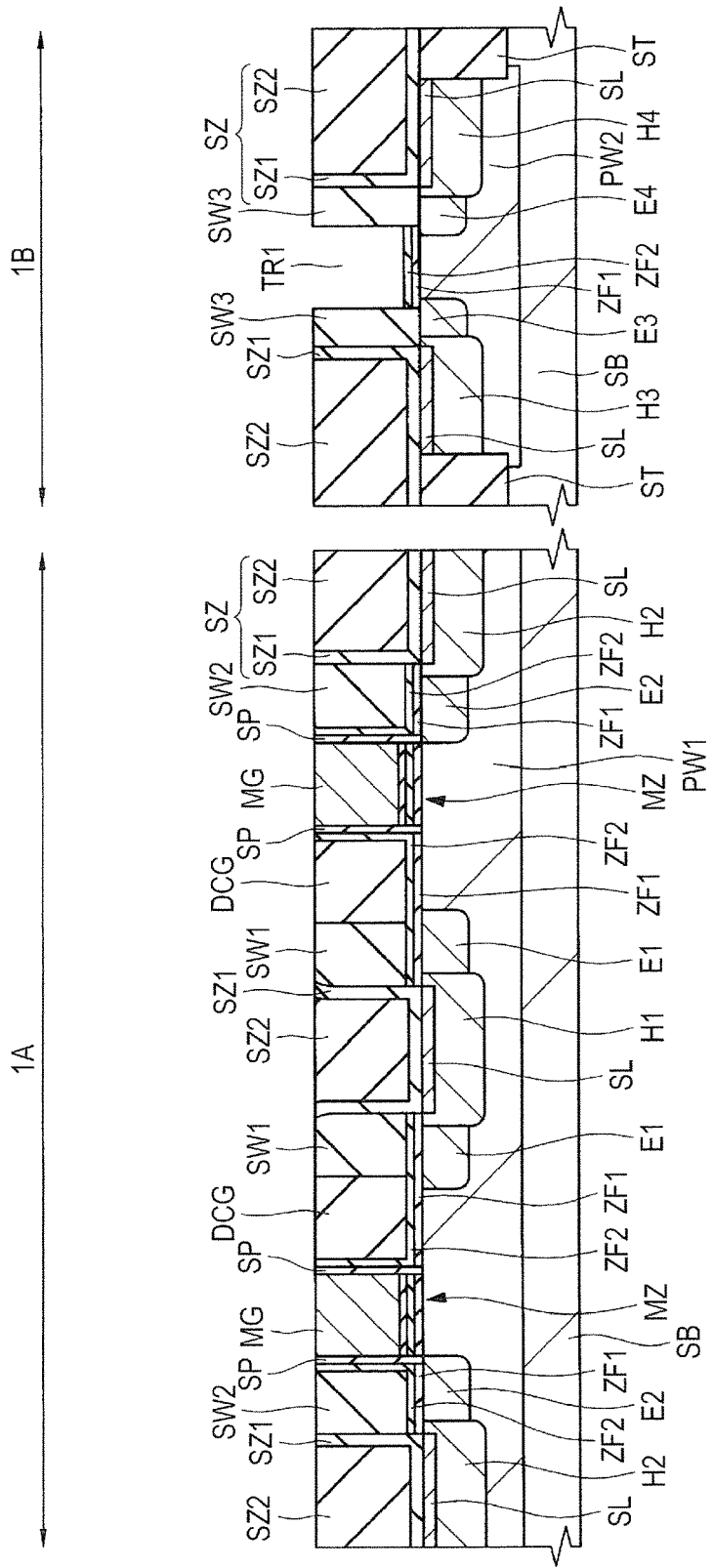
FIG. 29 is a main-portion cross-sectional view of the semiconductor device during the manufacturing process thereof, which is subsequent to FIG. 28.

Next, as shown in FIG. 29, the insulating film HZ (silicon dioxide film) in the memory cell region 1A is etched to be removed. As a result, in the memory cell region 1A, the respective upper surfaces of the memory gate electrodes MG and the dummy control gate electrodes DCG are exposed. By the etching, the insulating film ZF4 (silicon dioxide film) exposed at the bottom portion of the trench TR1 may also be removed.

Note that, in the case described heretofore, the insulating film HZ is formed in each of the memory cell region 1A and the peripheral circuit region 1B and then removed from the peripheral circuit region 1B. Subsequently, the photoresist pattern RP3 is removed and then the dummy gate electrode DGE is removed to form the trench TR1, followed by the removal of the insulating film HZ from the memory cell region 1A. In another form, there may also be a case where, after the foregoing photoresist pattern RP3 is formed over the insulating film SZ to cover the memory cell region 1A without forming the insulating film HZ, the dummy gate electrode DGE is removed to form the trench TR1, followed by the removal of the foregoing photoresist pattern RP3. In either case, in the peripheral circuit region 1B, the dummy gate electrode DGE is removed to form the trench TR1 while, in the memory cell region 1A, the memory gate electrodes MG and the dummy control gate electrode DCG remain, but the respective upper surfaces of the memory gate electrodes MG and the dummy control gate electrodes DCG are exposed.

Figure 30:
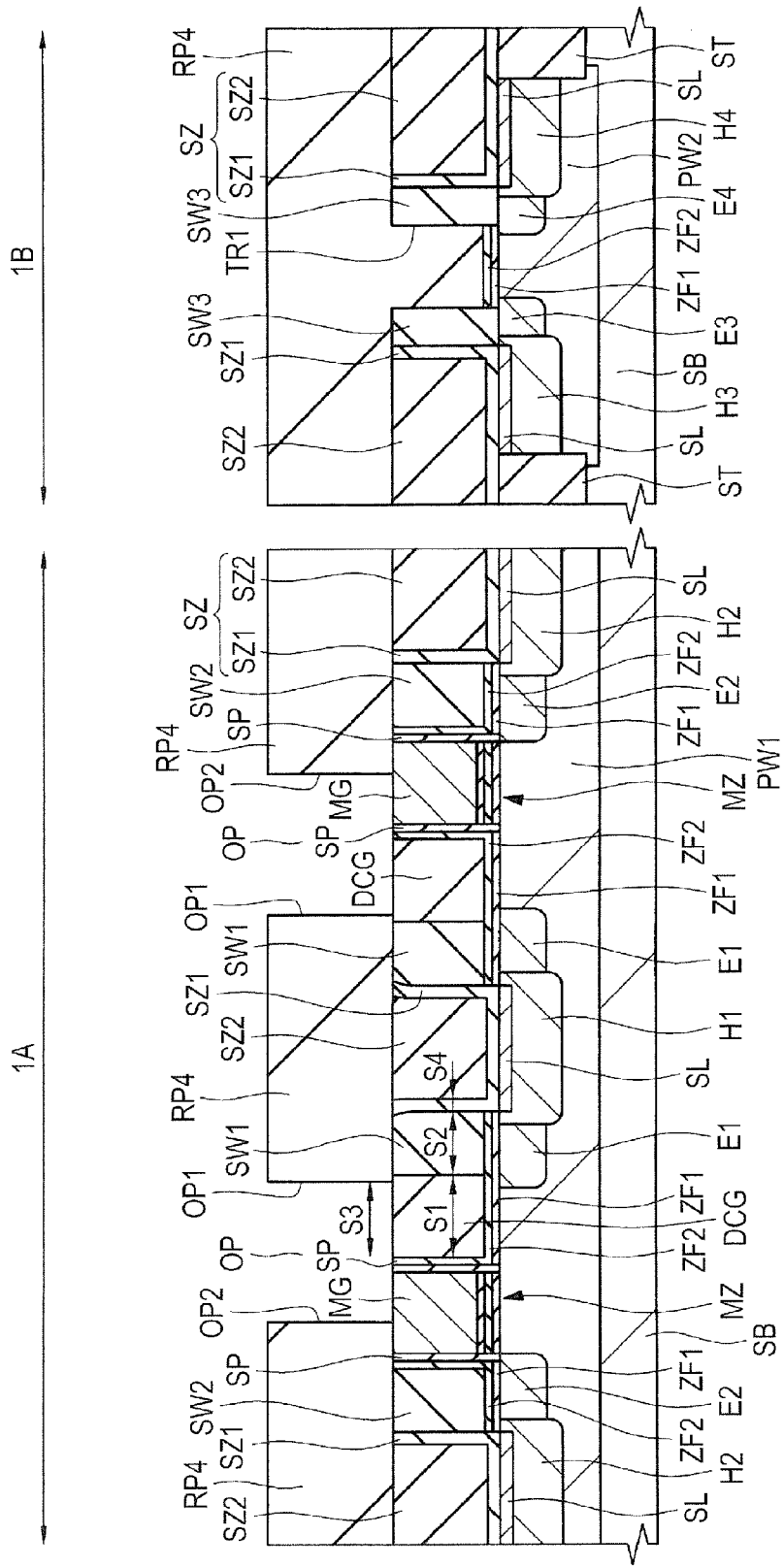
FIG. 30 is a main-portion cross-sectional view of the semiconductor device during the manufacturing process thereof, which is subsequent to FIG. 29.

Next, as shown in FIG. 30, over the insulating film SZ, a photoresist pattern (resist pattern) RP4 as a mask layer is formed using a photolithographic method.

The photoresist pattern RR4 is formed in the memory cell region 1A and in the entire peripheral circuit region 1B. Accordingly, when the photoresist pattern RP4 is formed, the trench TR1 is filled with the photoresist pattern RP4. In the peripheral circuit region 1B, the insulating film SZ, the sidewall spacers SW3, and the insulating film ZF2 are covered with the photoresist pattern RP4 and are not exposed.

The photoresist pattern RP4 is formed also in the memory cell region 1A. However, the photoresist pattern RP4 has openings OP in the memory cell region 1A. From each of the openings OP of the photoresist pattern RP4, at least a portion of the upper surface of the memory gate electrode MG and at least a portion of the upper surface of the dummy control gate electrode DCG are exposed. In the memory cell region 1A, the insulating films SZ (particularly the insulating films SZ2) are covered with the photoresist pattern RP4 and are not exposed. The sidewall spacers SW1 may be or may not be exposed from the openings OP of the photoresist pattern RP4. The sidewall spacers SW2 also may be or may not be exposed from the openings OP of the photoresist pattern RP4.

Figure 31:
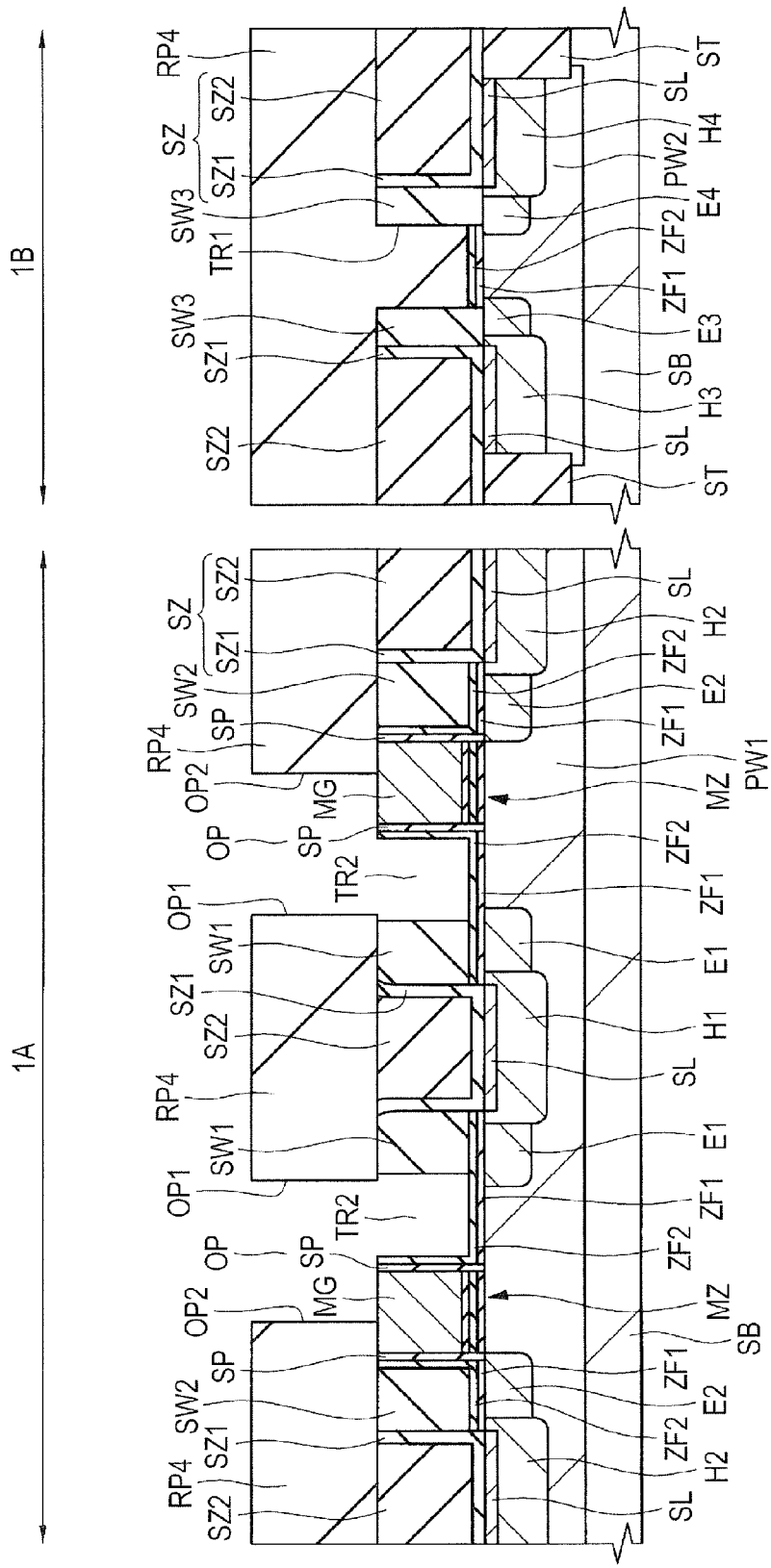
FIG. 31 is a main-portion cross-sectional view of the semiconductor device during the manufacturing process thereof, which is subsequent to FIG. 30.
Figure 32:
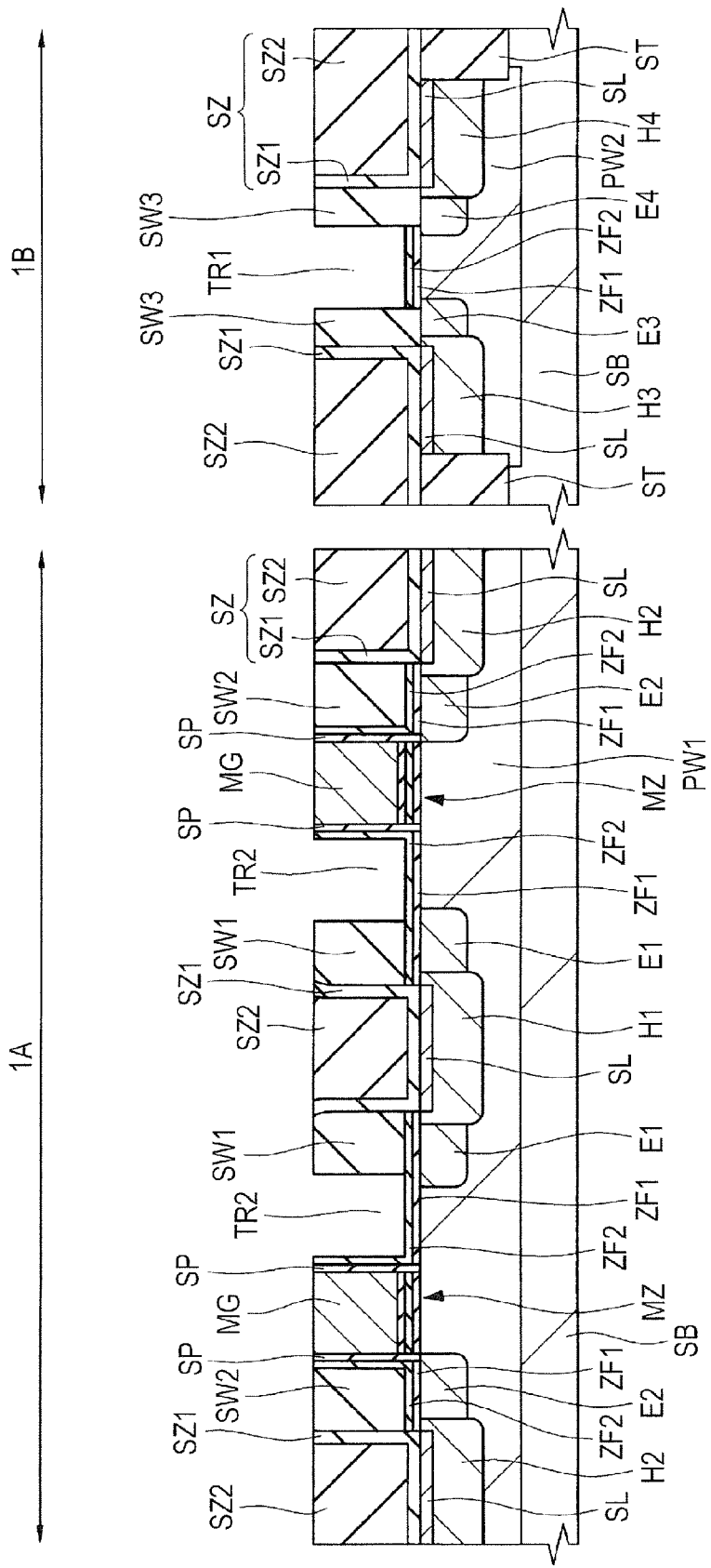
FIG. 32 is a main-portion cross-sectional view of the semiconductor device during the manufacturing process thereof, which is subsequent to FIG. 31.

Next, as shown in FIG. 31, the dummy control gate electrodes DCG exposed from the respective openings OP of the photoresist pattern RP4 are etched to be removed. This step will be hereinafter referred to as the "step of etching the dummy control gate electrodes DCG shown in FIG. 31" or "etching step shown in FIG. 31". After the step of etching the dummy control gate electrodes DCG shown in FIG. 31, as shown in FIG. 32, the photoresist pattern RP4 is removed.

In the step of etching the dummy control gate electrodes DCG shown in FIG. 31, wet etching or isotropic dry etching can be formed. As the wet etching, e.g., wet etching using a diluted hydrofluoric acid can be used.

In the etching step shown in FIG. 31, the etching is performed under conditions in which the memory gate electrodes MG are less likely to be etched than the dummy control gate electrodes DCG. That is, in the etching step shown in FIG. 31, the etching is performed under conditions in which the speed of etching the memory gate electrodes MG is lower than the speed of etching the dummy control gate electrodes DCG. Thus, it is possible to selectively remove the dummy control gate electrodes DCG, inhibit or prevent the memory gate electrodes MG from being etched, and leave the memory gate electrodes MG.

When the dummy control gate electrodes CG are to be etched to be removed in the state where both of the dummy control gate electrodes DCG and the memory gate electrodes MG are exposed from the openings OP of the photoresist pattern RP4, even the memory gate electrodes MG may be etched. However, in the present embodiment, the dummy control gate electrodes DCG and the memory gate electrodes MG are formed of different materials and, in the etching step shown in FIG. 31, the etching is performed under conditions in which the memory gate electrodes MG are less likely to be etched than the dummy control gate electrodes DCG. As a result, even when etching is performed in the state where both of the dummy control gate electrodes DCG and the memory gate electrodes MG are exposed from the openings OP of the photoresist pattern RP4, the dummy control gate electrodes DCG can selectively be etched to be removed. In addition, it is possible to inhibit or prevent the memory gate electrodes MG from being etched and reliably leave the memory gate electrodes MG.

It is desirable to select respective materials for the dummy control gate electrodes DCG and the memory gate electrodes MG so as to allow the dummy control gate electrodes DCG to be etched at a high selectivity in the etching step shown in FIG. 31. The memory gate electrodes MG are preferably made of silicon (the foregoing silicon film PS1) in terms of the function and reliability of the gate electrodes of the memory transistors. On the other hand, the dummy control gate electrodes DCG are preferably made of silicon dioxide in terms of a material that can be etched at a high selectivity when the memory gate electrodes MG are made of silicon. When the memory gate electrodes MG are made of silicon and the dummy control gate electrodes DCG are made of silicon dioxide, it is possible to selectively etch the dummy control gate electrodes DCG in the etching step shown in FIG. 31, while inhibiting or preventing the memory gate electrodes MG from being etched. As the etching, wet etching using a diluted hydrofluoric acid can be used appropriately.

In the etching step shown in FIG. 31, the sidewall spacers SW1 and SW2 may be exposed during the etching. For example, either one or both of the sidewall spacers SW1 and SW2 may be exposed from the openings OP. When the dummy control gate electrodes DCG are removed during the etching, the side surfaces (side surfaces adjacent to the dummy control gate electrodes DCG) of the sidewall spacers SW1 are exposed.

Accordingly, in the etching step shown in FIG. 31, it is preferable to perform the etching under conditions in which the sidewall spacers SW1 and SW2 are less likely be etched than the dummy control gate electrodes DCG. That is, in the etching step shown in FIG. 31, it is preferable to perform the etching under conditions in which the speed of etching the sidewall spacers SW1 and SW2 is lower than the speed of etching the dummy control gate electrodes DCG. This can selectively remove the dummy control gate electrodes DCG and inhibit or prevent the sidewall spacers SW1 and SW2 from being etched.

Consequently, the sidewall spacers SW1 and SW2 are made of a material different from that of the dummy control gate electrodes DCG and it is desirable to select respective materials for the dummy control gate electrodes DCG and the sidewall spacers SW1 and SW2 so as to allow the dummy control gate electrodes DCT to be etched at a high selectivity. From this viewpoint, it is preferable that the dummy control gate electrodes DCG are made of silicon dioxide and the sidewall spacers SW1 and SW2 are made of silicon nitride.

In the step of etching the dummy control gate electrodes DCG shown in FIG. 31, when the dummy control gate electrodes DCG are removed during the etching, the top surfaces of the insulating films ZF2 (top surfaces of the portions of the insulating films ZF2 which are in contact with the dummy control gate electrodes DCG) are exposed.

Accordingly, in the etching step shown in FIG. 31, the etching is preferably performed under conditions in which the insulating films ZF2 are less likely to be etched than the dummy control gate electrodes DCG. That is, in the etching step shown in FIG. 31, the etching is preferably performed under conditions in which the speed of etching the insulating films ZF2 is lower than the speed of etching the dummy control gate electrodes DCG. This allows the dummy control gate electrodes DCG to be selectively removed and can inhibit or prevent the insulating films ZF2 from being etched.

Consequently, the insulating films ZF2 are made of a material different from that of the dummy control gate electrodes DCG and it is desirable to select respective materials for the dummy control gate electrodes DCG and the insulating films ZF2 so as to allow the dummy control gate electrodes DCG to be etched at a high selectivity. From this viewpoint, it is preferable that the dummy control gate electrodes DCG are made of silicon dioxide and the insulating films ZF2 are made of silicon nitride.

Therefore, it is preferable that the memory gate electrodes MG are made of silicon, the dummy control gate electrodes DCG are made of silicon dioxide, the sidewall spacers SW1 and SW2 are made of silicon nitride, and the insulating films ZF2 are made of silicon nitride. In this case, in the etching step shown in FIG. 31, it is possible to selectively etch the dummy control gate electrodes DCG, while inhibiting or preventing the memory gate electrodes MG, the sidewall spacers SW1 and SW2, and the insulating films ZF2 from being etched. As the etching performed at this time, wet etching using a diluted hydrofluoric acid can be used appropriately.

As a result of the removal of the dummy control gate electrodes DCG in the etching step shown in FIT. 31, trenches (depressed portions or recessed portions) TR2 are formed. The trenches TR2 correspond to regions from which the dummy control gate electrodes DCG are removed and in which the dummy control gate electrodes DCG have been present until the dummy control gate electrodes DCG are removed. The bottom surfaces of the trenches TR2 are formed of the upper surfaces of the insulating films ZF2. One of the side surfaces of each of the trenches TR2 is formed of the sidewall spacer SW1, while the other side surface of each of the trenches TR2 is formed of the insulating film ZF2.

Figure 33:
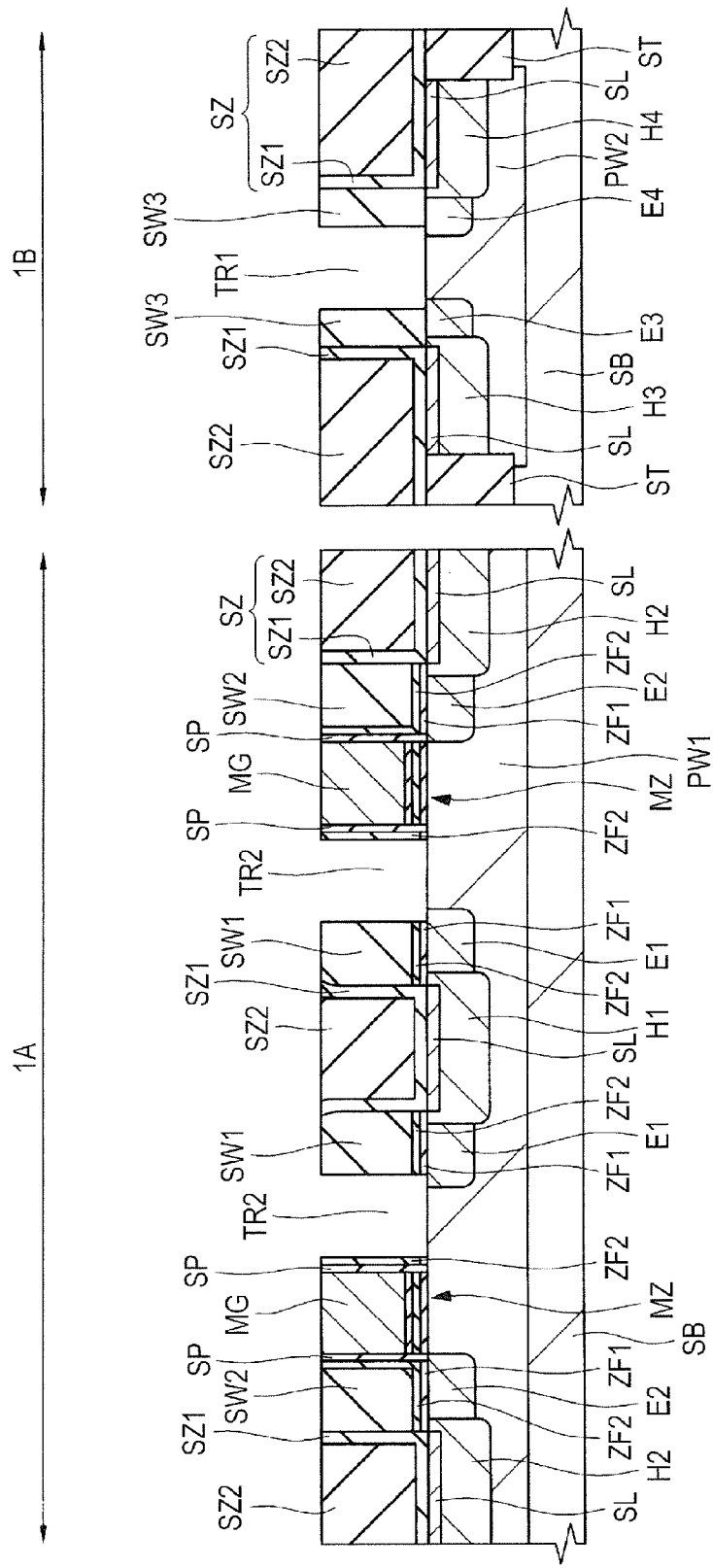
FIG. 33 is a main-portion cross-sectional view of the semiconductor device during the manufacturing process thereof, which is subsequent to FIG. 32.

Next, as shown in FIG. 33, the insulating films ZF2 at the respective bottom portions of the trenches TR1 and TR2 are removed. As the etching performed at this time, anisotropic dry etching is used preferably. This can selectively etch and remove the insulating films ZF2 which are exposed at the respective bottom portions of the trenches TR1 and TR2 and also inhibit or prevent the portions of the insulating films ZF2 which form the side surfaces of the trenches TR2. When the insulating films ZF2 are etched, the etching is preferably performed under conditions in which the insulating films ZF1 are less likely to be etched than the insulating films ZF2. When the insulating films ZF2 at the respective bottom portions of the trenches TR1 and TR2 are etched to be removed, the insulating films ZF1 are exposed at the respective bottom portions of the trenches TR1 and TR2. On the other hand, the portions of the insulating films ZF2 which form the side surfaces of the trenches TR2 are left.

Next, as shown in FIG. 33, the insulating films ZF1 at the respective bottom portions of the trenches TR1 and TR2 are etched to be removed. As the etching performed at this time, dry etching or wet etching can be used, but wet etching is preferred to dry etching. This can inhibit the semiconductor substrate SB (p-type wells PW1 and PW2) from being damaged when the insulating films ZF1 are removed from the respective bottom portions of the trenches TR1 and T2 and the semiconductor substrate SB is exposed. As the wet etching performed at this time, wet etching using a diluted hydrofluoric acid can be used appropriately.

When the insulating films ZF1 are etched, the etching is preferably performed under conditions in which the insulating films ZF2 are less likely to be etched than the insulating films ZF1. This can selectively etch the insulating films ZF1 at the respective bottom portions of the trenches TR1 and T2 and also inhibit or prevent the portions of the insulating films ZF2 which form the side surfaces of the trenches TR2 from being etched.

Thus, from the respective bottom portions of the trenches TR1 and TR2, the insulating films ZF2 and ZF1 are removed and the semiconductor substrate SB (p-type wells PW1 and PW2) is exposed. FIG. 33 shows this process stage.

Figure 34:
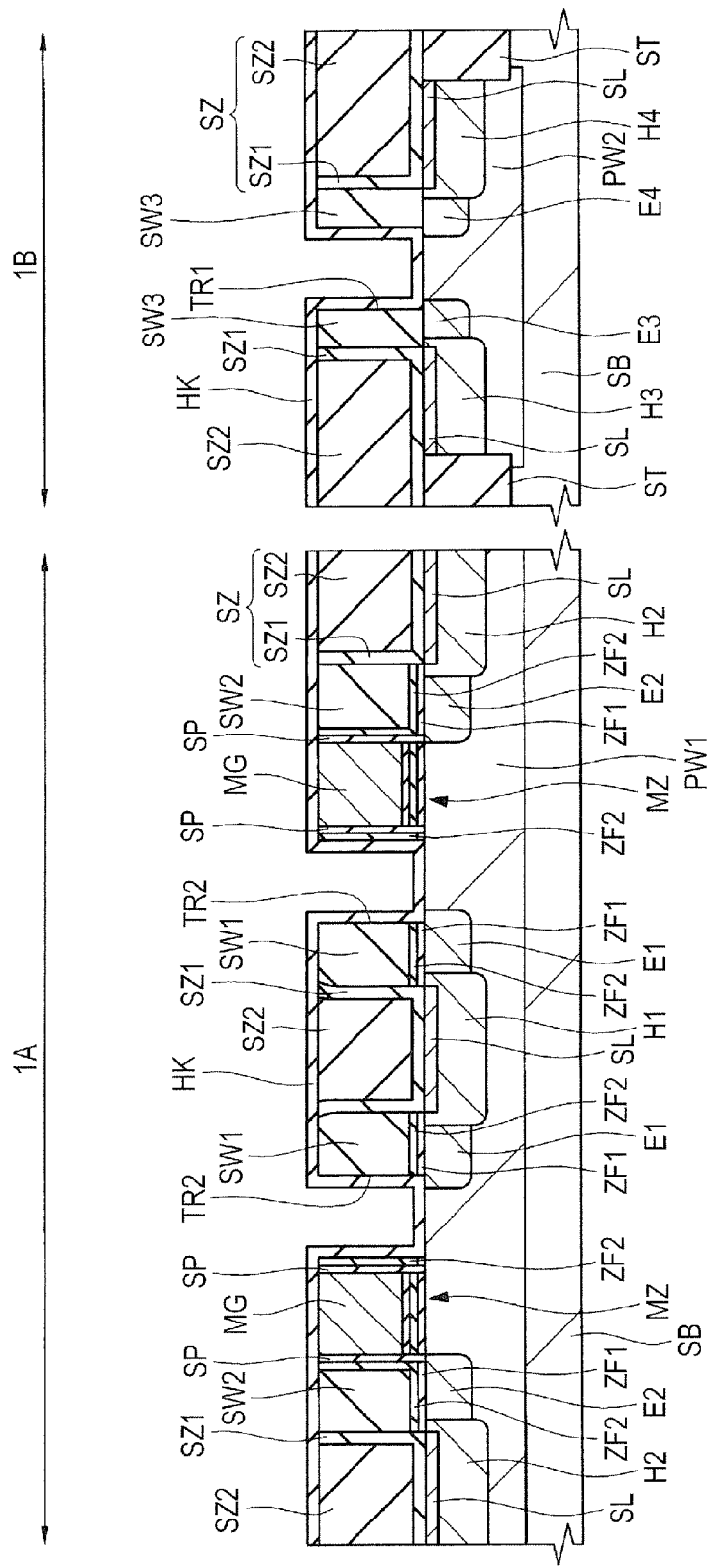
FIG. 34 is a main-portion cross-sectional view of the semiconductor device during the manufacturing process thereof, which is subsequent to FIG. 33.
Figure 35:
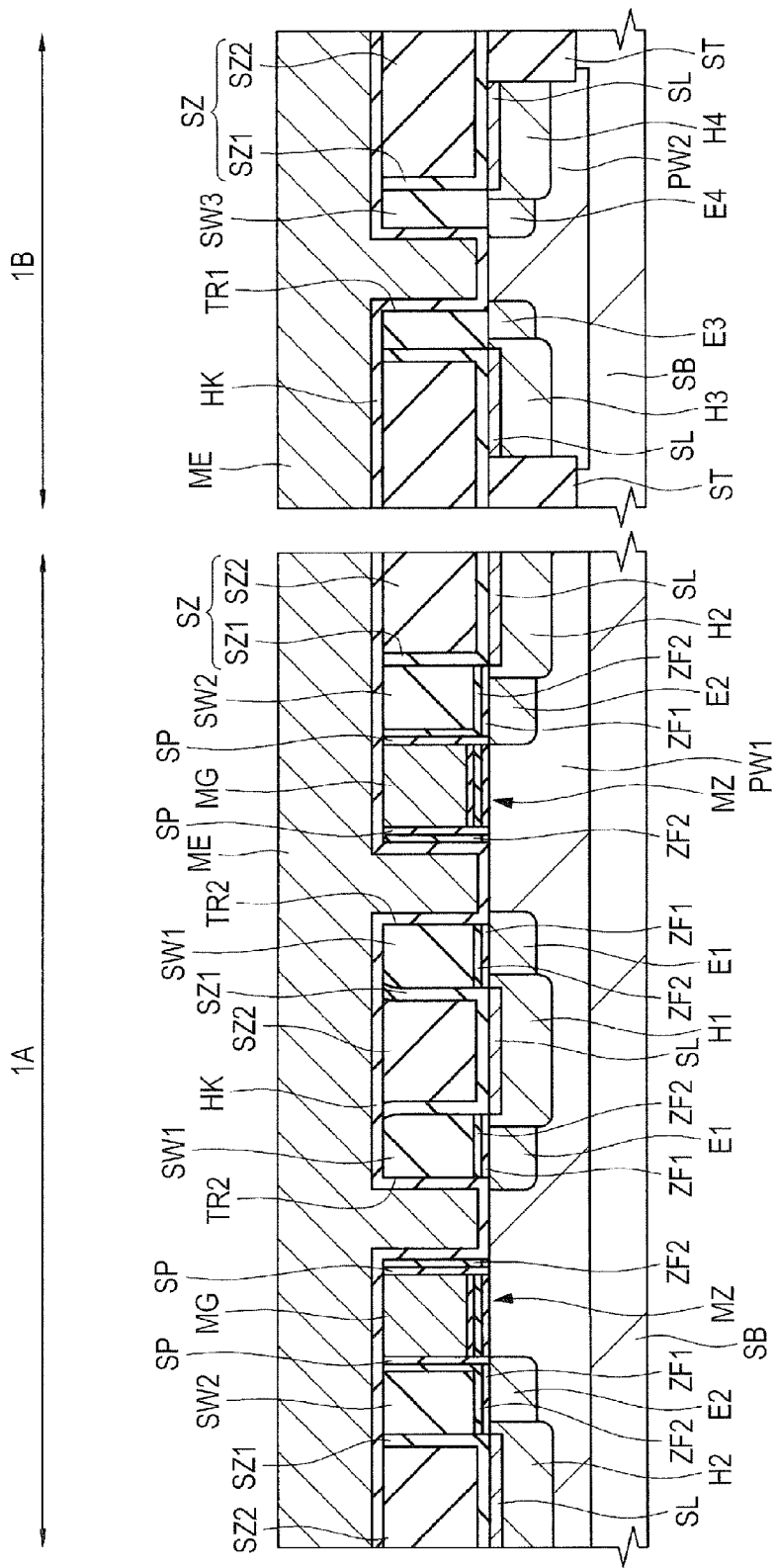
FIG. 35 is a main-portion cross-sectional view of the semiconductor device during the manufacturing process thereof, which is subsequent to FIG. 34.

Next, as shown in FIG. 34, over the main surface of the semiconductor substrate SB, i.e., over the insulating films SZ including the respective inner surfaces (bottom and side surfaces) of the trenches TR1 and TR2, an insulating film HK is formed as an insulating film for a high-dielectric-constant gate insulating film. The insulating film HK is made of a high-dielectric-constant insulating film. Then, as shown in FIG. 35, over the main surface of the semiconductor substrate SB, i.e., over the insulating film HK, a metal film ME is formed as a conductive film for metal gate electrodes so as to be embedded in the trenches TR1 and TR2.

In the trenches TR1 and TR2, the insulating film HK is formed over the bottom and side surfaces of the trenches TR1 and TR2. However, the trenches TR1 and TR2 are not completely filled with the insulating film HK. By forming the metal film ME, the trenches TR1 and TR2 are completely filled with the insulating film HK and the metal film ME.

The insulating film HK is an insulating material film having a dielectric constant higher than that of silicon nitride, i.e., a so-called High-k film. Note that, in the present application, when a High-k film, a high-dielectric-constant film, a high-dielectric-constant insulating film, or a high-dielectric-constant gate insulating film is mentioned, the film means a film having a dielectric constant (relative permittivity) higher than that of silicon nitride.

As the insulating film HK, a metal oxide film such as a hafnium oxide film, a zirconium oxide film, an aluminum oxide film, a tantalum oxide film, or a lanthanum oxide film can be used. Such a metal oxide film can also further contain either one or both of nitrogen (N) and silicon (Si). Accordingly, the insulating film HK is an insulating film containing a metal element and oxygen (O) as constituent elements. For example, the insulating film HK can be formed by an ALD (Atomic layer Deposition) method or a CVD method. The insulating film HK can be formed to a thickness of, e.g., about 1 to 3 nm. When a high-dielectric-constant film (which is the insulating film HK herein) is used as a gate insulating film, the physical film thickness of the gate insulating film can be increased compared to the case where a silicon dioxide film is used as a gate insulating film. This can offer the advantage of allowing a reduction in leakage current.

After the insulating films ZF2 and ZF1 are removed from the respective bottom portions of the trenches TR1 and TR2 and before the insulating film HK is formed, it is also possible to form an interfacial layer (not shown) made of a silicon dioxide film or a silicon oxynitride film over the top surface of the semiconductor substrate SB (p-type wells PW1 and PW2) exposed at the respective bottom portions of the trenches TR1 and TR2 and then form the insulating film HK. In this case, at the respective bottom portions of the trenches TR1 and TR2, the interfacial layer (not shown) made of the silicon dioxide film or silicon oxynitride film is interposed (at the interface) between the insulating film HK and the semiconductor substrate SB (p-type wells PW1 and PW2). The interfacial layer can be formed using a thermal oxidation method or the like. The film thickness of the interfacial layer can be set to, e.g., about 1 to 2 nm. In the case where the insulating film HK as the high-dielectric-constant film is not formed directly over the top surface (silicon surface) of the semiconductor substrate SB, but the interfacial layer made of a thin silicon dioxide film or silicon oxynitride film is provided at the interface between the insulating film HK and the semiconductor substrate SB (n-type wells PW1 and PW2), it is possible to reduce the number of defects such as trap levels and improve a driving ability and reliability. In the case where the interfacial layer made of a silicon dioxide film or a silicon oxynitride film is formed, in FIG. 43 described later, the interfacial layer made of a thin silicon dioxide film or silicon oxynitride film is interposed (at the interface) between the insulating film HK under the control gate electrode CG and the semiconductor substrate SB (n-type well PW1).

As the metal film ME, a metal film such as, e.g., a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum carbonitride (TaCN) film, a titanium (Ti) film, a tantalum (Ta) film, a titanium-aluminum (TiAl) alloy film, or an aluminum (AL) film can be used. It is assumed that the metal films mentioned herein are conductive films showing metal conduction and include not only a single-element metal film (pure metal film) and an alloy film, but also a metal compound film (such as a metal nitride film or a metal carbide film) showing metal conduction. Accordingly, the metal film ME is a conductive film showing metal conduction and is not limited to a single-element metal film (pure metal film) and an alloy film. The metal film ME may also be a metal compound film (such as a metal nitride film or a metal carbide film) showing metal conduction. The metal film ME can also be a multi-layer film (multi-layer film including a plurality of stacked films). In that case, the lowermost layer of the multi-layer film is made of a metal film (conductive film showing metal conduction). The multi-layer film can also be a multi-layer film including a plurality of metal films (conductive films showing metal conduction). The metal film ME can be formed using, e.g., a sputtering method or the like.

Preferred examples of the metal film ME include a multi-layer film including a titanium nitride (TiN) film and an aluminum (Al) film over the titanium nitride film. In that case, after a titanium nitride film having a thickness of, e.g., about 2 to 3 nm is formed first over the insulating film HK, an aluminum film is formed over the titanium nitride film so as to be embedded in the trenches TR1 and TR2. At this time, the aluminum film is preferably set thicker than the titanium nitride film. Since the aluminum film has a low resistance, it is possible to achieve reductions in the respective resistances of the gate electrode GE and control gate electrodes CG formed later. In addition, using the work function of the material of the portion (which is the titanium nitride film herein) of each of the gate electrode GE and control gate electrodes CG formed later which is in contact with the gate insulating film, the threshold voltage of each of the transistors including the gate electrodes (GE and CG) can be controlled.

Figure 36:
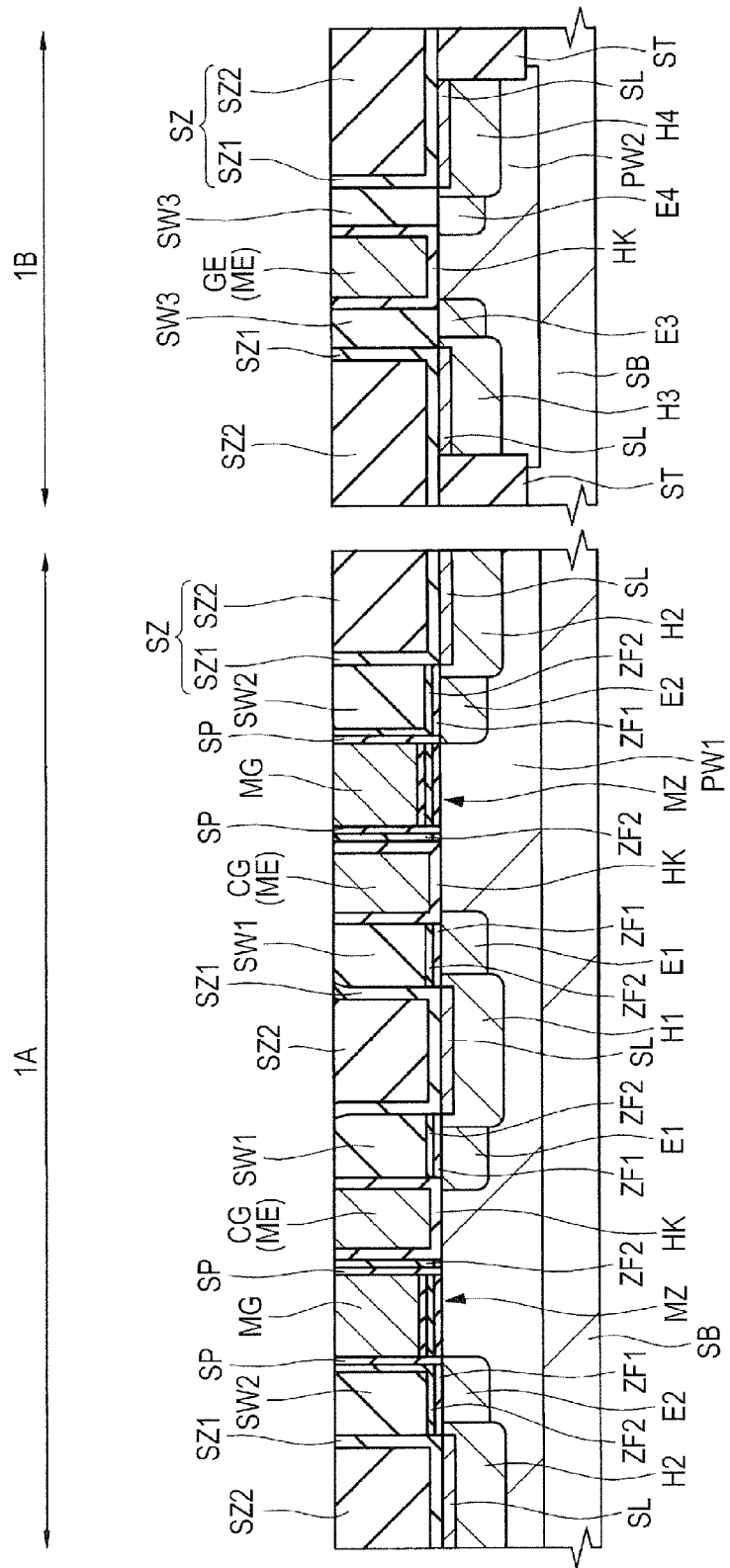
FIG. 36 is a main-portion cross-sectional view of the semiconductor device during the manufacturing process thereof, which is subsequent to FIG. 35.

Next, as shown in FIG. 36, by removing the unneeded metal film ME and the unneeded insulating film HK which are located outside the trenches TR1 and TR2 by a polishing process such as a CVD process, the insulating film HK and the metal film ME are embedded in the trenches TR1 and TR2. The step will be hereinafter referred to as the "step shown in FIG. 36".

That is, in the step shown in FIG. 36, the metal film ME and the insulating film HK which are located outside the trenches TR1 and TR2 are removed, while the insulating film HK and the metal film ME are left in the trenches TR1 and TR2. As a result, the insulating film HK and the metal film ME are left and embedded in the trenches TR1 and TR2. That is, the metal film ME is embedded in the trenches TR1 and TR2 via the insulating film HK.

Thus, in the trench TR1 as the region from which the dummy gate electrode DGE is removed, the gate electrode GE as the metal gate electrode is formed via the insulating film HK. On the other hand, in the trenches TR2 as the regions from which the dummy control gate electrodes DCG are removed, the control gate electrodes CG as the metal gate electrodes are formed via the insulating films HK. The insulating film HK is the high-dielectric-constant insulating film and contains a metal element and oxygen as constituent elements.

The metal film ME embedded in the trench TR1 serves as the gate electrode GE of the MISFET for the peripheral circuit. The insulating film HK embedded in the trench TR1 functions as the gate insulating film of the MISFET. On the other hand, the metal film ME embedded in the trenches TR2 serves as the control gate electrodes CG of the control transistors and the insulating film HK embedded in the trenches TR2 functions as the gate insulating films of the control transistors.

In the present embodiment, the dummy gate electrode DGE is removed and replaced with the gate electrode GE. The gate electrode GE is used as the gate electrode of the MISFET in the peripheral circuit region 1B. Accordingly, the dummy gate electrode DGE can be regarded as a to-be-replaced structure for forming the gate electrode GE, while the gate electrode GE can be regarded as the gate electrode included in the MISFET.

Also, in the present embodiment, the dummy control gate electrodes DCG are removed and replaced with the control gate electrodes CG. The control gate electrodes CG are used as the gate electrodes of the control transistors in the memory cell region 1A. Accordingly, the dummy control gate electrodes DCG can be regarded as to-be-replaced structures for forming the control gate electrodes CG, while the control gate electrodes CG can be regarded as the gate electrodes included in the control transistors.

Also, in the present embodiment, the gate electrode GE and the control gate electrodes CG are formed using the metal film ME. This allows the gate electrode GE and the control gate electrodes CG to be formed of the metal gate electrodes. By forming the gate electrode GE and the control gate electrodes CG of the metal gate electrodes, the advantage of being able to suppress a phenomenon in which the gate electrode GE and the control gate electrodes CG are depleted and eliminate a parasitic capacitance can be obtained. In addition, the advantage of allowing a reduction in the size of each of the transistor elements (a reduction in the thickness of each of the gate insulating films) can also be obtained.

In the peripheral circuit region 1B, the insulating film HK is formed over the bottom and side surfaces of the trench TR1 and the gate electrode GE has bottom and side surfaces adjacent to the insulating film HK. Between the gate electrode GE and the semiconductor substrate SB (p-type well PW2), the insulating film HK is interposed and, between the gate electrode GE and the sidewall spacers SW3, the insulating film HK is interposed. The insulating film HK immediately under the gate electrode GE functions as the gate insulating film of the MISFET but, since the insulating film HK is the high-dielectric-constant film, the insulating film HK functions as the high-dielectric-constant gate insulating film.

In the memory cell region 1A, the insulating films HK are formed over the bottom and side surfaces of the trenches TR2 and the control gate electrodes CG have bottom and side surfaces adjacent to the insulating films HK. Between the control gate electrodes CG and the semiconductor substrate SB (p-type well PW1), the insulating films HK are interposed and, between the control gate electrodes CG and the sidewall spacers SW1, the insulating films HK are interposed. Between the control gate electrodes CG and the memory gate electrodes MG, the insulating films HK and ZF2 and the side-wall insulating films SP are successively interposed in order of increasing distance from the control gate electrodes CG. The insulating films HK immediately under the control gate electrodes CG function as the gate insulating films of the control transistors. Since the insulating films HK are the high-dielectric-constant films, the insulating films HK function as the high-dielectric-constant gate insulating films.

Figure 37:
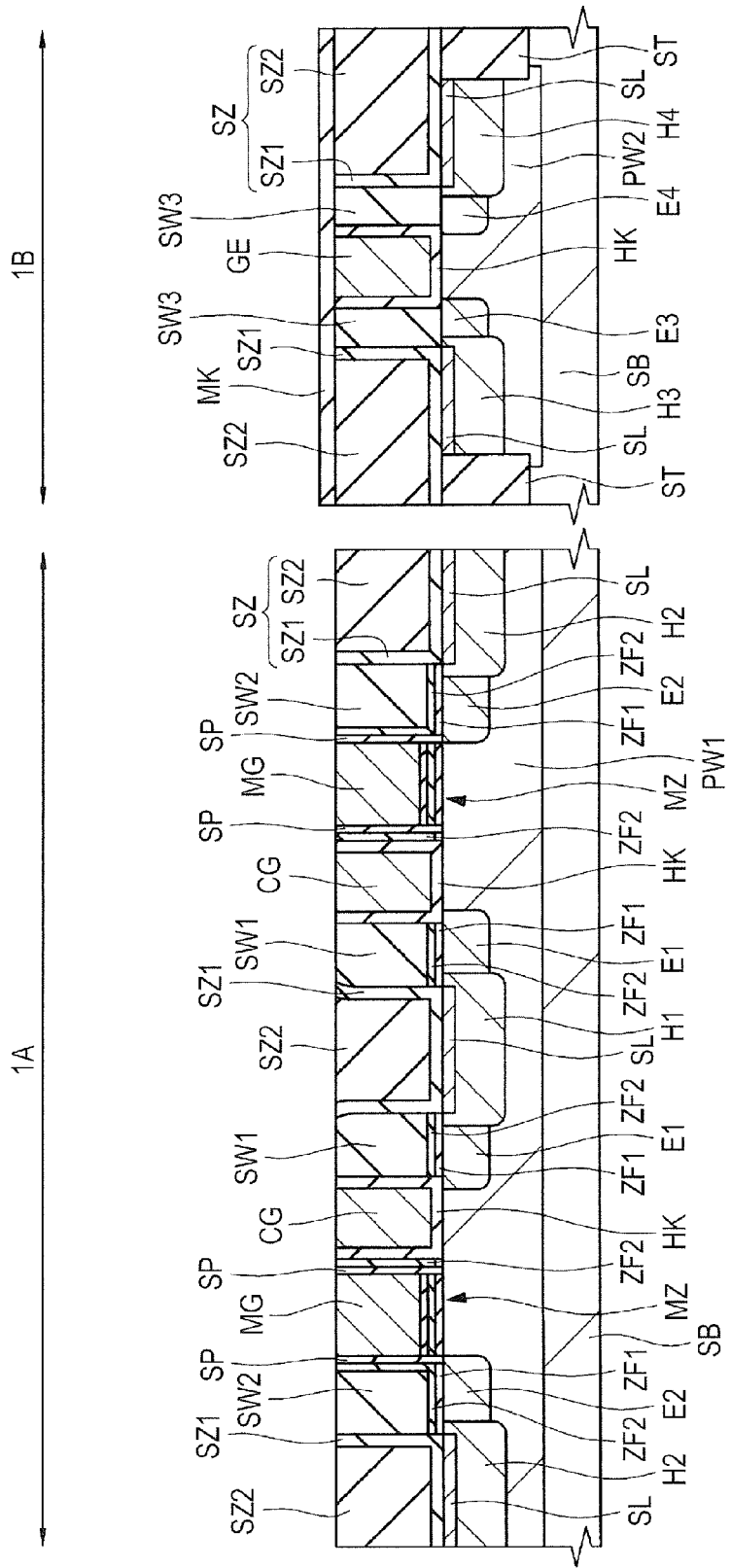
FIG. 37 is a main-portion cross-sectional view of the semiconductor device during the manufacturing process thereof, which is subsequent to FIG. 36.

Next, as shown in FIG. 37, an insulating film MK which covers the entire peripheral circuit region 1B and exposes the memory cell region 1A is formed over the insulating film SZ. For example, the insulating film MK can be formed as follows. That is, using a CVD method or the like, an insulating film (insulating film for forming the insulating film MK) is formed over the main surface of the substrate SB, i.e., over the insulating film SZ so as to cover the entire memory cell region 1A and the entire peripheral circuit region 1B. Then, the insulating film is patterned using a photolithographic technique and an etching technique to be able to form the insulating film MK. When the insulating film MK is formed, the respective upper surfaces of the control gate electrodes CG and the memory gate electrodes MG are not covered with the insulating film MK and are exposed, while the gate electrode GE is covered with the insulating film MK and is not exposed. The insulating film MK is made of a silicon dioxide film or the like. As the insulating film MK, e.g., a plasma TEOS oxide film can be used. The thickness of the insulating film MK can be set to, e.g., about 5 to 10 nm.

Figure 38:
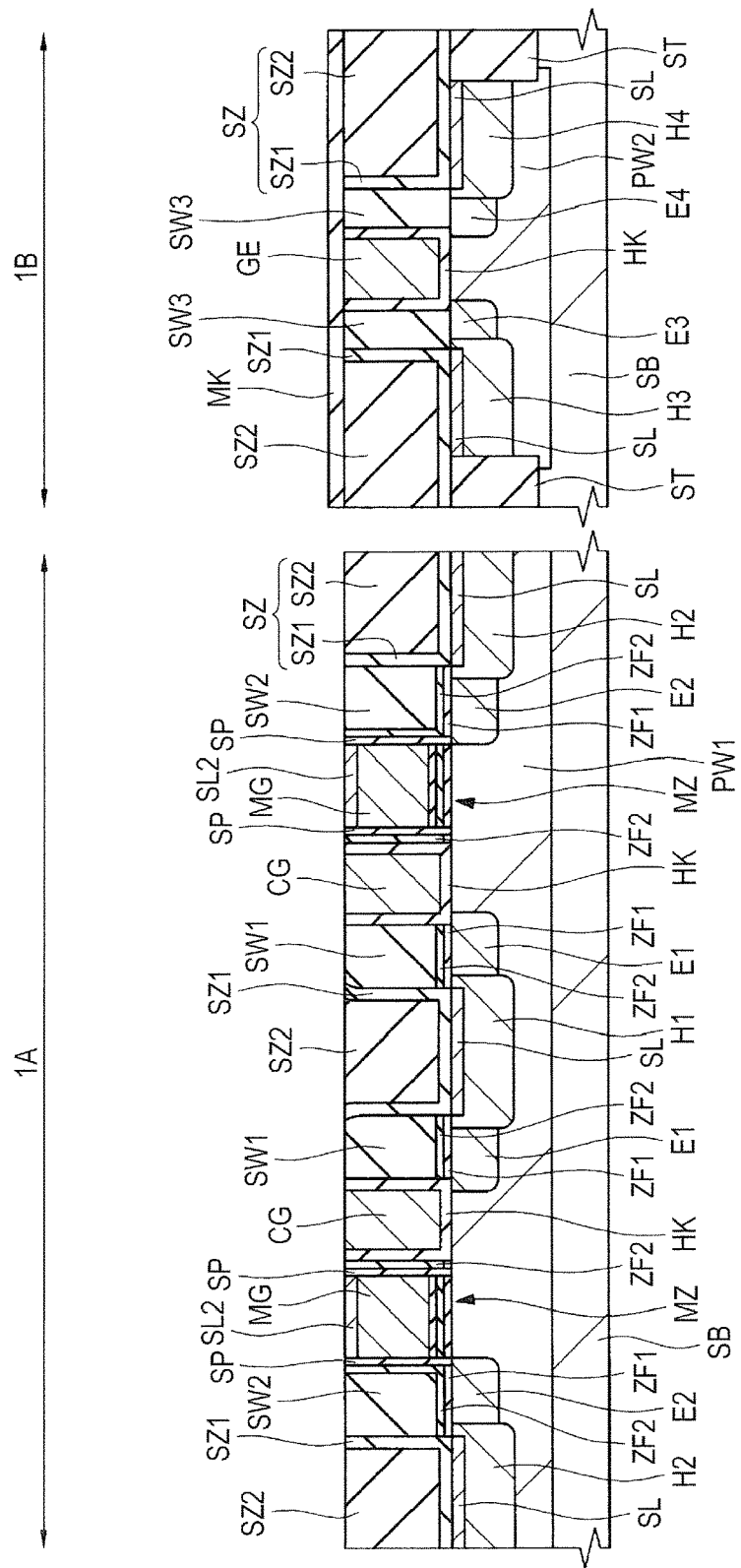
FIG. 38 is a main-portion cross-sectional view of the semiconductor device during the manufacturing process thereof, which is subsequent to FIG. 37.

Next, as shown in FIG. 38, metal silicide layers SL2 are formed in the upper surfaces of the memory gate electrodes MG.

The metal silicide layers LS2 can be formed by performing a so-called salicide process. Specifically, the metal silicide layers SL2 can be formed as follows.

That is, first, over the insulating film SZ including the respective upper surfaces of the control gate electrodes CG and the memory gate electrodes MG, a metal film for forming the metal silicide layers SL2 is formed. As the metal film for forming the metal silicide layers SL2, a single-element metal film (pure metal film) or an alloy film can be formed. The metal film for forming the metal silicide layers SL2 is made of, e.g., a cobalt (Co) film, a nickel (Ni) film, or a nickel-platinum alloy film and can be formed using a sputtering method or the like. Then, heat treatment is performed on the semiconductor substrate SB to cause the upper portions of the memory gate electrodes MG to react with the metal film for forming the metal silicide layers SL2. Thus, as shown in FIG. 38, the metal silicide layers SL2 are formed in the upper portions (upper-layer portions) of the memory gate electrodes MG. Subsequently, the unreacted metal film (metal film for forming the metal silicide layers SL2) is removed by wet etching or the like. FIG. 38 shows a cross-sectional view of this process stage. After the unreacted metal film (metal film for forming the metal silicide layers SL2) is removed, heat treatment can also be performed again. When the unreacted metal film (metal film for forming the metal silicide layers SL2) is removed by wet etching or the like, it is preferable to inhibit or prevent the control gate electrodes CG from being etched. For example, the etchant shown in Patent Document 4 shown above can be used. When the metal film for forming the metal silicide layers SL2 is a cobalt film, the metal silicide layers SL2 are made of a cobalt silicide layer. When the metal film for forming the metal silicide layers SL2 is a nickel film, the metal silicide layers SL2 are made of a nickel silicide layer. When the metal film for forming the metal silicide layers SL2 is a nickel-platinum alloy film, the metal silicide layers SL2 are made of a platinum-added nickel silicide layer.

By thus performing a so-called salicide process, it is possible to form the metal silicide layers SL2 in the upper portions of the memory gate electrodes MG by self-alignment and thus reduce the resistances of the memory gate electrodes MG.

Figure 39:
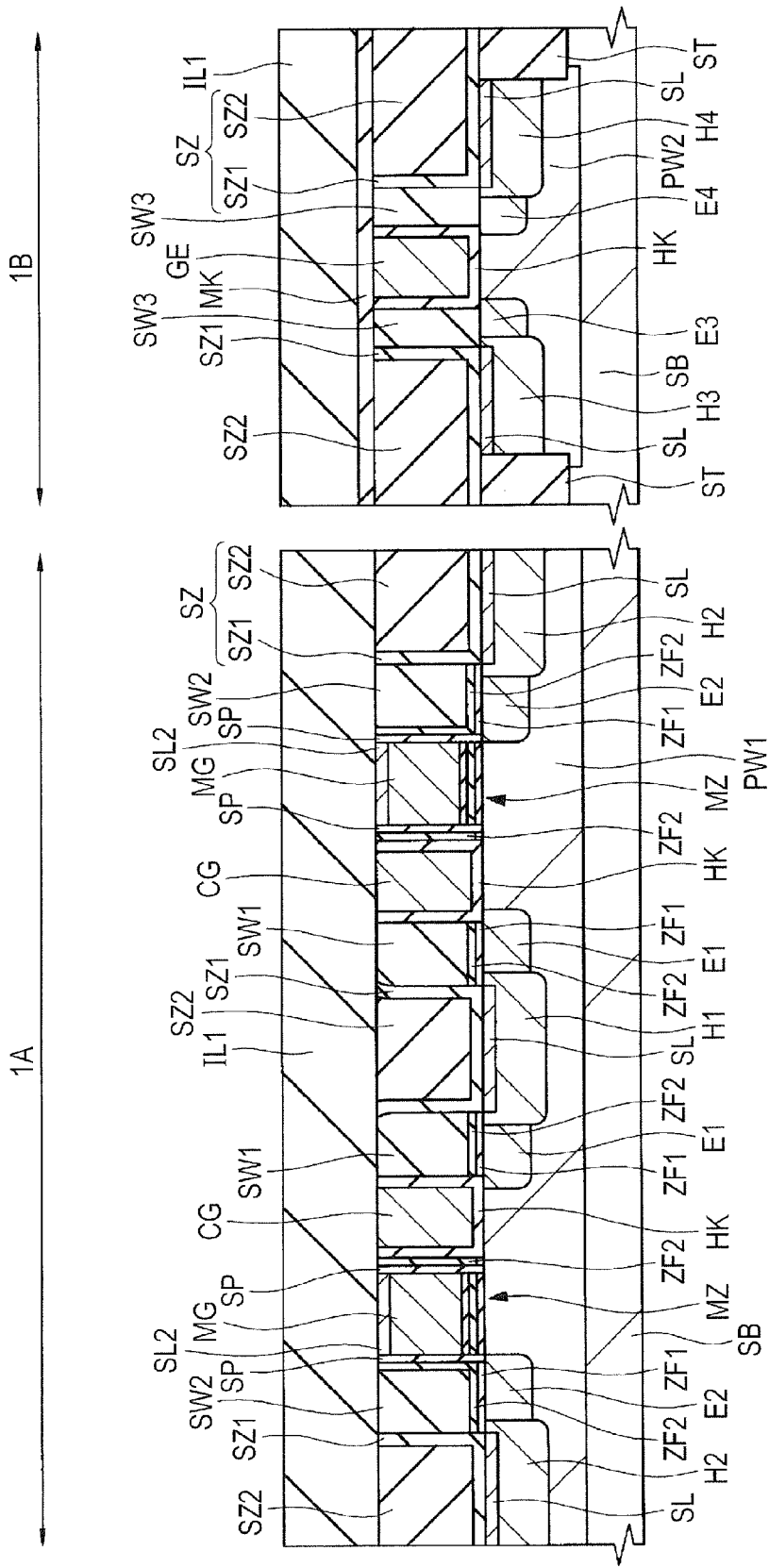
FIG. 39 is a main-portion cross-sectional view of the semiconductor device during the manufacturing process thereof, which is subsequent to FIG. 38.

Next, as shown in FIG. 39, over the main surface of the semiconductor substrate SB, an insulating film IL1 is formed (deposited) as an interlayer insulating film. The insulating film IL1 is made of a silicon dioxide film or the like and can be formed using a CVD method or the like. As the insulating film IL1, e.g., a plasma TEOS film can be used. After the formation of the insulating film IL1, it is also possible to, e.g., polish the upper surface of the insulating film IL1 by a CMP method or the like and enhance the planarity of the upper surface of the insulating film IL1.

In the memory cell region 1A, the insulating film IL1 is formed over the insulating film SZ so as to cover the control gate electrodes CG, the memory gate electrodes MG, and the sidewall spacers SW1 and SW2. In the peripheral circuit region 1B, the insulating film IL1 is formed over the insulating film MK.

Figure 40:
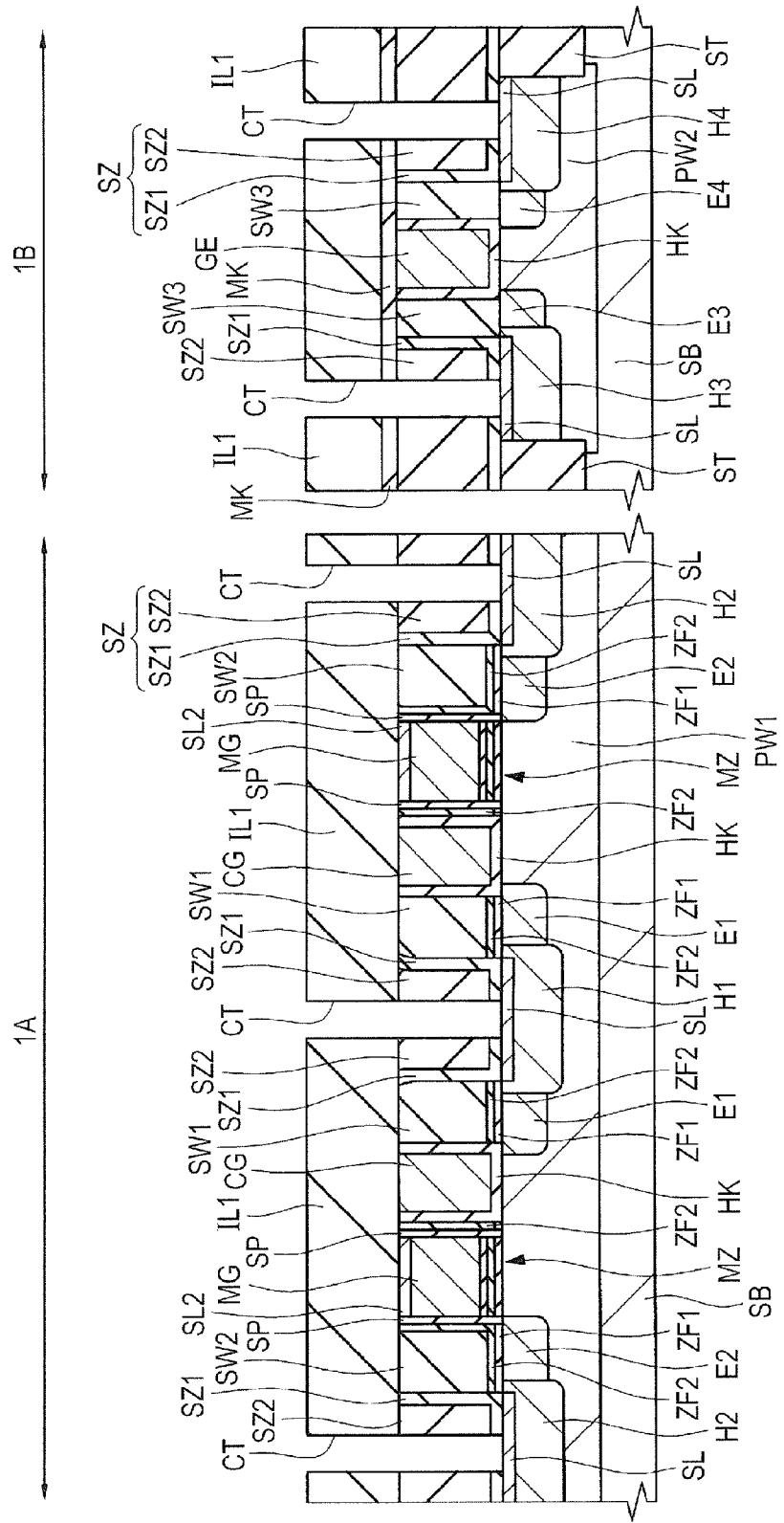
FIG. 40 is a main-portion cross-sectional view of the semiconductor device during the manufacturing process thereof, which is subsequent to FIG. 39.

Next, using a photoresist pattern (not shown) formed over the insulating film IL1 using a photolithographic method as an etching mask, the insulating films IL1, MK, and SZ are dry-etched to be formed with the contact holes (through holes) CT, as shown in FIG. 40. In the memory cell region 1A, the contact holes CT extend through the insulating films IL1 and SZ. In the peripheral circuit region 1B, the contact holes CT extend through the insulating films IL1, MK, and SZ.

Note that, in the case where the insulating films SZ are made of the multi-layer film including the insulating film SZ1 and the insulating film SZ2 over the insulating film SZ1, the insulating films SZ1 are allowed to function as etching stopper films in the etching step for forming the contact holes CT. That is, using the foregoing photoresist pattern (not shown) as an etching mask, the insulating films IL1, MK, and SZ2 are dry-etched under conditions in which the insulating films SZ1 are less likely to be etched than the insulating films IL1, MK, and SZ2 to be formed with the contact holes CT. By allowing the insulating films SZ1 to function as the etching stopper films, the insulating films SZ1 are left at the bottom portions of the contact holes CT. Then, under the conditions in which the insulating films SZ1 are more likely to be etched than the insulating films IL1, MK, and SZ2, the insulating films SZ1 at the bottom portions of the contact holes CT are dry-etched to be removed. This can inhibit or prevent the film underlying the insulating films SZ1 from being damaged when the insulating films SZ1 are removed from the bottom portions of the contact holes CG and the underlying film is exposed.

Figure 41:
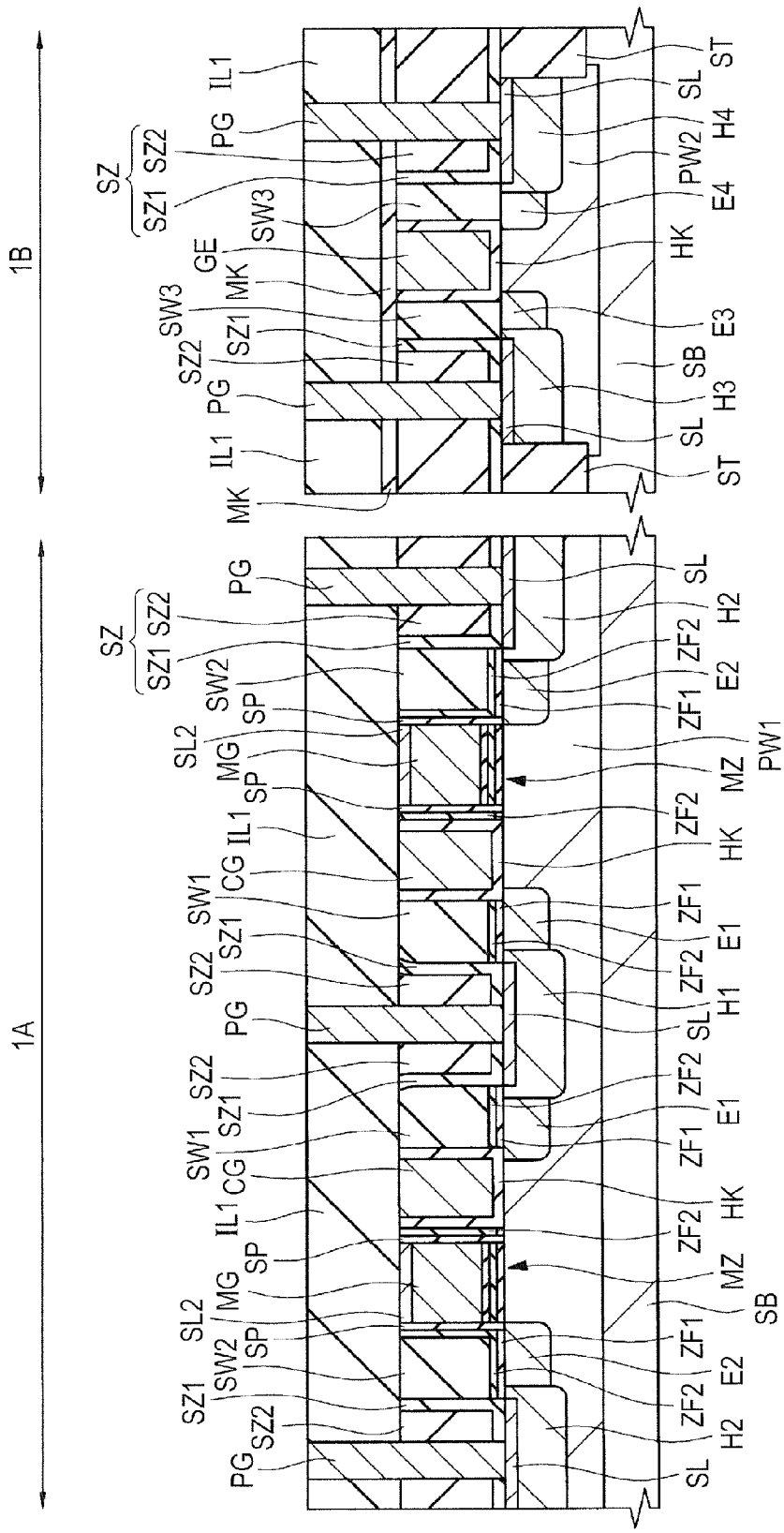
FIG. 41 is a main-portion cross-sectional view of the semiconductor device during the manufacturing process thereof, which is subsequent to FIG. 40.

Next, as shown in FIG. 41, in the contact holes CT, conductive plugs PG made of tungsten (W) or the like are formed as coupling conductor portions.

To form the plugs PG, e.g., over the insulating film IL1 including the inner portions (bottom surfaces and side walls) of the contact holes CT, a barrier conductor film is formed. Then, over the barrier conductor film, a main conductor film made of a tungsten film or the like is formed so as to be embedded in the contact holes CT. Subsequently, by removing the unneeded main conductor film and the unneeded barrier conductor film which are located outside the contact holes CT by a CMP method, an etch-back method, or the like, the plugs PG can be formed. Note that, to simplify the drawing, FIG. 41 integrally shows the barrier conductor film and the main conductor film which are included in the plugs PG.

The contact holes CT and the plugs PG embedded therein are formed over the $n^+$-type semiconductor regions H1, H2, H3, and H4, the control gate electrodes CG, the memory gate electrodes MG, the gate electrode GE, and the like. Note that FIG. 41 shows the cross-sectional view in which the metal silicide layers SL over the respective top surfaces of the $n^+$-type semiconductor regions H1, H2, H3, and H4 are exposed at the bottom portions of the contact holes CT and electrically coupled to the plugs PG embedded in the contact holes CT.

Next, over the insulating film IL1 in which the plugs PG are embedded, wires M1 as first-layer wires are formed. A description will be given of the case where the wires M1 are formed using a damascene technique.

Figure 42:
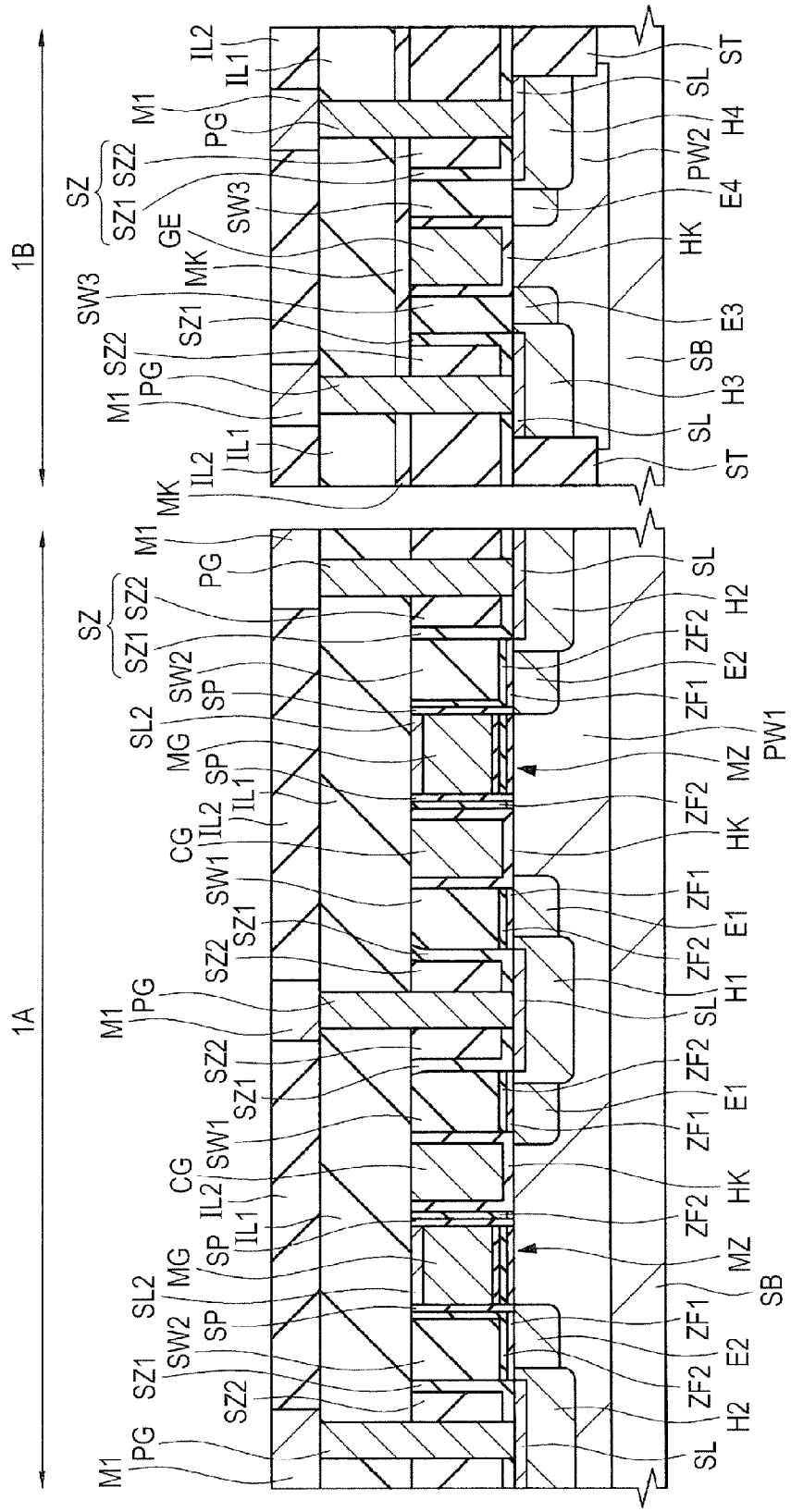
FIG. 42 is a main-portion cross-sectional view of the semiconductor device during the manufacturing process thereof, which is subsequent to FIG. 41.

First, as shown in FIG. 42, over the insulating film IL1 in which the plugs PG are embedded, an insulating film IL2 is formed. Then, after wire trenches (trenches for wires) are formed in the predetermined regions of the insulating film IL2 by dry etching using a photoresist pattern (not shown) as an etching mask, a barrier conductor film is formed over the insulating film IL2 including the bottom surfaces and side walls of the wire trenches. Then, by a CVD method, a sputtering method, or the like, a copper seed layer is formed over the barrier conductor film. Over the seed layer, a copper plating film is further formed to be embedded in the wire trenches. Subsequently, the copper plating film, the seed layer, and the barrier conductor film which are located in the region other than the wire trenches are removed by a CMP method to form the first-layer wires M1 containing copper embedded in the wire trenches as a main conductive material. To simplify the drawing, FIG. 42 integrally shows the barrier conductor film, the seed layer, and the copper plating film in each of the wires M1.

Then, using a dual damascene method or the like, wires in the second and subsequent layers are formed, but the illustration and description thereof is omitted herein. The wires M1 and the wires in the layers located thereabove are not limited to damascene wires, but can also be formed by patterning conductor films for the wires. For example, the wires M1 and the wires in the layers located thereabove can also be tungsten wires, aluminum wires, or the like.

In this manner, the semiconductor device in the present embodiment is manufactured.

<About Structure of Semiconductor Device>

Next, referring to FIGS. 43 and 44, a description will be given of a configuration of each of the memory cells in the nonvolatile memory in the semiconductor device in the present embodiment.

Figure 43:
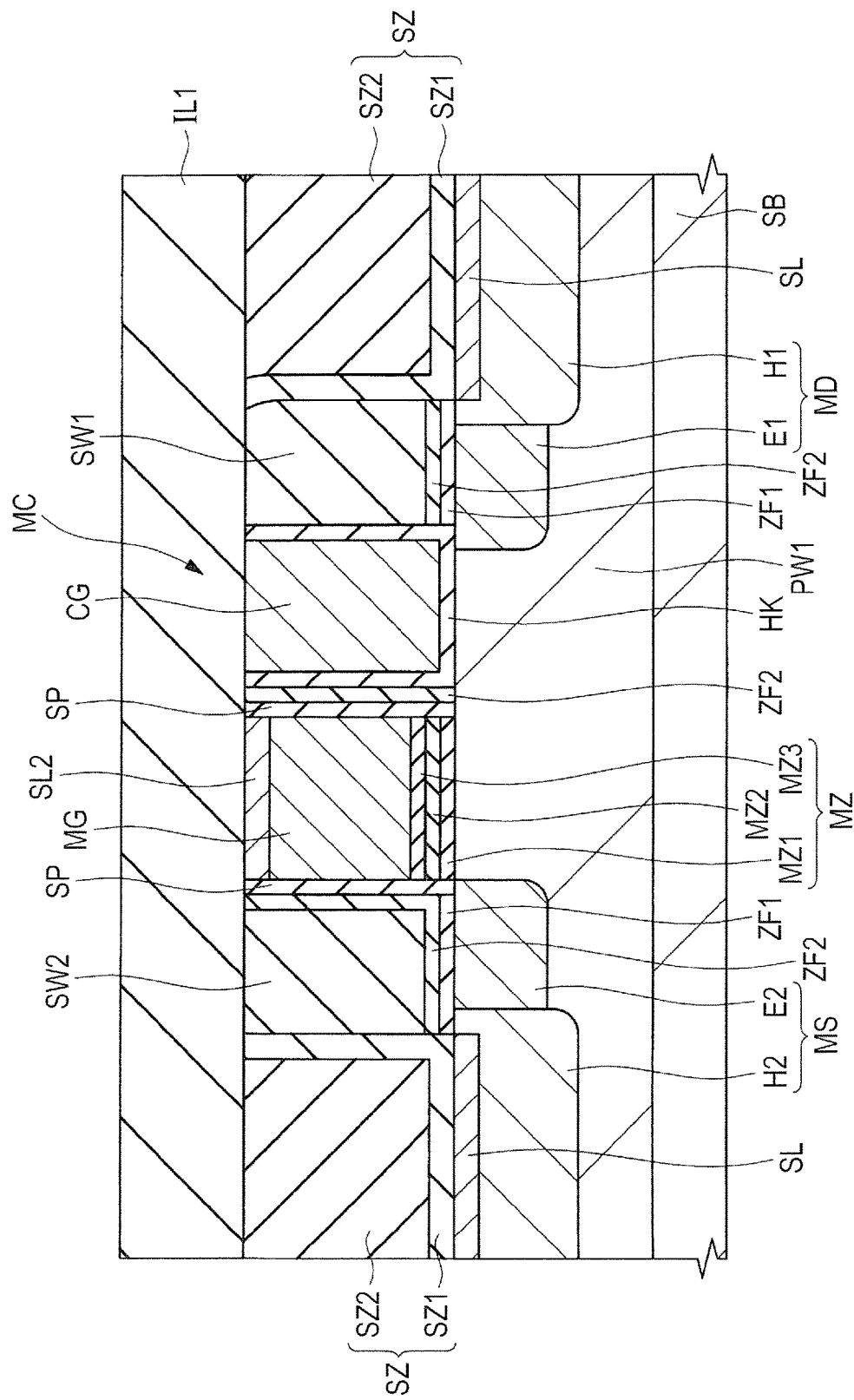
FIG. 43 is a main-portion cross-sectional view of the semiconductor device in the embodiment.

FIG. 43 is a main-portion cross-sectional view of the semiconductor device in the present embodiment, which shows a main-portion cross-sectional view of the memory cell region of the nonvolatile memory. FIG. 44 is an equivalent circuit diagram of the memory cell. Note that, in FIG. 43, to simplify the drawing, the illustration of the contact holes CT, the plugs PG, the insulating film IL2, and the wires M1 which are included in the structure shown in FIG. 42 described above is omitted.

As shown in FIG. 43, in the semiconductor substrate SB, a memory cell MC in the nonvolatile memory including the memory transistor and the control transistor is formed. Actually, a plurality of the memory cells MC are formed in an array in the semiconductor substrate SB.

Figure 44:
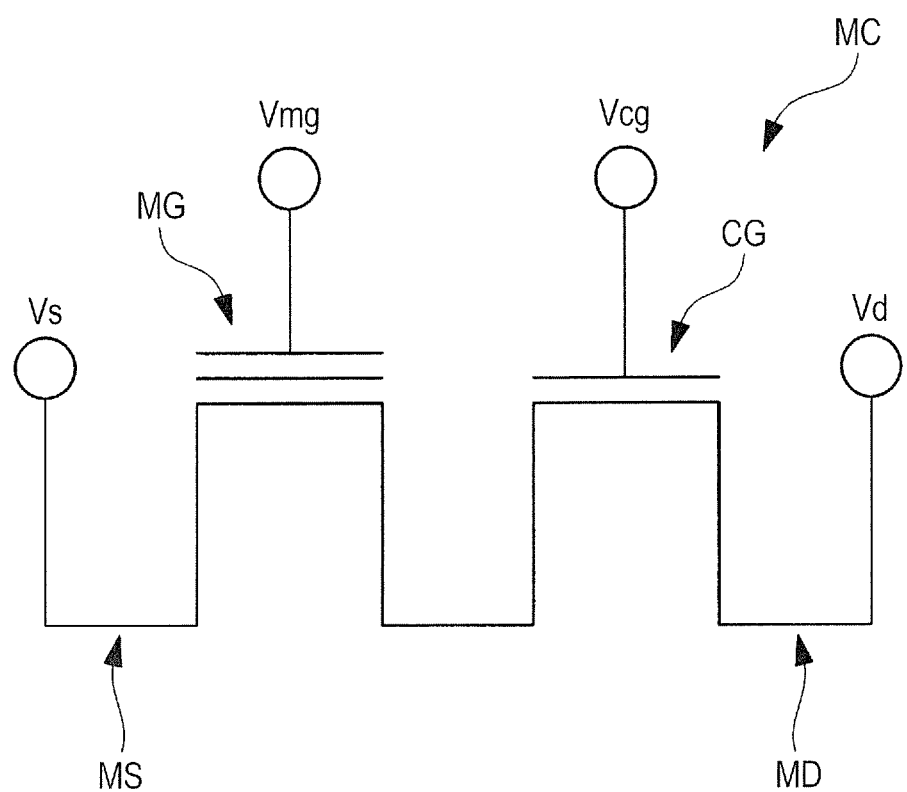
FIG. 44 is an equivalent circuit diagram of a memory cell.

As shown in FIGS. 43 and 44, each of the memory cells MC in the nonvolatile memory in the semiconductor device in the present embodiment is a split-gate memory cell. The split-gate memory cell includes two MISFETs which are the control transistor having the control gate electrode CG and the memory transistor having the memory gate electrode MG and coupled to each other.

The MISFET including the gate insulating film including the charge storage portion and the memory gate electrode MG is referred to as the memory transistor (storage transistor) and the MISFET including the gate insulating film and the control gate electrode CG is referred to as the control transistor. Accordingly, the memory gate electrode MG is the gate electrode of the memory transistor, the control gate electrode CG is the gate electrode of the control transistor, and the control gate electrode CG and the memory gate electrode MG are included in the memory cell in the nonvolatile memory. Note that, since the control transistor is a transistor for selecting the memory cell, the control transistor can also be regarded as a selection transistor.

The following will specifically describe the configuration of each of the memory cells MC.

As shown in FIG. 43, the memory cell MC in the nonvolatile memory cell includes the n-type semiconductor regions MS and MD for source and drain regions formed in the p-type well PW1 of the semiconductor substrate SB, the memory gate electrode MG formed over the semiconductor substrate SB (p-type well PW1), and the control gate electrode CG formed over the semiconductor substrate SB (p-type well PW1) to be adjacent to the memory gate electrode MG. The memory cell MC in the nonvolatile memory further includes the insulating film MZ formed between the memory gate electrode MG and the semiconductor substrate SB (p-type well PW1) and the insulating film HK formed between the control gate electrode CG and the semiconductor substrate SB (p-type well PW1).

The control gate electrode CG and the memory gate electrode MG are arranged to extend along the main surface of the semiconductor substrate SB with the side-wall insulating film SP and the insulating films ZF2 and HK being interposed between the respective facing side surfaces thereof. The directions in which the control gate electrode CG and the memory gate electrode MG extend is perpendicular to the surfaces of paper sheets with FIG. 43 and FIGS. 1 to 42 described above. The control gate electrode CG and the memory gate electrode MG are formed over the semiconductor substrate SB (p-type well PW1) located between the semiconductor regions MD and MS. The memory gate electrode MG is located closer to the semiconductor region MS, while the control gate electrode CG is located closer to the semiconductor region MD. Note that the memory gate electrode MG is formed over the semiconductor substrate SB via the insulating film MZ, while the control gate electrode CG is formed over the semiconductor substrate SB via the insulating film HK.

Between the memory gate electrode MG and the semiconductor substrate SB (p-type well PW1), the insulating film MZ made of the multi-layer film including the silicon dioxide film MZ1, the silicon nitride film MZ2, and the silicon dioxide film MZ3 is interposed. Between the control gate electrode CG and the semiconductor substrate SB (p-type well PW1), the insulating film HK is interposed. However, the insulating film HK is formed not only at the position adjacent to the lower surface of the control gate electrode CG, but also at the positions adjacent to the both side surfaces of the control gate electrode CG. That is, the insulating film HK continuously extends between the control gate electrode CG and the semiconductor substrate SB (p-type well PW1), between the control gate electrode CG and the memory gate electrode MG, and between the control gate electrode CG and the sidewall spacer SW1.

The memory gate electrode MG and the control gate electrode CG are adjacent to each other with the multi-layer film including the side-wall insulating film SP and the insulating films SP and ZF2 being interposed therebetween. That is, between the memory gate electrode MG and the control gate electrode CG, the multi-layer film including the side-wall insulating film SP and the insulating films SP and ZF2 is interposed. Between the memory gate electrode MG and the control gate electrode CG, the side-wall insulating film SP is adjacent to the memory gate electrode MG, the insulating film HK is adjacent to the control gate electrode CG, and the insulating film ZF2 is interposed between the side-wall insulating film SP and the insulating film HK. That is, between the memory gate electrode MG and the control gate electrode CG, the side-wall insulating film SP and the insulating films ZF2 and HK are arranged in succession in the direction from the memory gate electrode MG toward the control gate electrode CG.

The side-wall insulating film SP is preferably made of a silicon oxynitride film. The insulating film ZF2 is preferably made of a silicon nitride film. The insulating film HK is made of the high-dielectric-constant insulating film. The specific materials thereof are as described above.

The portion of the insulating film HK which is interposed between the control gate electrode CG and the semiconductor substrate SB (p-type well PW1), i.e., the portion of the insulating film HK which is located under the control gate electrode CG functions as the gate insulating film of the control transistor. Also, the insulating film MZ interposed between the memory gate electrode MG and the semiconductor substrate SB (p-type well PW1), i.e., the insulating film MZ under the memory gate electrode MG functions as the gate insulating film (gate insulating film having the internal charge storage portion) of the memory transistor. The side-wall insulating film SP and the insulating films ZF2 and HK which are interposed between the memory gate electrode MG and the control gate electrode CG function as insulating films for providing insulation (electrical isolation) between the memory gate electrode MG and the control gate electrode CG.

Of the insulating film MZ, the silicon nitride film MZ is the insulating film for storing charges and functions as the charge storage portion (charge storage layer). In other words, the silicon nitride film MZ2 is a trapping insulating film formed in the insulating film MZ. Accordingly, the insulating film MZ can be regarded as the insulating film having the internal charge storage portion.

The semiconductor regions MS and MD are source/drain semiconductor regions. That is, the semiconductor region MS functions as the one of the source/drain regions, while the semiconductor region MD functions as the other of the source/drain regions. The semiconductor region MS mentioned herein functions as the source region, while the semiconductor region MD functions as the drain region. Each of the semiconductor regions MS and MD is made of a semiconductor region in which an n-type impurity is introduced and has a LDD structure. That is, the source semiconductor region MS includes the $n^-$-type semiconductor region E2 (extension region) and the $n^+$-type semiconductor region H2 (source region) having an impurity concentration higher than that of the $n^-$-type semiconductor region E2. Also, the drain semiconductor region MD includes the $n^-$-type semiconductor region E1 (extension region) and the $n^+$-type semiconductor region H1 (drain region) having an impurity concentration higher than that of the $n^-$-type semiconductor region E1.

The semiconductor region MS is formed in the semiconductor substrate SB located at the position adjacent to the memory gate electrode MG in the gate length direction (gate length direction of the memory gate electrode MG). On the other hand, the semiconductor region MD is formed in the semiconductor substrate SB located at the position adjacent to the control gate electrode CG in the gate length direction (gate length direction of the control gate electrode CG).

Over the respective side walls of the memory gate electrode MG and the control gate electrode CG which are not adjacent to each other, the sidewall spacers SW1 and SW2 made of an insulator (insulating film) are formed. The sidewall spacer SW1 is formed at the position adjacent to the control gate electrode CG. Between the sidewall spacer SW1 and the control gate electrode CG, the insulating film HK is interposed. Between the sidewall spacer SW1 and the semiconductor substrate SB, the multi-layer film including the insulating films ZF1 and ZF2 is interposed. On the other hand, the sidewall spacer SW2 is formed at the position adjacent to the memory gate electrode MG. Between the sidewall spacer SW2 and the memory gate electrode MG, the multi-layer film including the side-wall insulating film SP and the insulating film ZF2 is interposed. Between the sidewall spacer SW2 and the semiconductor substrate SB, the multi-layer film including the insulating films ZF1 and ZF2 is interposed. The insulating film ZF2 interposed between the sidewall spacer SW2 and the memory gate electrode MG and the insulating film ZF2 interposed between the sidewall spacer SW2 and the semiconductor substrate SB are integrally formed. The insulating film ZF2 is preferably made of a silicon nitride film. The insulating film ZF1 is preferably made of a silicon dioxide film. The sidewall spacers SW1 and SW2 are preferably made of a silicon nitride film.

The lower-concentration $n^-$-type semiconductor region E2 of the source portion is formed under the sidewall spacer SW2. The higher-concentration $n^+$-type semiconductor region H2 of the source portion is formed outside the lower-concentration $n^-$-type semiconductor region E2. Consequently, the lower-concentration $n^-$-type semiconductor region E2 is formed so as to be adjacent to the channel region of the memory transistor. On the other hand, the higher-concentration $n^+$-type semiconductor region H2 is formed so as to be adjacent to the lower-concentration $n^-$-type semiconductor region E2 and spaced apart from the channel region of the memory transistor by a distance corresponding to the $n^-$-type semiconductor region E2.

The lower-concentration $n^-$-type semiconductor region E1 of the drain portion is formed under the sidewall spacer SW1. The higher-concentration $n^+$-type semiconductor region H1 of the drain portion is formed outside the lower-concentration $n^-$-type semiconductor region E1. Consequently, the lower-concentration n⁻-type semiconductor region E1 is formed so as to be adjacent to the channel region of the control transistor. On the other hand, the higher-concentration n⁺-type semiconductor region H1 is formed so as to be adjacent to the lower-concentration n⁻-type semiconductor region E1 and spaced apart from the channel region of the control transistor by a distance corresponding to the n⁻-type semiconductor region E1.

Under the insulating film MZ under the memory gate electrode MG, the channel region of the memory transistor is formed. On the other hand, under the insulating film HK under the control gate electrode CG, the channel region of the control transistor is formed.

In the respective upper portions of the n⁺-type semiconductor regions H1 and H2, the metal silicide layers SL are formed. The metal gate electrode MG is a so-called silicon gate electrode made of silicon (a silicon film). In the upper portion of the memory gate electrode MG, the metal silicide layer SL2 is formed. The control gate electrode is a so-called metal gate electrode made of a metal film (conductive film showing metal conduction).

<About Operations in Nonvolatile Memory>

Next, a description will be given of an example of operations in the nonvolatile memory with reference to FIG. 45.

FIG. 45 is a table showing an example of conditions under which voltages are applied to the individual portions of the selected memory cell during "Write", "Erase", and "Read" operations in the present embodiment. In the table of FIG. 45, a voltage Vmg applied to the memory gate electrode MG of a memory cell as shown in FIGS. 43 and 44, a voltage Vs applied to the source region (semiconductor region MS) thereof, a voltage Vcg applied to the control gate electrode CG thereof, a voltage Vd applied to the drain region (semiconductor region MD) thereof, and a base voltage Vb applied to the p-type well PW1 thereof during each of the "Write", "Erase", and "Read" operations are shown. Note that what is shown in the table of FIG. 45 is a preferred example of the conditions for voltage application and is not limited thereto. The conditions for voltage application can variously be changed as necessary. In the present embodiment, the injection of electrons into the silicon nitride film MZ2 as the internal charge storage portion of the insulating film MZ of the memory transistor is defined as the "Write" operation, and the injection of holes into the silicon nitride film MZ2 is defined as the "Erase" operation.

Note that, in the table of FIG. 45, the row A corresponds to the case where an SSI method is used as a write method and a BTBT method is used as an erase method. The row B corresponds to the case where the SSI method is used as the write method and a FN method is used as the erase method. The row C corresponds to the case where the FN method is used as the write method and the BTBT method is used as the erase method. The row D corresponds to the case where the FN method is used as the write method and the FN method is used as the erase method.

The SSI method can be regarded as an operation method which injects hot electrons into the silicon nitride film MZ2 to perform a write operation to the memory cell. The BTBT method can be regarded as an operation method which injects hot holes into the silicon nitride film MZ2 to perform an erase operation to the memory cell. The FN method can be regarded as an operation method which uses the tunneling of electrons or holes to perform a write operation or an erase operation. In other words, a write operation in accordance with the FN method can be regarded as an operation method which injects electrons into the silicon nitride film MZ2 using a FN tunnel effect to perform a write operation to the memory cell, and an erase operation in accordance with the FN method can be regarded as an operation method which injects holes into the silicon nitride film MZ2 using the FN tunnel effect to perform an erase operation to the memory cell. A specific description will be given below.

A write method is subdivided into a write method called the SSI (Source Side Injection) method which performs a write operation by performing hot electron injection in accordance with source side injection, and a write method called the FN (Fowler Nordheim) method which performs a write operation using FN tunneling.

A write operation in accordance with the SSI method is performed by applying, e.g., voltages as shown as "Write Operation Voltages" in the row A or B in the table of FIG. 45 to the individual portions of the selected memory cell to which the write operation is to be performed and injecting electrons into the silicon nitride film MZ2 in the insulating film MZ of the selected memory cell. At this time, hot electrons are generated in the channel region (between the source and drain regions) under the space between the two gate electrodes (memory gate electrode MG and control gate electrode CG) and injected into the silicon nitride film MZ2 as the internal charge storage portion of the insulating film MZ under the memory gate electrode MG. The injected hot electrons (electrons) are trapped by the trap level in the silicon nitride film MZ2 in the insulating film MZ, resulting in an increase in the threshold voltage of the memory transistor. That is, the memory transistor is brought into a written state.

A write operation in accordance with the FN method is performed by applying, e.g., voltages as shown as "Write Operation Voltages" in the row C or D in the table of FIG. 45 to the individual portions of the selected memory cell to which the write operation is to be performed and causing tunneling of electrons from the memory gate electrode MG in the selected memory cell and injection thereof into the silicon nitride film MZ2 in the insulating film MZ. At this time, the electrons from the memory gate electrode MG tunnel through the silicon dioxide film MZ3 by FN tunneling (under the FN tunnel effect) to be injected into the insulating film MZ and trapped by the trap level in the silicon nitride film MZ2 in the insulating film MZ, resulting in an increase in the threshold voltage of the memory transistor. That is, the memory transistor is brought into the written state.

Note that the write operation in accordance with the FN method can also be performed by causing tunneling of electrons from the semiconductor substrate SB and injection thereof into the silicon nitride film MZ2 in the insulating film MZ. In this case, the write operation voltages can be, e.g., voltages obtained by inverting the positive/negative signs of the "Write Operation Voltages" in the row C or D in the table of FIG. 45.

An erase method is subdivided into an erase method called the BTBT (Band-To-Band Tunneling phenomenon) method which performs an erase operation by hot hole injection using the BTBT, and an erase method called the FN method which performs an erase operation using the FN tunneling.

An erase operation in accordance with the BTBT method is performed by injecting holes generated by the BTBT into the charge storage portion (silicon nitride film MZ2 in the insulating film MZ). For example, voltages as shown as "Erase Operation Voltages" in the row A or C in the table of FIG. 45 are applied to the individual portions of the selected memory cell to which the erase operation is to be performed. Thus, the holes are generated using the BTBT phenomenon and subjected to electric field acceleration to be injected into the silicon nitride film MZ2 in the insulating film MZ of the selected memory cell, thus reducing the threshold voltage of the memory transistor. That is, the memory transistor is brought into an erased state.

An erase operation in accordance with the FN method is performed by applying, e.g., voltages as shown as "Erase Operation Voltages" in the row B or D in the table of FIG. 45 to the individual portions of the selected memory cell to which the erase operation is to be performed and causing tunneling of holes from the memory gate electrode MG in the selected memory cell and injection thereof into the silicon nitride film MZ2 in the insulating film MZ. At this time, the holes from the memory gate electrode MG tunnel through the silicon dioxide film MZ3 by the FN tunneling (under the FN tunnel effect) to be injected into the insulating film MZ and trapped by the trap level in the silicon nitride film MZ2 in the insulating film MZ, resulting in a reduction in the threshold voltage of the memory transistor. That is, the memory transistor is brought into an erased state.

Note that the erase operation in accordance with the FN method can also be performed by causing tunneling of holes from the semiconductor substrate SB and injection thereof into the silicon nitride film MZ2 in the insulating film MZ. In this case, as the erase operation voltages, e.g., voltages obtained by inverting the positive/negative signs of the "Erase Operation Voltages" in the row B or D in the table of FIG. 45 can be applied.

During a read operation, e.g., voltages as shown as "Read Operation Voltages" in the row A, B, C, or D in the table of FIG. 45 are applied to the individual portions of the selected memory cell to which the read operation is to be performed. By setting the voltage Vmg to be applied to the memory gate electrode MG during the read operation to a value between the threshold voltage of the memory transistor in the written state and the threshold voltage thereof in the erased state, the written state or the erased state can be determined.

<About Background to Study>

The present inventors have studied a split-gate memory cell. The split-gate memory cell includes a memory gate electrode (corresponding to the memory gate electrode MG) and a control gate electrode (corresponding to the control gate electrode CG). To the control gate electrode, a metal gate electrode is applied to offer the advantage of being able to inhibit the phenomenon in which the control gate electrode is depleted and eliminate a parasitic capacitance. The application of the metal gate electrode to the control gate electrode also offers the advantage of being able to improve a short-channel effect when the gate length of the control gate electrode is reduced. When the metal gate electrode is applied to the control gate electrode, by selecting respective materials for the metal gate electrode and the high-dielectric-constant gate insulating film, the threshold voltage of the control transistor can be adjusted. Accordingly, it is possible to reduce the amount of the impurity (channel impurity) introduced into the semiconductor substrate SB to adjust the threshold voltage and thus inhibit characteristic variations resulting from the fluctuation of the channel impurity.

On the other hand, it may be desirable not to apply a metal gate electrode to the memory gate electrode in terms of the function and reliability of the gate electrode of the memory transistor. For example, the reliability required of the memory transistor is higher than that required of the control transistor. From the viewpoint of reliability, it is easier to ensure reliability to a silicon gate electrode which has been actually used for years than to ensure reliability to the metal gate electrode. Also, when the FN method is used for an erase operation to the memory cell, in terms of the efficiency of hole generation, it is desirable that the memory gate electrode is a silicon gate electrode, not a metal gate electrode. More preferably, the memory gate electrode is a p-type or non-doped silicon gate electrode.

Accordingly, the present inventors have studied the application of a metal gate electrode to the control gate electrode and the application of not a metal gate electrode, but a silicon gate electrode to the memory gate electrode. To manufacture a semiconductor device having such a memory cell, a control gate electrode to which a metal gate electrode is applied may be formed appropriately by a so-called gate last process and a memory gate electrode to which a metal gate electrode is not applied may be formed appropriately by a so-called gate first process. In the gate first process, a gate electrode to be used in a finished product is formed and then source/drain semiconductor regions are formed. On the other hand, in the gate last process, after a dummy control gate electrode (to-be-replaced structure) is temporarily formed, source/drain semiconductor regions are formed. Then, the dummy gate electrode is removed and, in the region from which the dummy gate electrode is removed, a real gate electrode to be used in the finished product is formed. That is, the gate last process has the step of replacing the dummy gate electrode with the real gate electrode to be actually used by removing the dummy gate electrode.

Accordingly, when the memory gate electrode to which a metal gate electrode is not applied is formed by the gate first process and the control gate electrode to which a metal gate electrode is applied is formed by the gate last process, it is necessary to replace the dummy control gate electrode with the control gate electrode to be actually used by removing the dummy control gate electrode. When the dummy control gate electrode is removed, it is necessary to prevent the memory gate electrode from being removed. As a result, unless the manufacturing process is improved, it is difficult to manage the manufacturing process and perform the manufacturing process of the semiconductor device. When the manufacturing process of the semiconductor device is difficult to manage and perform, the manufacturing yield of the semiconductor device decreases to increase the manufacturing cost of the semiconductor device.

<Main Characteristic Features and Effects>

The semiconductor device in the present embodiment has the memory cells in the nonvolatile memory. Each of the memory cells is a split-gate memory cell. Specifically, the semiconductor device in the present embodiment includes the semiconductor substrate SB, the semiconductor region MS (first semiconductor region), and the semiconductor region MD (second semiconductor regions). The semiconductor regions MS and MD are for the memory cell in the nonvolatile memory and formed in the semiconductor substrate SB. The semiconductor device in the present embodiment further includes the control gate electrode CG (first gate electrode) formed over the semiconductor substrate SB located between the semiconductor regions MS and MD via the first gate insulating film (which is the insulating film MZ herein) having the charge storage portion. The semiconductor device in the present embodiment further includes the control gate electrode CG (second gate electrode) formed over the semiconductor substrate SB located between the semiconductor regions MS and MD via the second gate insulating film (which is the insulating film HK herein) and the insulating film (which is the multi-layer insulating film including the side-wall insulating film SP and the insulating films ZF2 and HK herein) formed between the memory gate electrode MG and the control gate electrode CG.

In the present embodiment, the memory cell includes the memory gate electrode MG and the control gate electrode CG. The memory gate electrode MG is formed by a so-called gate first process and the control gate electrode CG is formed by a so-called gate last process.

Accordingly, in the manufacturing process of the semiconductor device in the present embodiment, the memory gate electrode MG is formed over the semiconductor substrate SB via the insulating film MZ and the dummy control gate electrode DCG (to-be-replaced structure) is formed over the semiconductor substrate SB so as to be adjacent to the memory gate electrode MG via the insulating film (which is the multi-layer insulating film including the sidewall insulating film SP and the insulating film ZF2 herein). The insulating film MZ mentioned herein is the insulating film having the internal charge storage portion. The dummy control gate electrode DCG is the to-be-replaced structure for forming the control gate electrode CG. Then, after the insulating film SZ (first interlayer insulating film) is formed so as to cover the memory gate electrode MG and the dummy control gate electrode DCG (to-be-replaced structure), the insulating film SZ (first interlayer insulating film) is polished to expose the memory gate electrode MG and the dummy control gate electrode DCG (to-be-replaced structure). Subsequently, the dummy control gate electrode DCG (to-be-replaced structure) is removed by etching and then the control gate electrode CG (second gate electrode) is formed in the trench TR2 (first trench) as the region from which the dummy control gate electrode DCG (to-be-replaced structure) is removed.

One of the main characteristic features of the manufacturing process of the semiconductor device in the present embodiment is that the memory gate electrode MG and the dummy control gate electrode DCG (to-be-replaced structure) are made of different materials. Another one of the main characteristic features of the manufacturing process of the semiconductor device in the present embodiment is that, in the step of removing the dummy control gate electrode DCG by etching (i.e., etching step shown in FIG. 31), the etching is performed under conditions in which the memory gate electrode MG is less likely to be etched than the dummy control gate electrode DCG (to-be-replaced structure) to remove the dummy control gate electrode DCG (to-be-replaced structure).

This can reliably inhibit or prevent the memory gate electrode MG from being etched when the dummy control gate electrode DCG is removed by etching and thus improve the manufacturing yield of the semiconductor device. Therefore, it is possible to reduce the manufacturing cost of the semiconductor device. A specific description will be given below thereof with reference also to a studied example.

Figure 46:
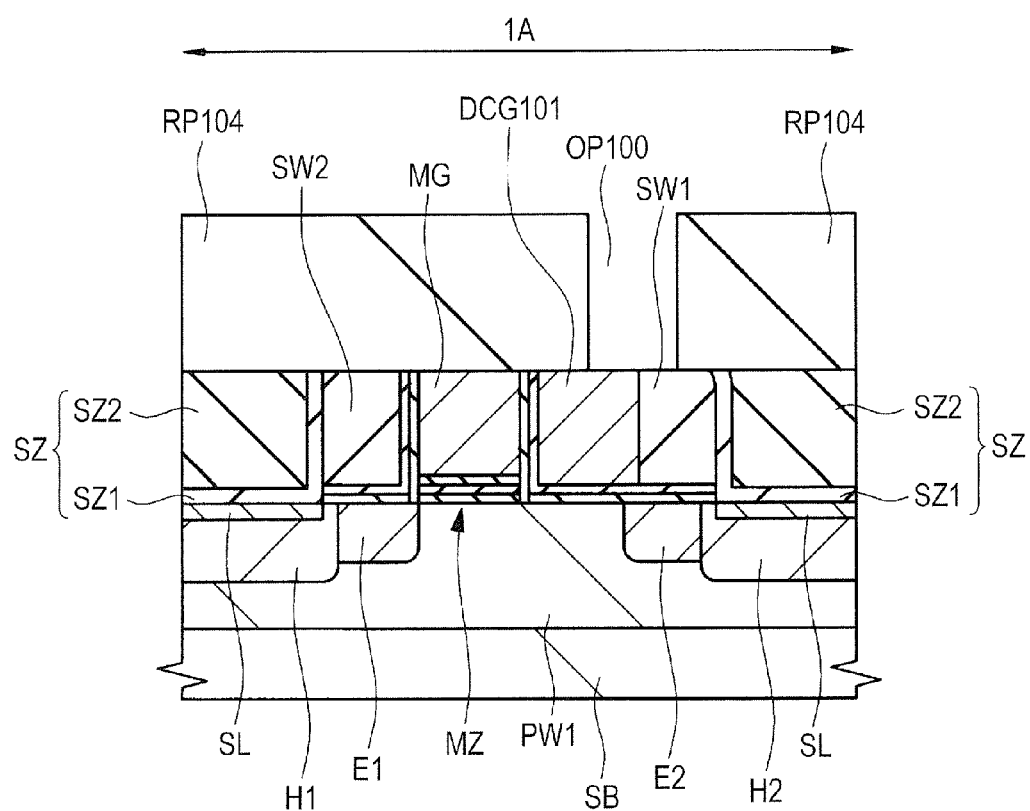
FIG. 46 is a main-portion cross-sectional view of a semiconductor device in a studied example during the manufacturing process thereof.
Figure 47:
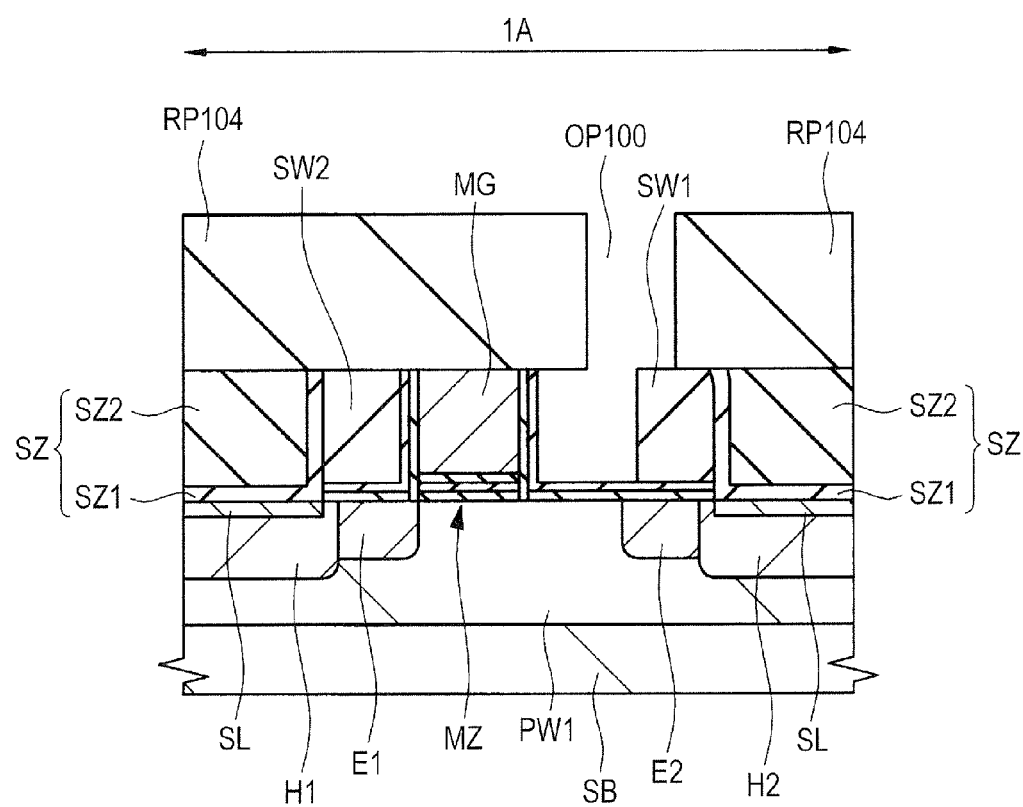
FIG. 47 is a main-portion cross-sectional view of the semiconductor device in the studied example during the manufacturing process thereof, which is subsequent to FIG. 46.

FIGS. 46 and 47 are main-portion cross-sectional views of a semiconductor device in the studied example studied by the present inventors during the manufacturing process thereof, which show main-portion cross-sectional views of the memory cell region 1A. Note that each of FIGS. 46 and 47 shows a cross-sectional region corresponding to one memory cell. FIG. 46 shows a process stage corresponding to FIG. 30 described above, which is the stage immediately before a dummy control gate electrode DCG101 is removed by etching. FIG. 47 shows a process stage corresponding to FIG. 31 described above, which is the stage immediately after the dummy control gate electrode DCG101 is removed by etching.

The dummy control gate electrode DCG101 is equivalent to the dummy control gate electrode DCG in the present embodiment. However, in the studied example shown in FIGS. 46 and 47, unlike in the present embodiment, the dummy control gate electrode DCG101 is formed of silicon. That is, in the studied example, each of the memory gate electrode MG and the dummy control gate electrode DCG101 is formed of the same material, i.e., polysilicon. Accordingly, in the case of the studied example, as shown in FIGS. 46 and 47, it is necessary to selectively remove the dummy control gate electrode DCG101 by etching using a photoresist pattern RP104 having an opening OP100 which exposes the dummy control gate electrode DCG101, but does not expose the memory gate electrode MG. By doing so, it is possible to remove the dummy control gate electrode DCG101 exposed from the opening OP100 of the photoresist pattern RP104 by etching and also prevent the memory gate electrode MG covered with the photoresist pattern RP104 from being etched.

Figure 48:
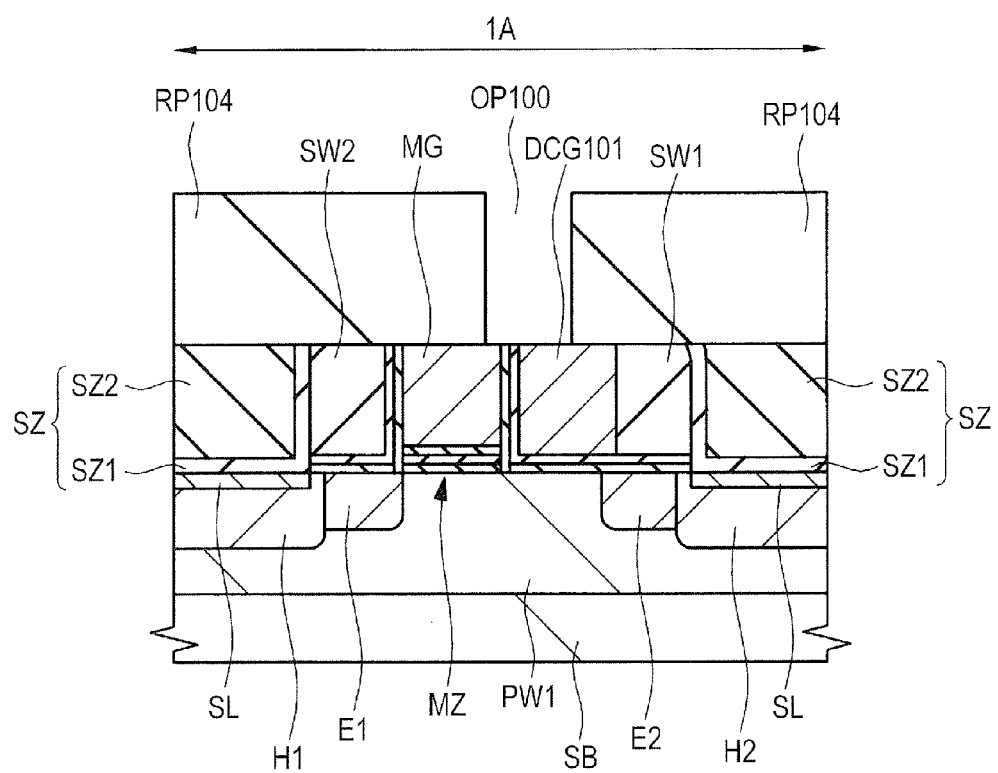
FIG. 48 is a main-portion cross-sectional view of the semiconductor device in the studied example during the manufacturing process thereof.
Figure 49:
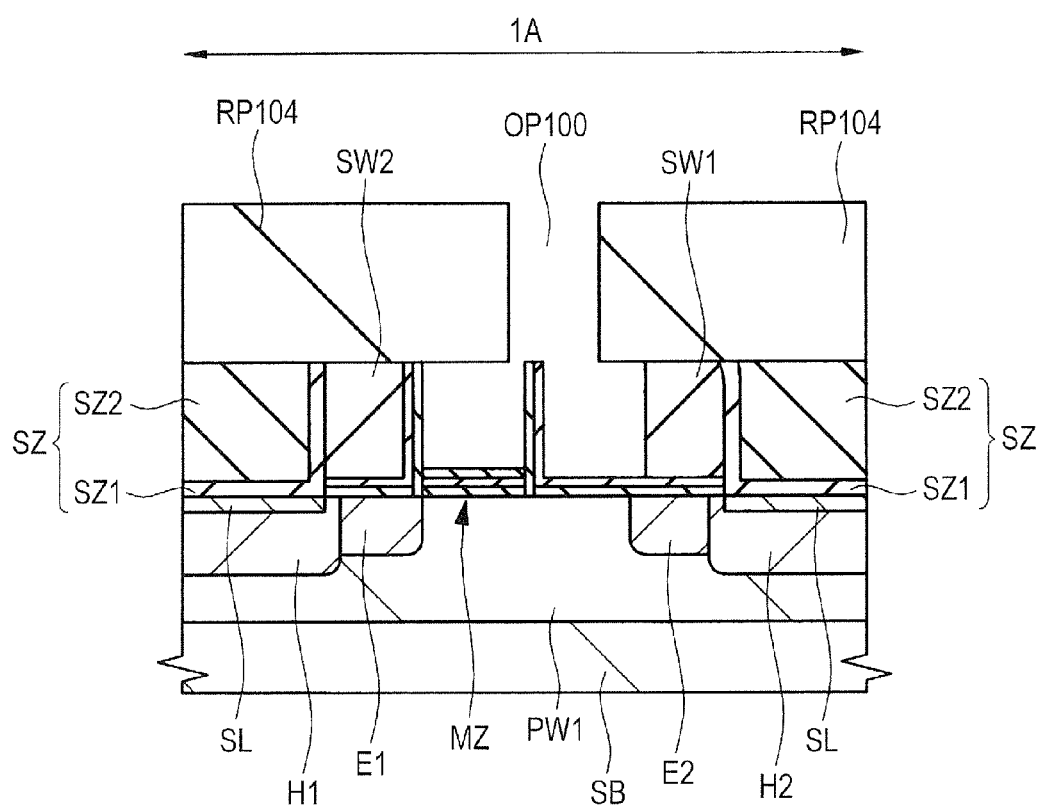
FIG. 49 is a main-portion cross-sectional view of the semiconductor device in the studied example during the manufacturing process thereof, which is subsequent to FIG. 48.

However, when a photoresist pattern is formed using a photolithographic technique, due to the misalignment of a photomask or the like, the position where the photoresist pattern is formed may be displaced from a design position. FIGS. 48 and 49 are also main-portion cross-sectional views of the semiconductor device in the studied example during the manufacturing process thereof, which show respective process stages corresponding to FIGS. 46 and 47. FIGS. 48 and 49 correspond to the case where, in the studied example shown in FIGS. 46 and 47, the position where the photoresist pattern RP104 is formed is displaced to the left in the drawing.

In the case where the position where the photoresist pattern RP104 is formed is displaced to the left as shown in FIG. 46, from the opening OP100 of the photoresist pattern RP104, not only the dummy control gate electrode DCG101, but also the memory gate electrode MG may be exposed, as shown in FIG. 48. When etching is performed in the state where not only the dummy control gate electrode DCG101, but also the memory gate electrode MG is exposed from the opening OP100 of the photoresist pattern RP104, as shown in FIG. 49, not only the dummy control gate electrode DCG101, but also the memory gate electrode MG is undesirably etched to be removed. This is because, since each of the memory gate electrode MG and the dummy control gate electrode DCG101 is formed of the same material, when not only the dummy control gate electrode DCG101, but also the memory gate electrode MG is exposed from the opening OP100 of the photoresist pattern RP104, it is impossible to selectively remove only the dummy control gate electrode DCG101 so that the memory gate electrode MG is also etched.

Figure 50:
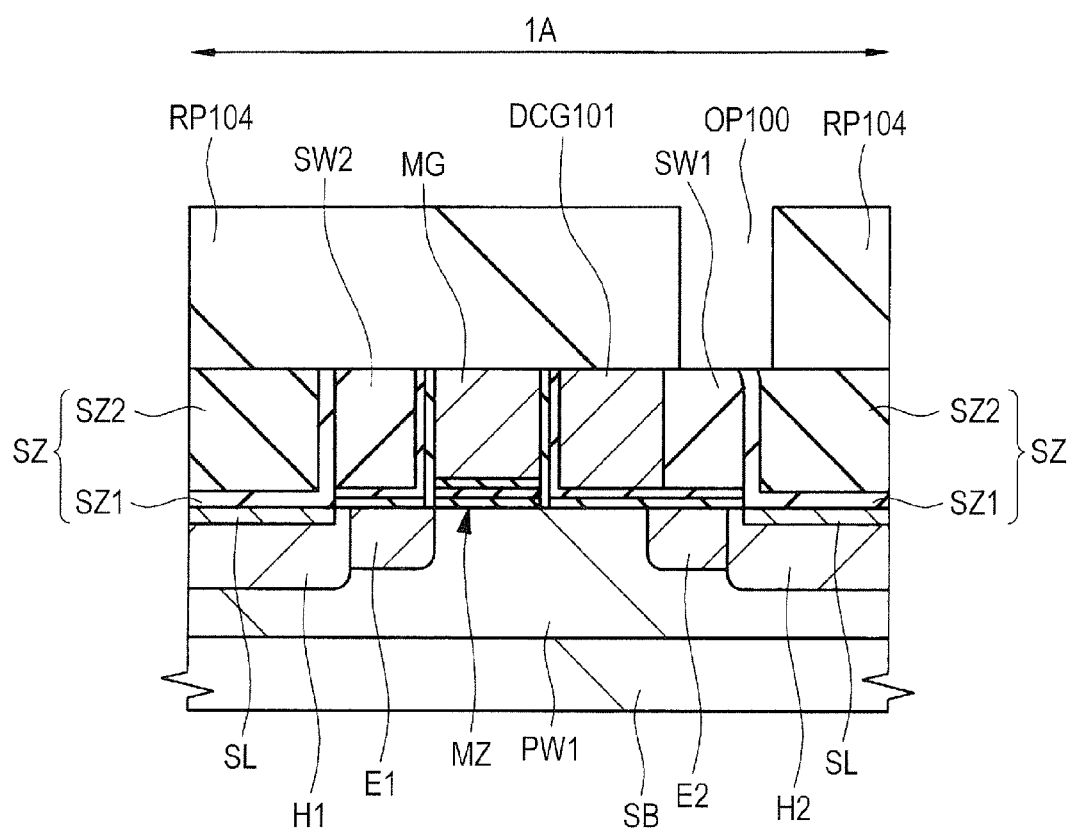
FIG. 50 is a main-portion cross-sectional view of the semiconductor device in the studied example during the manufacturing process thereof.

To prevent the memory gate electrode MG from being exposed from the opening OP100 of the photoresist pattern RP104 even when the position where the photoresist pattern RP104 is formed is displaced, it is necessary to locate the opening OP100 of the photoresist pattern RP104 at a given distance from the memory gate electrode MG. However, when the opening OP100 of the photoresist pattern RP104 is located at a given distance from the memory gate electrode MG, if the position where the photoresist pattern RP104 is placed is conversely displaced to the right in FIG. 46, neither the memory gate electrode MG nor dummy control gate electrode DCG101 is exposed from the opening OP100 of the photoresist pattern RP104, as shown in FIG. 50. FIG. 50 is also a main-portion cross-sectional view of the semiconductor device in the studied example during the manufacturing process thereof and shows the process stage corresponding to FIG. 46. FIG. 50 corresponds to the case where the position where the photoresist pattern RP104 is formed in the studied example shown in FIG. 46 is displaced to the right in the drawing.

As shown in FIG. 50, when neither the memory gate electrode MG nor the dummy control gate electrode DCG101 is exposed from the opening OP100 of the photoresist pattern RP104, even though the etching step is performed, the dummy control gate electrode DCG101 is not etched and cannot be removed. As a result, even when the etching step is ended, the structure shown in FIG. 50 is maintained so that not only the memory gate electrode MG, but also the dummy control gate electrode DCG101 remains.

In the case of the studied example in which each of the memory gate electrode MG and the dummy control gate electrode DCG101 is made of the same material, even when the position where the photoresist pattern RP104 is formed is not displaced, it is difficult to increase the area of the upper surface of the dummy control gate electrode DCG101 exposed from the opening OP100 of the photoresist pattern RP104. The reason for this is as follows. To prevent the memory gate electrode MG from being exposed from the opening OP100 of the photoresist pattern RP104, it is necessary to locate the opening OP100 at a given distance from the memory gate electrode MG. However, when the opening OP100 is located at a given distance from the memory gate electrode MG, the area of the upper surface of the dummy control gate electrode DCG101 exposed from the opening OP100 is reduced. When the area of the upper surface of the dummy control gate electrode DCG101 exposed from the opening OP100 of the photoresist pattern RP104 is reduced, during the etching of the dummy control gate electrode DCG101, an etching residue of the dummy control gate electrode DCG101 is likely to be left. To appropriately perform the subsequent manufacturing process, it is desirable to prevent an etching residue of the dummy control gate electrode DCG101 from being left. However, when the area of the upper surface of the dummy control gate electrode DCG101 exposed from the opening OP100 of the photoresist pattern RP104 is to be increased, not only the dummy control gate electrode DCG101, but also the memory gate electrode MG is likely to be exposed from the opening OP100 of the photoresist pattern RP104.

Thus, in the case of the studied example, each of the memory gate electrode MG and the dummy control gate electrode DCG101 is made of the same material. Accordingly, it is not allowed to perform the step of etching the dummy control gate electrode DCG101 in the state where both of the memory gate electrode MG and the dummy control gate electrode DCG101 are exposed, which leads to various constraints. As a result, it is difficult to manage the manufacturing process and perform the manufacturing process of the semiconductor device. This incurs a reduction in the manufacturing yield of the semiconductor device and an increase in the manufacturing cost of the semiconductor device.

By contrast, in the present embodiment, it is necessary to selectively remove the dummy control gate electrode DCG without removing the memory gate electrode MG. However, since the memory gate electrode MG and the dummy control gate electrode DCG are formed of different materials, it is allowed to perform the step of etching the dummy control gate electrode DCG in the state where both of the memory gate electrode MG and the dummy control gate electrode DCG are exposed. By making the memory gate electrode MG and the dummy control gate electrode DCG of different materials and performing etching under conditions in which the memory gate electrode MG is less likely to be etched than the dummy control gate electrode DCG, even when the etching is performed in the state where both of the memory gate electrode MG and the dummy control gate electrode DCG are exposed, it is possible to selectively etch away the dummy control gate electrode DCG. This allows the dummy control gate electrode DCG to be appropriately removed and can reliably inhibit or prevent the memory gate electrode MG from being etched.

That is, in the present embodiment, it is sufficient to prevent the case where neither the memory gate electrode MG nor the dummy control gate electrode DCG is exposed from the opening OP of the photoresist pattern RP4. As long as the dummy control gate electrode DCG is exposed from the opening OP of the photoresist pattern RP4, it is possible to allow each of the cases where the memory gate electrode MG is exposed and where the memory gate electrode MG is not exposed. That is, in the step of etching the dummy control gate electrode DCG (etching step shown in FIG. 31), each of the cases where the dummy control gate electrode DCG is exposed from the opening OP of the photoresist pattern RP4, but the memory gate electrode MG is not exposed therefrom and where both of the memory gate electrode MG and the dummy control gate electrode DCG are exposed is allowed.

Thus, in the present embodiment, the memory gate electrode MG and the dummy control gate electrode DCG are formed of different materials. As a result, it is allowed to perform the step of etching the dummy control gate electrode DCG in the state where both of the memory gate electrode MG and the dummy control gate electrode DCG are exposed. This reduces constraints associated with selective removal of the dummy control gate electrodes DCG and facilitates the management of the manufacturing process. Consequently, the manufacturing process of the semiconductor device is more easily performed to allow an improvement in the manufacturing yield of the semiconductor device and a reduction in the manufacturing cost of the semiconductor device.

In addition, in the present embodiment, it is possible to allow the memory gate electrode MG to be exposed from the opening OP in the photoresist pattern RP4. This eliminates the need to locate the opening OP of the photoresist pattern RP4 at a distance from the memory gate electrode MG and can therefore increase the area of the upper surface of the dummy control gate electrode DCG exposed from the opening OP of the photoresist pattern RP4. Since the area of the upper surface of the dummy control gate electrode DCG exposed from the opening OP of the photoresist pattern RP4 can be increased, in the etching step shown in FIG. 31, it is possible to reliably prevent an etching residue of the dummy control gate electrode DCG from being left. This facilitates the management of the etching step shown in FIG. 31 and allows the etching step shown in FIG. 31 to be more easily performed. Therefore, it is possible to achieve an improvement in the manufacturing yield of the semiconductor device and a reduction in the manufacturing cost of the semiconductor device.

When a comparison is made between the case where the memory gate electrode MG is exposed from the opening OP of the photoresist pattern RP4 and the case where the memory gate electrode MG is not exposed from the opening OP of the photoresist pattern RP4, it is easier to increase the area of the upper surface of the dummy control gate electrode DCG exposed from the opening OP of the photoresist pattern RP4 in the case where the memory gate electrode MG is exposed from the opening OP of the photoresist pattern RP4. Accordingly, in the present embodiment, in the etching step shown in FIG. 31, the etching is preferably performed in the state where the memory gate electrodes MG and the dummy control gate electrodes DCG are exposed to remove the dummy control gate electrodes DCG. More specifically, in the etching step shown in FIG. 31, the etching is preferably performed in the state where the photoresist pattern RP4 (mask layer) having the openings OP each exposing at least a portion of the memory gate electrode MG and at least a portion of the dummy control gate electrode DCG is formed over the insulating film SZ to remove the dummy control gate electrodes DCG. That is, the etching is preferably performed in the state where at least a portion of the memory gate electrode MG and at least a portion of the dummy control gate electrode DCG are exposed from each of the openings OP of the photoresist pattern RP4 to remove the dummy control gate electrodes DCG. By exposing not only the dummy control gate electrode DCG, but also the memory gate electrode MG from the opening OP, the area of the upper surface of the dummy control gate electrode DCG exposed from the opening OP of the photoresist pattern RP4 can be increased. This can more reliably prevent an etching residue of the dummy control gate electrode DCG from being left in the etching step shown in FIG. 31. As a result, it is easier to manage the etching step shown in FIG. 31 and perform the etching step shown in FIG. 31. Therefore, it is possible to achieve an improvement in the manufacturing yield of the semiconductor device and a reduction in the manufacturing cost of the semiconductor device.

In the present embodiment, in the step of removing the dummy control gate electrode DCG by etching (i.e., etching step shown in FIG. 31), the etching is performed under conditions in which the memory gate electrode MG is less likely to be etched than the dummy control gate electrode DCG. At this time, it is desirable to minimize the etching of the memory gate electrode MG. Accordingly, it is desirable to select respective materials for the dummy control gate electrode DCG and the memory gate electrode MG so as to allow the dummy control gate electrode DCG to be etched at a high selectivity. From this viewpoint, the memory gate electrode MG is preferably made of silicon (a silicon film) and the dummy control gate electrode DCG is preferably made of an insulating film. More preferably, the dummy control gate electrode DCG is made of silicon dioxide (a silicon dioxide film). This allows the dummy control gate electrode DCG to be etched at a high selectivity in the etching step shown in FIG. 31, while reliably inhibiting or preventing the memory gate electrode MG from being etched.

When the dummy control gate electrode DCG is made of an insulator, in the step of forming the foregoing metal silicide layers SL, the metal silicide layer SL is not formed in the upper portion of the dummy control gate electrode DCG. This eliminates the need to polish the metal silicide layer SL when the dummy control gate electrode DCG is exposed in the polishing step shown in FIG. 25 and eliminates a problem (such as scratch) resulting from the polishing of the metal silicide layer SL.

In the present embodiment, the metal gate electrode MG is preferably a silicon gate electrode and the control gate electrode is preferably a metal gate electrode. This can achieve an effect as described in the foregoing "About Background to Study" section. In addition, since the memory gate electrode MG is made of the silicon gate electrode, when the present embodiment is applied to the case where holes are injected from the memory gate electrode MG into the charge storage portion of the insulating film MZ to perform erasing to the memory cell in an erase operation to the memory (in the case of performing erasing in accordance with the FN method), the effect is particularly significant. In the case of performing erasing in accordance with the FN method, to enhance the efficiency of hole generation, the memory gate electrode MG is more preferably a p-type or non-doped silicon gate electrode. Most preferably, the memory gate electrode MG is a silicon gate electrode (gate electrode made of a p-type silicon film).

When the memory gate electrode MG is a p-type silicon gate electrode, to prevent fluctuations in effective p-type impurity concentration, it is desirable to prevent an n-type impurity from being implanted into the memory gate electrode MG in the ion implantation of an n-type impurity for forming the $n^+$-type semiconductor regions H1 and H2 or the like. Accordingly, the ion implantation of an n-type impurity for forming the $n^+$-type semiconductor regions H1 and H2 or the like is preferably performed in the state where the cap insulating film CP1 is formed over the memory gate electrode MG. This can inhibit or prevent an n-type impurity from being implanted into the memory gate electrode MG in the ion implantation of an n-type impurity for forming the $n^+$-type semiconductor regions H1 and H2 or the like. As a result, it is possible to prevent fluctuations in the effective p-type impurity concentration of the memory gate electrode MG made of the p-type silicon gate electrode and prevent fluctuations in the properties of the nonvolatile memory. Therefore, it is possible to improve the reliability of the semiconductor device having the nonvolatile memory.

More preferably, the metal silicide layer SL2 is formed in the upper portion of the memory gate electrode MG as the silicon gate electrode. This can reduce the resistance of the memory gate electrode MG as the silicon gate electrode. Consequently, it is possible to improve the performance of the semiconductor device having the nonvolatile memory and improve, e.g., the operation speed thereof.

Also, in the present embodiment, after the dummy control gate electrodes DCG are removed in the etching step shown in FIG. 31, the control gate electrode CG is formed in each of the trenches TR2 as the regions from which the dummy control gate electrodes DCG are removed via the insulating film HK containing a metal element and oxygen as constituent elements. Since the insulating film HK is formed after the removal of the dummy control gate electrodes DCG, the insulating film HK is formed not only between each of the control gate electrodes CG and the semiconductor substrate SB, but also between each of the memory gate electrodes MG and the control gate electrode CG. When the insulating film HK containing a metal element and oxygen as constituent elements is formed also between the memory gate electrode MG and the control gate electrode CG, it is preferable that, between the memory gate electrode MG and the control gate electrode CG, not only the insulating film HK, but also a silicon oxynitride film (which is the side-wall insulating film SP herein) and a silicon nitride film (which is the insulating film ZF2 herein) are interposed. It is also preferable that, between the memory gate electrode MG and the control gate electrode CG, a silicon oxynitride film (which is the side-wall insulating film SP herein) is adjacent to the memory gate electrode and the insulating film HK is adjacent to the control gate electrode CG and, between the insulating film HK and the silicon oxynitride film (which is the side-wall insulating film SP herein), the silicon nitride film (which is the insulating film ZF2 herein) is interposed. The following will describe the reason for this.

To prevent a short circuit between each of the memory gate electrodes MG and the control gate electrode CG, it is necessary to interpose a single-layer or multi-layer insulating film between the memory gate electrode MG and the control gate electrode CG. Since the insulating film HK functions as a gate insulating film, it is desirable to optimally set the thickness of the insulating film HK in consideration of the function of the gate insulating film. When only the insulating film HK is interposed between the memory gate electrode MG and the control gate electrode CG, if the thickness of the insulating film HK is set in consideration of the function of the gate insulating film, the thickness of the insulating film interposed between the memory gate electrode MG and the control gate electrode CG is reduced to reduce the breakdown voltage between the memory gate electrode MG and the control gate electrode CG. Accordingly, it is desirable to interpose not only the insulating film HK, but also another insulating film between the memory gate electrode MG and the control gate electrode CG and thus enhance breakdown voltage between the memory gate electrode MG and the control gate electrode CG. However, since the insulating film HK is the high-dielectric-constant insulating film, specifically a metal oxide film containing a metal element and oxygen as constituent elements, the insulating film HK is likely to be oxidized and susceptible to the influence of oxygen.

Accordingly, between each of the memory gate electrodes MG and the control gate electrode CG, not only the insulating film HK, but also the silicon nitride film (insulating film ZF2) is interposed such that, between the memory gate electrode MG and the control gate electrode CG, the surface of the insulating film HK which is opposite to the surface thereof in contact with the control gate electrode CG comes in contact with the silicon nitride film (insulating film ZF2). That is, between the insulating film HK and the control gate electrode CG, the silicon nitride film (insulating film ZF2) is interposed to provide contact between the insulating film HK and the silicon nitride film (insulating film ZF2). As a result, between the memory gate electrode MG and the control gate electrode CG, the insulating film HK susceptible to the influence of oxygen is in contact with the control gate electrode made of the metal gate electrode and the silicon nitride film (insulating film ZF2). Neither the control gate electrode made of the metal gate electrode nor the silicon nitride film serves as an oxygen supply source. Accordingly, the insulating film HK is less likely to be affected by oxygen so that the insulating film HK is less likely to be oxidized in various subsequent high-temperature steps after the formation of the insulating film HK. This can inhibit or prevent the properties of the insulating film HK from being changed under the influence of oxygen and improve the reliability of the semiconductor device.

On the other hand, a silicon nitride film tends to easily trap (capture) charges. Accordingly, when the silicon nitride film (insulating film ZF2) interposed between each of the memory gate electrodes MG and the control gate electrode CG is in contact with the memory gate electrode MG, a phenomenon may occur in which charges are injected from the memory gate electrode into the silicon nitride film (insulating film ZF2) and trapped thereby. When charges are trapped by the silicon nitride film (insulating film ZF2) interposed between the memory gate electrode MG and the control gate electrode CG, the properties of the memory transistor may change. Therefore, it is desirable to prevent charges from being trapped.

Accordingly, not only the insulating film HK and the silicon nitride film (insulating film ZF2), but also the silicon oxynitride film (side-wall insulating film SP) is interposed between each of the memory gate electrodes MG and the control gate electrode CG such that the silicon oxynitride film (side-wall insulating film SP) comes in contact with the memory gate electrode between the memory gate electrode MG and the control gate electrode CG. That is, between the memory gate electrode MG and the control gate electrode CG, the silicon oxynitride film (side-wall insulating film SP) is interposed between the silicon nitride film (insulating film ZF2) and the memory gate electrode to prevent the memory gate electrode MG from coming in contact with the silicon nitride film (insulating film ZF2). Thus, even when the silicon nitride film (insulating film ZF2) is interposed between the memory gate electrode MG and the control gate electrode CG, it is possible to inhibit or prevent charges from being injected from the memory gate electrode MG into the silicon nitride film (insulating film ZF2). In addition, since a silicon oxynitride film has a breakdown voltage per unit thickness larger than that of a silicon nitride film, by also interposing the silicon oxynitride film (side-wall insulating film SP) between the memory gate electrode MG and the control gate electrode CG, it is possible to efficiently improve the breakdown voltage between the memory gate electrode MG and the control gate electrode CG.

Thus, it is preferable to interpose not only the insulating film HK, but also the silicon oxynitride film (side-wall insulating film SP) and the silicon nitride film (insulating film ZF2) between each of the memory gate electrodes MG and the control gate electrode CG. It is also preferable that, between the memory gate electrode MG and the control gate electrode CG, the silicon oxynitride film (side-wall insulating film SP) is adjacent to the memory gate electrode and the insulating film HK is adjacent to the control gate electrode CG and, between the insulating film HK and the silicon oxynitride film (side-wall insulating film SP), the silicon nitride film (insulating film ZF2) is interposed. In this manner, it is possible to increase the thickness of the insulating films interposed between the memory gate electrode MG and the control gate electrode CG to a given value and increase the breakdown voltage between the memory gate electrode MG and the control gate electrode CG. In addition, the insulating film HK is less likely to be affected by oxygen and charges are less likely to be trapped by the insulating film between the memory gate electrode MG and the control gate electrode CG. Therefore, it is possible to improve the reliability of the semiconductor device having the nonvolatile memory.

More preferably, the silicon oxynitride film (which is the side-wall insulating film SP herein) is formed not only over the side surface of each of the memory gate electrodes MG which is adjacent to the control gate electrode CG, but also over the side surface of the memory gate electrode MG which is adjacent to the sidewall spacer SW2 so as to come in contact with the memory gate electrode MG. By thus forming the silicon oxynitride film, the side surface of the memory gate electrode MG which is adjacent to the sidewall spacer SW2 is also kept from coming in contact with the insulating film ZF2 and the sidewall spacer SW2 each made of silicon nitride. This can prevent charges from being injected from the memory gate electrode MG into the sidewall spacer SW2.

The side-wall insulating films SP are preferably made of a silicon oxynitride film. This is intended to inhibit or prevent the side-wall insulating films SP from being etched when the dummy control gate electrodes DCG made of silicon dioxide are removed in the etching step shown in FIG. 31. That is, in the etching step shown in FIG. 31, the etching is preferably performed under conditions in which the side-wall insulating films SP are less likely to be etched than the dummy control gate electrodes DCG. In the case where the side-wall insulating films SP are made of a silicon dioxide film, when the dummy control gate electrodes DCG made of silicon dioxide are removed in the etching step shown in FIG. 31, the side-wall insulating films SP may also be etched to be removed. When the side-wall insulating films SP are removed in the etching step shown in FIG. 31, it is difficult to perform the subsequent process steps. Therefore, it is desirable to prevent the side-wall insulating films SP from being removed. However, when the side-wall insulating films SP are made of a silicon nitride film, the phenomenon may occur in which charges are injected from the memory gate electrodes MG into the side-wall insulating films SP and trapped thereby.

Accordingly, the side-wall insulating films SP are preferably made of a silicon oxynitride film. By doing so, even when the dummy control gate electrodes DCG are made of silicon dioxide, it is possible to inhibit or prevent the side-wall insulating films SP from being etched in the etching step shown in FIG. 31, while selectively removing the dummy control gate electrodes DCG. In addition, it is also possible to reduce the possibility of the occurrence of the phenomenon in which charges are injected from the memory gate electrodes MG into the side-wall insulating films SP and trapped thereby. Therefore, when the dummy control gate electrodes DCG are made of an insulating material other than silicon dioxide, each of the side-wall insulating films SP may also be a silicon dioxide film.

Note that a silicon oxynitride film (SiON film) has a refractive index which varies depending on the content of nitrogen thereof. Therefore, the content of nitrogen of the silicon oxynitride film can be determined on the basis of the refractive index thereof. That is, it is difficult to directly measure the content of nitrogen of the silicon oxynitride film, but the refractive index can be used to determine the content of nitrogen. In the present embodiment, when the side-wall insulating film SP is made of a silicon oxynitride film (SiON film), the refractive index of the side-wall insulating film SP (silicon oxynitride film forming the side-wall insulating film SP) is preferably in the range of 1.53 to 1.70. When the refractive index of the side-wall insulating film SP is in the range of 1.53 to 1.70, it is possible to reliably inhibit or prevent the side-wall insulating films SP from being etched, while selectively removing the dummy control gate electrodes DCG made of silicon dioxide in the etching step shown in FIG. 31. In addition, it is also possible to inhibit or prevent the occurrence of the phenomenon in which charges are injected from the memory gate electrodes MG into the side-wall insulating films SP and trapped thereby.

Also, in the present embodiment, at the process stage (see FIG. 10) where the dummy control gate electrodes PCG are formed, between each of the dummy control gate electrodes DCG and the multi-layer body LM1 (memory gate electrode MG) adjacent thereto, the multi-layer film including the side-wall insulating film SP (silicon oxynitride film) adjacent to the multi-layer body LM1 (memory gate electrode MG) and the insulating film ZF2 (silicon nitride film) adjacent to the dummy control gate electrode DCG is interposed. Consequently, at the process stage (see FIG. 36) where the control gate electrodes CG are formed after the removal of the dummy control gate electrodes DCG, between each of the control gate electrodes CG and the memory gate electrode MG adjacent thereto, the side-wall insulating film SP (silicon oxynitride film), the insulating film ZF2 (silicon nitride film), and the insulating film HK (insulating film containing a metal and oxygen as constituent elements) are interposed. At this time, between the memory gate electrode MG and the control gate electrode CG, the side-wall insulating film SP (silicon oxynitride film) is adjacent to the memory gate electrode MG and the insulating film HK is adjacent to the control gate electrode and, between the insulating film HK and the side-wall insulating film SP, the insulating film ZF2 (silicon nitride film) is interposed. Such a state is maintained even in the manufactured semiconductor device.

Also, in the present embodiment, the insulating film MZ having the charge storage portion is formed between the semiconductor substrate SB and each of the memory gate electrodes MG, but is not formed between the memory gate electrode MG and the control gate electrode CG. As a result, it is possible to independently determine the space between the memory gate electrode MG and the control gate electrode CG without depending on the thickness of the insulating film MZ between the semiconductor substrate SB and the memory gate electrode MG. This allows easy optimization of the properties of the memory cell.

Next, a description will be given of a preferred position where each of the openings OP of the photoresist pattern RP4 (mask layer) used in the etching step shown in FIG. 31 is located.

The opening OP of the photoresist pattern RP4 has an inner wall OP1 (first inner wall) and an inner wall OP2 (second inner wall) which face each other in a memory gate length direction. The memory gate length direction mentioned herein corresponds to the gate length direction of each of the memory gate electrodes MG and is a lateral direction in FIG. 30. Accordingly, the inner walls OP1 and OP2 face each other in the gate length direction of the memory gate electrode MG. Note that the gate length direction of each of the control gate electrodes CG formed after the removal of the dummy control gate electrodes DCG is substantially the same as the gate length direction of the memory gate electrode MG. Of the inner walls OP1 and OP2 of the opening OP, the inner wall OP1 is located closer to the drain region (closer to the $n^+$-type semiconductor region H1) and the inner wall OP2 is located closer to the source region (closer to the $n^+$-type semiconductor region H2).

When a comparison is made between a size S1 of each of the dummy control gate electrodes DCG in the memory gate length direction and a size S2 of each of the sidewall spacers SW1 in the memory gate length direction and when the size S2 of the sidewall spacer SW1 is smaller than the size S1 of the dummy control gate electrode DCG (i.e., when S1>S2 is satisfied), the inner wall OP1 is preferably located over the dummy control gate electrode DCG. On the other hand, when the size S1 of the dummy control gate electrode DCG is smaller than the size S2 of the sidewall spacer SW1 (i.e., when S1<S2 is satisfied), the inner wall OP1 is preferably located over the sidewall spacer SW1.

In the present embodiment, the dummy control gate electrodes DCG and the sidewall spacers SW1 are formed of different materials and, in the etching step shown in FIG. 31, the etching is performed under conditions in which the sidewall spacers SW1 are less likely to be etched than the dummy control gate electrodes DCG. Accordingly, at the process stage immediately before the etching step shown in FIG. 31 is performed, the dummy control gate electrodes DCG should necessarily be exposed from the openings OP of the photoresist pattern RP4. However, the sidewall spacers SW1 may be or may not be exposed from the openings OP of the photoresist pattern RP4. On the other hand, since it is not desirable that the interlayer insulating film (which is the insulating film SZ) is etched in the etching step shown in FIG. 31, it is preferable to prevent the interlayer insulating film (which is the insulating film SZ herein) from being exposed from the openings OP of the photoresist pattern RP4. Consequently, the inner wall OP1 of each of the openings OP is located either over the dummy control gate electrode DCG or over the sidewall spacer SW1. However, due to the misalignment of the photomask or the like, the position where the photoresist pattern RP4 is formed may be displaced from the design position. Even when such a displacement occurs, it is necessary to maintain the state where the dummy control gate electrodes DCG are exposed from the openings OP of the photoresist pattern RP4. Additionally, even when such a displacement occurs, it is desirable to prevent the interlayer insulating film from being exposed from the openings OP of the photoresist pattern RP4. That is, even when the photoresist pattern RP4 is displaced, it is desirable to set the design position of the inner wall OP1 of each of the openings OP such that the inner wall OP1 is located over the dummy control gate electrode DCG or over the sidewall spacer SW1 and increase a margin for the displacement of the photoresist pattern RP4.

A case is assumed herein where the size S2 of the sidewall spacer SW1 is smaller than the size S1 of the dummy control gate electrode DCG (i.e., case where S1>S2 is satisfied). In this case, when the inner wall OP1 is located over the sidewall spacer SW1 having the smaller size in the memory gate length direction, the distance (space) from the inner wall OP1 to the interlayer insulating film (which is the insulating film SZ herein) is reduced. This reduces the margin for the displacement of the photoresist pattern RP4. On the other hand, a case is assumed where the size S1 of the dummy control gate electrode DCG is smaller than the size S2 of the sidewall spacer SW1 (i.e., where S1<S2 is satisfied). In this case, when the inner wall OP1 is located over the dummy control gate electrode DCG having the smaller size in the memory gate length direction, the distance (space) from the inner wall OP1 to the memory gate electrode MG is reduced. This reduces the margin for the displacement of the photoresist pattern RP4. That is, when the openings OP are designed such that the inner wall OP1 of each of the openings OP is located over the one of the dummy control gate electrode DCG and the sidewall spacer SW1 which has the smaller size in the memory gate length direction, the margin for the displacement of the photoresist pattern RP4 is reduced.

Accordingly, the openings OP are preferably designed such that the inner wall OP1 of each of the openings OP is located over, not the one of the dummy control gate electrode DCG and the sidewall spacer SW1 which has the smaller size in the memory gate length direction, but the other one of the dummy control gate electrode DCG and the sidewall spacer SW1 which has the larger size in the memory gate length direction. That is, when the size S2 of the sidewall spacer SW1 is smaller than the size S1 of the dummy control gate electrode DCG (S1>S2), the inner wall OP1 is preferably located over the dummy control gate electrode DCG. On the other hand, when the size S1 of the dummy control gate electrode DCG is smaller than the size S2 of the sidewall spacer SW1 (S1<S2), the inner wall OP1 is preferably located over the sidewall spacer SW1. By thus locating the inner wall OP1, even when the photoresist pattern RP4 is displaced, the inner wall OP1 of each of the openings OP is more likely to be located over the dummy control gate electrode DCG or the sidewall spacer SW1. This can increase the margin for the displacement of the photoresist pattern RP4. As a result, the management of the manufacturing process is facilitated to allow the manufacturing process of the semiconductor device to be more easily performed. Therefore, it is possible to achieve an improvement in the manufacturing yield of the semiconductor device and a reduction in the manufacturing cost of the semiconductor device.

More preferably, a distance (space) S3 from an end portion (end portion closer to the memory gate electrode MG) of the upper surface of the dummy control gate electrode DCG exposed from each of the openings OP to the inner wall OP1 of the opening OP is about one half of the total of the size S1 of the dummy control gate electrode DCG and the size S2 of the sidewall spacer SW1. That is, $S3=(S1+S2)/2$ is more preferably satisfied. Note that the distance S3 is a distance in the memory gate length direction. From another perspective, the inner wall OP1 of each of the openings OP is more preferably located at a middle position in a combination of the dummy control gate electrode DCG and the sidewall spacer SW1 adjacent thereto in the memory gate length direction. This can most efficiently increase the margin for the displacement of the photoresist pattern RP4. Even when the photoresist pattern RP4 is displaced, it is possible to locate the inner wall OP1 of each of the openings OP over the dummy control gate electrode DCG or over the sidewall spacer SW1.

The inner wall OP2 of each of the openings OP of the photoresist pattern RP4 is preferably located over the memory gate electrode MG. The following is a description of the reason for this.

In the etching step shown in FIG. 31, even when the inner wall OP2 of each of the openings OP is located over any of the memory gate electrode MG, the sidewall spacer SW1, the dummy control gate electrode DCG, and the insulating film interposed between the memory gate electrode MG and the dummy control gate electrode DCG, it is possible to selectively remove the dummy control gate electrodes DCG. However, even when the photoresist pattern RP4 is displaced due to the misalignment of the photomask or the like, it is necessary to maintain the state where the dummy control gate electrodes DCG are exposed from the openings OP of the photoresist pattern RP4. Additionally, even when such a displacement occurs, it is desirable to prevent the interlayer insulating film (SZ) from being exposed from the openings OP of the photoresist pattern RP4. Accordingly, the inner wall OP2 of each of the openings OP of the photoresist pattern RP4 is preferably located over the memory gate electrode MG. By setting the design position of the inner wall OP2 of each of the openings OP over the memory gate electrode MG, even when the photoresist pattern RP4 is displaced to displace the position of the inner wall OP2 of the opening OP to over the dummy control gate electrode DCG or over the sidewall spacer SW1, the dummy control gate electrode DCG can selectively be etched to be removed. By thus setting the design position of the inner wall OP2 of each of the openings OP over the memory gate electrode MG, the margin for the displacement of the photoresist pattern RP4 can be increased. This facilitates the management of the manufacturing process to allow the manufacturing process of the semiconductor device to be more easily performed. Therefore, it is possible to achieve an improvement in the manufacturing yield of the semiconductor device and a reduction in the manufacturing cost of the semiconductor device.

Even when the photoresist pattern RP 4 is displaced due to the misalignment of the photomask or the like, it is desirable to prevent the interlayer insulating film (SZ) from being exposed from the openings OP of the photoresist pattern RP4. For this purpose, the sidewall spacers SW1 and SW2 preferably have large widths. On the other hand, when the width of each of the sidewall spacers SW3 for the MISFET for the peripheral circuit is increased to be larger than necessary, the area used for the MISFET is increased disadvantageously for a reduction in the size of the semiconductor device.

Accordingly, there may be a case where the respective widths (W1 and W2) of the sidewall spacers SW1 and SW2 are set larger than the width (W3) of the sidewall spacer SW3 (i.e., W1>W3 and W2>W3 are satisfied). By setting the respective widths of the sidewall spacers SW1 and SW2 larger than the width of the sidewall spacer SW3, it is possible to set the width of the sidewall spacer SW3 to a value taking account of the properties required of the MISFET for the peripheral circuit. It is also possible to increase the respective widths of the sidewall spacers SW1 and SW2 and increase the margin for the displacement of the photoresist pattern RP4. Thus, it is possible to improve the margin for the displacement of the photoresist pattern RP4, while preventing an increase in the area used for the MISFET for the peripheral circuit.

The respective widths (W1 and W2) of the sidewall spacers SW1 and SW2 correspond to the respective widths (sizes) of the sidewall spacers SW1 and SW2 in the memory gate length direction (gate length direction of the memory gate electrode MG) and shown in FIG. 18 described above. The width (W3) of each of the sidewall spacers SW3 corresponds to the width (size) of the sidewall spacer SW3 in the gate length direction of the gate electrode GE and is shown in FIG. 18 described above. The foregoing size S2 of each of the sidewall spacers SW1 is substantially the same as the width (W1) of the sidewall spacer SW1 (S2=W1).

As the insulating film SZ as the interlayer insulating film, the multi-layer film including the insulating film SZ1 and the insulating film SZ2 over the insulating film SZ1 can appropriately be used. Preferably, the insulating film SZ1 is a silicon nitride film. Preferably, the insulating film SZ2 is made of a silicon dioxide film. Accordingly, the case where the multi-layer film including the insulating film SZ1 made of a silicon nitride film and the insulating film SZ2 made of a silicon dioxide film is used as the insulating film SZ and the dummy control gate electrode DCG is formed of a silicon nitride film can appropriately be used. Such a case will be referred to as a first case. In the first case, when the photoresist pattern RP4 is displaced, the insulating film SZ2 (silicon dioxide film) is not allowed to be exposed from the openings OP of the photoresist pattern RP4, but the insulating film SZ1 (silicon nitride film) is allowed to be exposed. Therefore, in the first case, to increase the margin for the displacement of the photoresist pattern RP4, it is also effective to take the following approach.

That is, a comparison is made between the respective sizes of a combination of the sidewall spacer SW1 and the insulating film SZ1 located over the side surface thereof and the dummy control gate electrode DCG in the memory gate length direction. Then, the position of each of the openings OP is designed such that the inner wall OP1 of the opening OP is located over the one of the combination of the sidewall spacer SW1 and the insulating film SZ1, and the dummy control gate electrode DCG which has the larger size in the memory gate length direction, not over the other of the combination of the sidewall spacer SW1 and the insulating film SZ1, and the dummy control gate electrode DCG which has the smaller size in the memory gate length direction.

Specifically, when the total of the size S2 of the sidewall spacer SW1 and a thickness S4 of the insulating film SZ1 over the side surface of the sidewall spacer SW1 is smaller than the size S1 of the dummy control gate electrode DCG (i.e., when S1>S2+S4 is satisfied), the position of the opening OP is designed such that the inner wall OP1 is located over the dummy control gate electrode DCG. On the other hand, when the size S1 of the dummy control gate electrode DCG is smaller than the total of the size S2 of the sidewall spacer SW1 and the thickness S4 of the insulating film SZ1 over the side surface of the sidewall spacer SW1 (i.e., when S1<S2+S4 is satisfied), the position of the opening OP is designed such that the inner wall OP1 is located over the sidewall spacer SW1. By thus designing the position of the opening OP, even when the photoresist pattern RP4 is displaced, the inner wall OP1 of the opening OP is more likely to be located over the dummy control gate electrode DCG, the sidewall spacer SW1, or the insulating film SZ2. This can increase the margin for the displacement of the photoresist pattern RP4. Note that the thickness S4 of the insulating film SZ1 over the side surface of the sidewall spacer SW1 corresponds to the thickness (size in the memory gate length direction) of the insulating film SZ1 formed over the side surface of the sidewall spacer SW1 which is opposite to the side surface thereof adjacent to the dummy control gate electrode DCG.

Also, in the foregoing first case, the distance (space) S3 from the end portion (end portion closer to the memory gate electrode MG) of the upper surface of the dummy control gate electrode DCG which is exposed from each of the openings OP to the inner wall OP1 of the opening OP is more preferably about one half of the total of the size S1 of the dummy control gate electrode DCG, the size S2 of the sidewall spacer SW1, and the thickness S4 of the insulating film SZ1 over the side surface of the sidewall spacer SW1. That is, S3=(S1+S2+S4)/2 is more preferable. From another perspective, the inner wall OP1 of the opening OP is more preferably located at a middle position in a combination of the dummy control gate electrode DCG, the sidewall spacer SW1 adjacent thereto, and the insulating film SZ1 over the side surface of the sidewall spacer SW1 in the memory gate length direction. By thus locating the inner wall OP1, the margin for the displacement of the photoresist pattern RP4 can most efficiently be increased. Even when the photoresist pattern RP4 is displaced, it is possible to located the inner wall OP1 of the opening OP over the dummy control gate electrode DCG, the sidewall spacer SW1, or the insulating film SZ1.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:

1. A method of manufacturing a semiconductor device including a memory cell in a nonvolatile memory, comprising the steps of:
   (a) providing a semiconductor substrate;
   (b) forming a first gate electrode for the memory cell over the semiconductor substrate via a first insulating film having an internal charge storage portion;
   (c) forming a first to-be-replaced structure for forming a second gate electrode for the memory cell over the semiconductor substrate such that the first to-be-replaced structure is adjacent to the first gate electrode via a second insulating film;

(d) after the step (c), forming a first interlayer insulating film so as to cover the first gate electrode and the first to-be-replaced structure therewith;

(e) after the step (d), polishing the first interlayer insulating film to expose the first gate electrode and the first to-be-replaced structure;

(f) after the step (e), removing the first to-be-replaced structure by etching; and (g) forming the second gate electrode for the memory cell in a first trench as a region from which the first to-be-replaced structure is removed in the step (f), wherein the first gate electrode and the first to-be-replaced structure are made of different materials, wherein, in the step (f), the etching is performed under a condition in which an etching rate of the first gate electrode is lower than that of the first to-be-replaced structure to remove the first to-be-replaced structure, wherein the step (f), the etching is performed in a state where a mask layer is formed over the first interlayer insulating film to remove the first to-be-replaced structure, and wherein the mask layer has an opening exposing at least a portion of the first gate electrode and at least a portion of the first to-be-replaced structure.

2. The method of manufacturing the semiconductor device according to claim 1,
wherein the first gate electrode is a silicon gate electrode and the second gate electrode is a metal gate electrode.

3. The method of manufacturing the semiconductor device according to claim 1,
wherein the first to-be-replaced structure is made of silicon dioxide.

4. The method of manufacturing the semiconductor device according to claim 1,
wherein, in the step (f), the etching is performed in a state where the first to-be-replaced structure and the first gate electrode are exposed to remove the first to-be-replaced structure.

5. The method of manufacturing the semiconductor device according to claim 1,
wherein, in the step (g), in the first trench, the second gate electrode is formed via a third insulating film containing a metal element and oxygen as constituent elements.

6. The method of manufacturing the semiconductor device according to claim 5,
wherein the third insulating film is formed over a bottom surface and a side surface of the first trench.

7. The method of manufacturing the semiconductor device according to claim 6,
wherein the second insulating film formed in the step (c) is made of a multi-layer film including a first silicon oxynitride film adjacent to the first gate electrode and a first silicon nitride film adjacent to the first to-be-replaced structure, and
wherein, when the step (g) is performed, between the first and second gate electrodes, the first silicon oxynitride film, the first silicon nitride film, and the third insulating film are interposed.

8. The method of manufacturing the semiconductor device according to claim 7,
wherein, between the first and second gate electrodes, the first silicon oxynitride film is adjacent to the first gate electrode and the third insulating film is adjacent to the second gate electrode and, between the third insulating film and the first silicon oxynitride film, the first silicon nitride film is interposed.

9. The method of manufacturing the semiconductor device according to claim 6,
wherein the step (c) includes the steps of:
(c1) forming a side-wall insulating film made of a silicon oxynitride over a side wall of the first gate electrode;
(c2) after the step (c1), forming a first silicon nitride film over the semiconductor substrate so as to cover the first gate electrode and the side-wall insulating film; and
(c3) after the step (c2), forming the first to-be-replaced structure made of a silicon dioxide and having a sidewall spacer shape over the first silicon nitride film such that the first to-be-replaced structure is adjacent to the first gate electrode via the first silicon nitride film and the side-wall insulating film,
wherein the second insulating film is made of a multi-layer film including the side-wall insulating film and the first silicon nitride film which are interposed between the first gate electrode and the first to-be-replaced structure, and
wherein, when the step (g) is performed, between the first and second gate electrodes, the side-wall insulating film, the first silicon nitride film, and the third insulating film are interposed.

10. The method of manufacturing the semiconductor device according to claim 1, further comprising, after the step (c) and before the step (d), the step of:
(h) forming a first sidewall spacer on a side of the first gate electrode opposite to a side thereof where the first gate electrode is adjacent to the first to-be-replaced structure, while forming a second sidewall spacer on a side of the first to-be-replaced structure opposite to a side thereof where the first to-be-replaced structure is adjacent to the first gate electrode,
wherein each of the first and second sidewall spacers is made of a material which is an insulator and different from a material of the first to-be-replaced structure,
wherein, in the step (d), the first interlayer insulating film is formed so as to cover the first gate electrode, the first to-be-replaced structure, and the first and second sidewall spacers,
wherein, in the step (e), the first interlayer insulating film is polished to expose the first gate electrode, the first to-be-replaced structure, and the first and second sidewall spacers, and
wherein, in the step (f), the etching is performed under a condition in which an etching rate of the first gate electrode and the first and second sidewall spacers is lower than that of the first to-be-replaced structure to remove the first to-be-replaced structure.

11. The method of manufacturing the semiconductor device according to claim 10, further comprising, after the step (a) and before the step (d), the step of:
(i) forming, over the semiconductor substrate, a second to-be-replaced structure for forming a third gate electrode of a MISFET for a peripheral circuit,
wherein, in the step (h), a third sidewall spacer is formed on each of both sides of the second to-be-replaced structure, and
wherein respective widths of the first and second sidewall spacers are larger than a width of the third sidewall spacer.

12. The method of manufacturing the semiconductor device according to claim 10, wherein the opening of the mask layer has first and second inner walls facing each other in a first direction as a gate length direction of the first gate electrode, wherein a size of the first to-be-replaced structure in the first direction is a first size and a size of the second sidewall spacer in the first direction is a second size, and wherein the first inner wall is located over the first to-be-replaced structure.

13. The method of manufacturing the semiconductor device according to claim 10, wherein the opening of the mask layer has first and second inner walls facing each other in a first direction as a gate length direction of the first gate electrode, wherein the first inner wall is located over the first to-be-replaced structure or over the second sidewall spacer, and wherein the second inner wall is located over the first gate electrode.

14. The method of manufacturing the semiconductor device according to claim 10, wherein the opening of the mask layer has first and second inner walls facing each other in a first direction as a gate length direction of the first gate electrode, and wherein, at a middle of a total combined length of the first to-be-replaced structure and the second sidewall spacer in the first direction, the first inner wall of the opening is located.

15. The method of manufacturing the semiconductor device according to claim 10, wherein the opening of the mask layer has first and second inner walls facing each other in a first direction as a gate length direction of the first gate electrode, wherein the first to-be-replaced structure is made of a silicon dioxide, wherein the first interlayer insulating film includes a second silicon nitride film and a second silicon dioxide film over the second silicon nitride film, and wherein, at a middle of a total combined length of the first to-be-replaced structure, the second sidewall spacer, and the second silicon nitride film over a side surface of the second sidewall spacer in the first direction, the first inner wall of the opening is located.

16. The method of manufacturing the semiconductor device according to claim 10, wherein the opening of the mask layer has first and second inner walls facing each other in a first direction as a gate length direction of the first gate electrode, wherein a size of the first to-be-replaced structure in the first direction is a first size and a size of the second sidewall spacer in the first direction is a second size, and wherein the first inner wall is located over the second sidewall spacer.

17. A method of manufacturing a semiconductor device including a memory cell in a nonvolatile memory, comprising the steps of:

(a) providing a semiconductor substrate;

(b) forming a first gate electrode for the memory cell over the semiconductor substrate via a first insulating film having an internal charge storage portion;

(c) forming a first to-be-replaced structure for forming a second gate electrode for the memory cell over the semiconductor substrate such that the first to-be-replaced structure is adjacent to the first gate electrode via a second insulating film;

(d) after the step (c), forming a first interlayer insulating film so as to cover the first gate electrode and the first to-be-replaced structure therewith;

(e) after the step (d), polishing the first interlayer insulating film to expose the first gate electrode and the first to-be-replaced structure;

(f) after the step (e), removing the first to-be-replaced structure by etching; and (g) forming the second gate electrode for the memory cell in a first trench as a region from which the first to-be-replaced structure is removed in the step (f), wherein the first gate electrode and the first to-be-replaced structure are made of different materials, wherein, in the step (f), the etching is performed under a condition in which an etching rate of the first gate electrode is lower than that of the first to-be-replaced structure to remove the first to-be-replaced structure, wherein, in the step (g), in the first trench, the second gate electrode is formed via a third insulating film containing a metal element and oxygen as constituent elements, wherein the third insulating film is formed over a bottom surface and a side surface of the first trench, wherein the step (c) includes the steps of:

(c1) forming a side-wall insulating film made of a silicon oxynitride over a side wall of the first gate electrode;

(c2) after the step (c1), forming a first silicon nitride film over the semiconductor substrate so as to cover the first gate electrode and the side-wall insulating film; and (c3) after the step (c2), forming the first to-be-replaced structure made of a silicon dioxide and having a sidewall spacer shape over the first silicon nitride film such that the first to-be-replaced structure is adjacent to the first gate electrode via the first silicon nitride film and the side-wall insulating film, wherein the second insulating film is made of a multilayer film including the side-wall insulating film and the first silicon nitride film which are interposed between the first gate electrode and the first to-be-replaced structure, and wherein, when the step (g) is performed, between the first and second gate electrodes, the side-wall insulating film, the first silicon nitride film, and the third insulating film are interposed.

* * * * *